(12) United States Patent
Yamazaki et al.

(10) Patent No.: US 9,673,224 B2
(45) Date of Patent: Jun. 6, 2017

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Shuhei Nagatsuka, Kanagawa (JP); Tatsuya Onuki, Kanagawa (JP); Yutaka Shionoiri, Kanagawa (JP); Kiyoshi Kato, Kanagawa (JP); Hidekazu Miyairi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 69 days.

(21) Appl. No.: 14/515,993

(22) Filed: Oct. 16, 2014

(65) Prior Publication Data

US 2015/0108470 A1    Apr. 23, 2015

(30) Foreign Application Priority Data

Oct. 22, 2013 (JP) .................................. 2013-219679
Oct. 22, 2013 (JP) .................................. 2013-219680
Oct. 22, 2013 (JP) .................................. 2013-219683

(51) Int. Cl.
*H01L 27/12* (2006.01)
*H01L 29/423* (2006.01)
*H01L 29/786* (2006.01)

(52) U.S. Cl.
CPC .... *H01L 27/1225* (2013.01); *H01L 29/42384* (2013.01); *H01L 29/7869* (2013.01); *H01L 29/78696* (2013.01)

(58) Field of Classification Search
CPC ......... H01L 29/42384; H01L 29/78696; H01L 29/7869; H01L 27/1225; H01L 27/10; H01L 27/105; H01L 29/92; H01L 29/94
See application file for complete search history.

(56) References Cited

U.S. PATENT DOCUMENTS 5,282,162 A    1/1994  Ochii
5,299,155 A    3/1994  Yanagi
(Continued)

FOREIGN PATENT DOCUMENTS

CN    103022012 A    4/2013
CN    103035642 A    4/2013
(Continued)

OTHER PUBLICATIONS

International Search Report (Application No. PCT/JP2014/077029) Dated Jan. 13, 2015.
(Continued)

*Primary Examiner* — Laura Menz
*Assistant Examiner* — Candice Y Chan
(74) *Attorney, Agent, or Firm* — Fish & Richardson P.C.

(57) ABSTRACT

To provide a semiconductor device that is suitable for miniaturization. The semiconductor device includes a first transistor, a second transistor over the first transistor, a barrier layer between the first transistor and the second transistor, a first electrode between the first transistor and the barrier layer, and a second electrode between the barrier layer and the second transistor and overlapping the first electrode with the barrier layer therebetween. A gate electrode of the first transistor, the first electrode, one of a source electrode and a drain electrode of the second transistor are electrically connected to one another. A channel is formed in a first semiconductor layer including a single crystal semiconductor in the first transistor. A channel is formed in a
(Continued)

second semiconductor layer including an oxide semiconductor in the second transistor.

30 Claims, 54 Drawing Sheets

(56) References Cited

U.S. PATENT DOCUMENTS

| | | |
|---|---|---|
| 5,521,859 A | 5/1996 | Ema et al. |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,982,200 B2 | 1/2006 | Noguchi et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,415,731 B2 | 4/2013 | Yamazaki et al. |
| 8,575,985 B2 | 11/2013 | Ohmaru et al. |
| 8,797,788 B2 | 8/2014 | Sekine |
| 8,861,288 B2 | 10/2014 | Ohshima |
| 9,111,795 B2 | 8/2015 | Ieda et al. |
| 9,184,160 B2 | 11/2015 | Yamazaki |
| 9,356,054 B2 * | 5/2016 | Miyairi ............ H01L 27/1225 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0152256 A1 | 8/2004 | Noguchi et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0227143 A1 | 9/2011 | Lee et al. |
| 2011/0248270 A1 | 10/2011 | Fukumoto et al. |
| 2012/0170355 A1 | 7/2012 | Ohmaru et al. |
| 2012/0268979 A1 | 10/2012 | Sekine |
| 2013/0048977 A1 | 2/2013 | Watanabe et al. |
| 2013/0069054 A1 | 3/2013 | Isobe et al. |
| 2013/0069132 A1 | 3/2013 | Atsumi et al. |
| 2013/0082765 A1 | 4/2013 | Kaneko et al. |
| 2013/0163350 A1 | 6/2013 | Ohshima |
| 2013/0193433 A1 * | 8/2013 | Yamazaki ........... H01L 27/0629 257/43 |
| 2013/0234131 A1 | 9/2013 | Tanaka et al. |
| 2013/0270552 A1 | 10/2013 | Yamazaki et al. |
| 2013/0299818 A1 | 11/2013 | Tanaka |
| 2013/0314123 A1 | 11/2013 | Takemura |
| 2013/0320330 A1 | 12/2013 | Yamazaki |
| 2014/0004656 A1 | 1/2014 | Sasagawa et al. |
| 2014/0048802 A1 | 2/2014 | Ohmaru et al. |
| 2014/0084287 A1 | 3/2014 | Yamazaki |
| 2014/0339551 A1 | 11/2014 | Sekine |
| 2015/0214256 A1 * | 7/2015 | Miyairi ............ H01L 27/1225 257/43 |

FOREIGN PATENT DOCUMENTS

| | | |
|---|---|---|
| CN | 103178826 A | 6/2013 |
| DE | 102012224361 | 6/2013 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-275613 A | 10/1993 |
| JP | 08-264794 A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-214550 A | 7/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2012-256857 A | 12/2012 |
| JP | 2013-009297 A | 1/2013 |
| JP | 2013-074230 A | 4/2013 |
| JP | 2013-077815 A | 4/2013 |
| JP | 2013-102133 A | 5/2013 |
| JP | 2013-150313 A | 8/2013 |
| JP | 2013-175714 A | 9/2013 |
| KR | 2012-0079817 A | 7/2012 |
| KR | 2013-0031794 A | 3/2013 |
| KR | 2013-0073825 A | 7/2013 |
| TW | 201239882 | 10/2012 |
| TW | 201330231 | 7/2013 |
| TW | 201338424 | 9/2013 |
| WO | WO-2004/114391 | 12/2004 |

OTHER PUBLICATIONS

Written Opinion (Application No. PCT/JP2014/077029) Dated Jan. 13, 2015.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 398, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "SPINEL,YbFe2O4, and Yb2Fe3O7 Types of Structures for Compounds in the In2O3 and SC2O3—A2O3—BO Systems [A: Fe, Ga, or Al; B: Mg, Mn, Fe, Ni, Cu, or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, vol. 39, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
U.S. Appl. No. 14/264,823, Tanaka.

\* cited by examiner

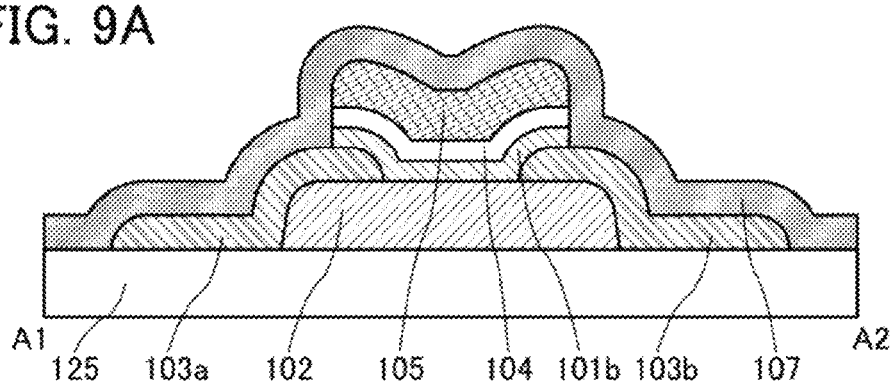
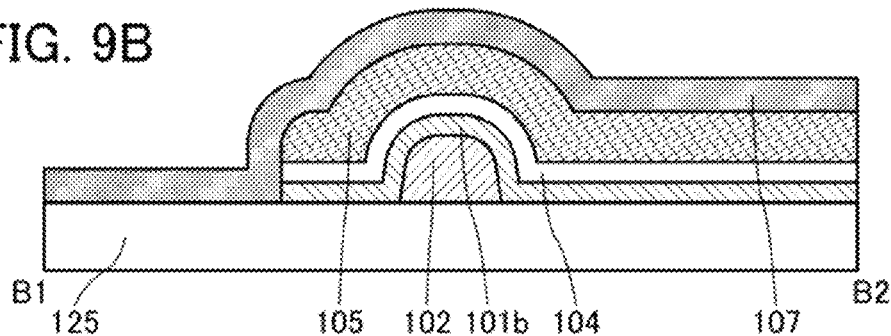

A1 125 103a 102 101a 105 104 101b 103b 107 A2

B1 125 105 102 101a 101b 104 107 B2

A1  125  103a  102  105  104  103b  107  A2

B1  125  105  102  104  107  B2

A1 125 103a 102 101a 105 104 103b 107 A2

B1 125 105 102 101a 104 107 B2

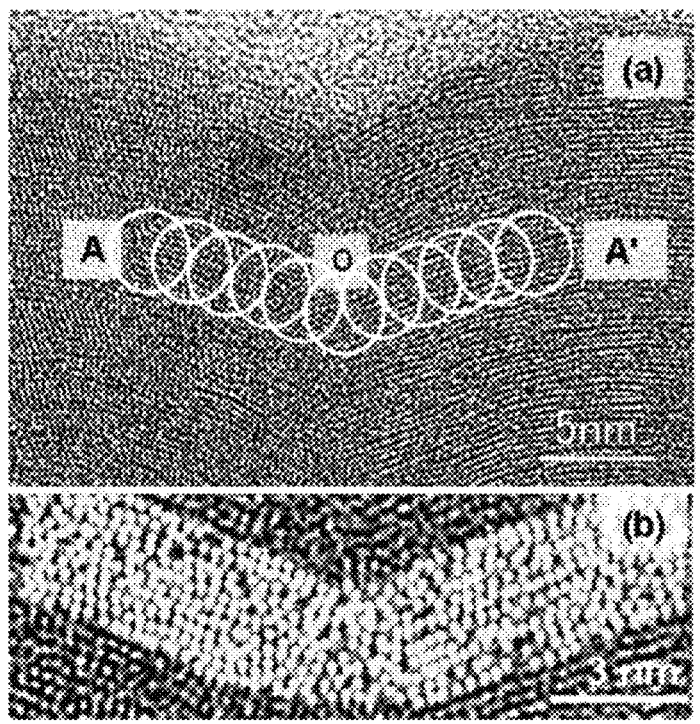
FIG. 31A
FIG. 31B
FIG. 31C
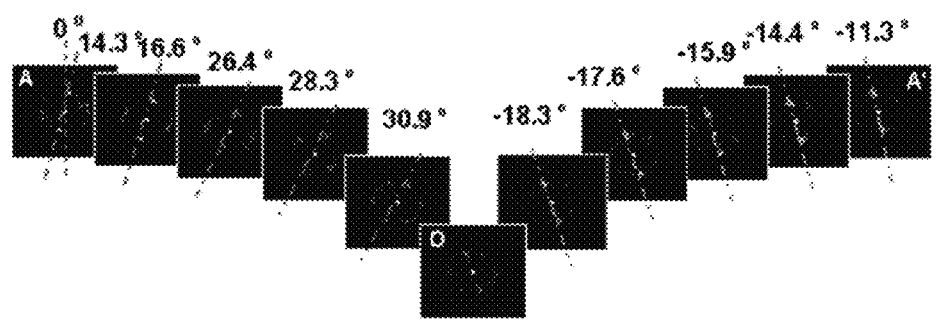

CAAC-OS nc-OS

FIG. 33A
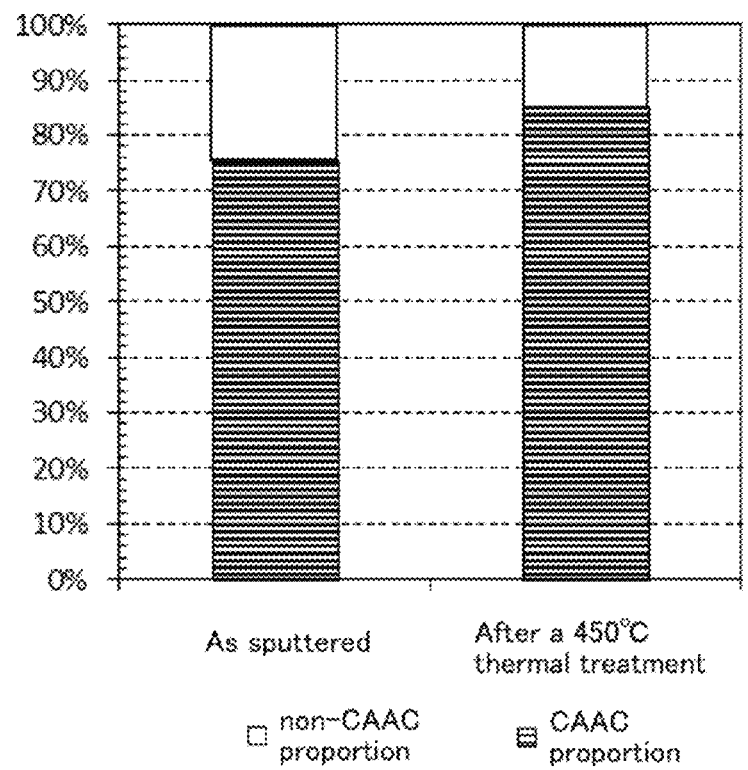
As sputtered    After a 450°C thermal treatment
☐ non-CAAC proportion    ▤ CAAC proportion
FIG. 33B                    FIG. 33C
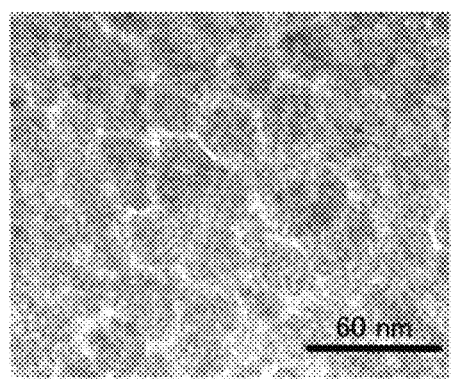    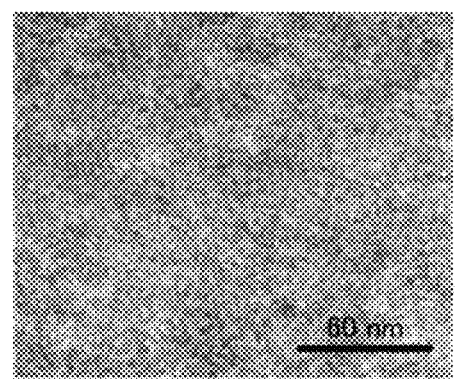
As sputtered              After a 450°C thermal treatment

SEMICONDUCTOR DEVICE

TECHNICAL FIELD

One embodiment of the present invention relates to a semiconductor device. One embodiment of the present invention relates to a method for manufacturing the semiconductor device. One embodiment of the present invention relates to a method for driving the semiconductor device.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a lighting device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. An arithmetic device, a memory device, an imaging device, an electro-optical device, a power generation device (e.g., a thin film solar cell and an organic thin film solar cell), and an electronic appliance each may include a semiconductor device.

BACKGROUND ART

A technique in which a transistor is formed using a semiconductor material has attracted attention. The transistor is used in a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

For example, a technique for formation of a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic appliances.

REFERENCE

Patent Document 1: Japanese Published Patent Application No. 2007-123861
Patent Document 2: Japanese Published Patent Application No. 2007-096055

DISCLOSURE OF INVENTION

An object of one embodiment of the present invention is to provide a semiconductor device that is suitable for miniaturization.

Another object of one embodiment of the present invention is to give favorable electrical characteristics to a semiconductor device. Another object of the present invention is to provide a highly reliable semiconductor device. Another object of one embodiment of the present invention is to provide a semiconductor device with a novel structure.

Note that the descriptions of these objects do not preclude the existence of other objects. In one embodiment of the present invention, there is no need to achieve all the objects. Other objects will be apparent from and can be derived from the description of the specification, the drawings, the claims, and the like.

One embodiment of the present invention is a semiconductor device that includes a first transistor; a second transistor over the first transistor; a barrier layer between the first transistor and the second transistor; a first electrode between the first transistor and the barrier layer; and a second electrode between the barrier layer and the second transistor and overlapping the first electrode with the barrier layer therebetween. In the first transistor, a channel is formed in a first semiconductor layer including a single crystal semiconductor. In the second transistor, a channel is formed in a second semiconductor layer including an oxide semiconductor.

Another embodiment of the present invention is a semiconductor device that includes a first transistor; a second transistor over the first transistor; a barrier layer between the first transistor and the second transistor; a first electrode between the first transistor and the barrier layer; and a second electrode between the barrier layer and the second transistor and overlapping the first electrode with the barrier layer therebetween. A gate electrode of the first transistor, the first electrode, one of a source electrode and a drain electrode of the second transistor are electrically connected to one another. In the first transistor, a channel is formed in a first semiconductor layer including a single crystal semiconductor. In the second transistor, a channel is formed in a second semiconductor layer including an oxide semiconductor.

Another embodiment of the present invention is a semiconductor device that includes a first transistor; a second transistor over the first transistor; a barrier layer between the first transistor and the second transistor; a first electrode between the first transistor and the barrier layer; and a second electrode between the barrier layer and the second transistor and overlapping the first electrode with the barrier layer therebetween. A gate electrode of the first transistor, the first electrode, one of a source electrode and a drain electrode of the second transistor are electrically connected to one another. In the first transistor, a channel is formed in a first semiconductor layer including a single crystal semiconductor. In the second transistor, a channel is formed in a second semiconductor layer including an oxide semiconductor.

Another embodiment of the present invention is a semiconductor device that includes a first transistor; a second transistor over the first transistor; a barrier layer between the first transistor and the second transistor; a first electrode between the first transistor and the barrier layer; and a second electrode between the barrier layer and the second transistor and overlapping the first electrode with the barrier layer therebetween. A gate electrode of the first transistor, the first electrode, one of a source electrode and a drain electrode of the second transistor are electrically connected to one another. A channel formation region of the second transistor overlaps the second electrode. In the first transistor, a channel is formed in a first semiconductor layer including a single crystal semiconductor. In the second transistor, a channel is formed in a second semiconductor layer including an oxide semiconductor.

It is preferable that the barrier layer include at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

It is preferable that an insulating layer including an oxide be provided between the second transistor and the barrier layer and that the insulating layer include a region containing oxygen more than that in the stoichiometric composition.

It is preferable that the concentration of hydrogen contained in the insulating layer be lower than $5 \times 10^{18}$ cm$^{-3}$.

It is preferable that the concentration of hydrogen contained in the second semiconductor layer be lower than $5 \times 10^{18}$ cm$^3$.

It is preferable that the concentration of hydrogen contained in a gate insulating layer of the second transistor be lower than $5 \times 10^{18}$ cm$^3$.

It is preferable that the second electrode contain a conductive metal oxide.

It is preferable that a third electrode containing the same material as the second electrode be provided on a plane where the second electrode is provided and that the channel formation region of the second transistor overlap the third electrode.

It is preferable that the S value of the second transistor be greater than or equal to 60 mV/dec. and less than or equal to 100 mV/dec.

One embodiment of the present invention makes it possible to provide a semiconductor device that is suitable for miniaturization.

One embodiment of the present invention makes it possible to give favorable electrical characteristics to a semiconductor device. One embodiment of the present invention makes it possible to provide a highly reliable semiconductor device. One embodiment of the present invention makes it possible to provide a semiconductor device with a novel structure. Note that the description of these effects does not preclude the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

FIGS. 9A and 9B each illustrate a structure example of a semiconductor device of an embodiment.

FIGS. 31A and 31B are high-resolution cross-sectional TEM images and FIG. 31C is a local Fourier transform image of an oxide semiconductor.

FIG. 33A shows an example of structural analysis by transmission electron diffraction measurement and FIGS. 33B and 33C show high-resolution planar TEM images.

BEST MODE FOR CARRYING OUT THE INVENTION

Figure 1:
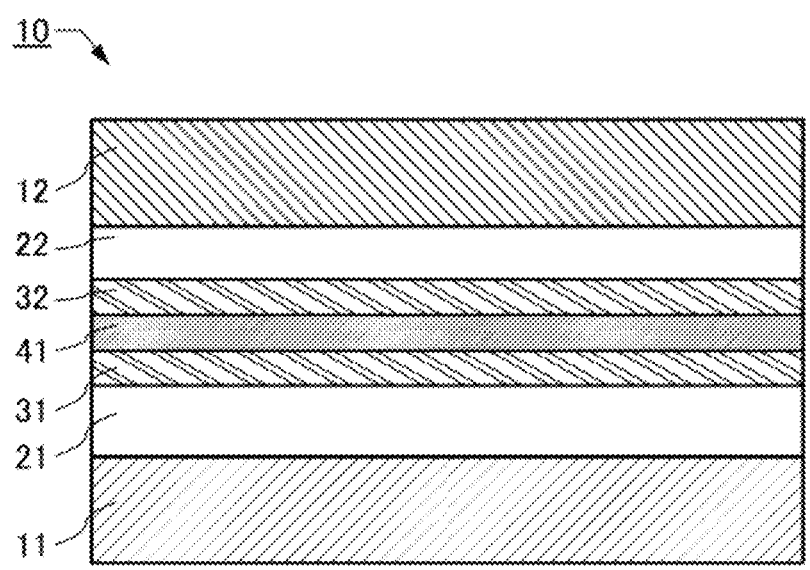
FIG. 1 illustrates a stacked-layer structure included in a semiconductor device of an embodiment.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Embodiment 1

Structure Examples of Stacked-Layer Structures

Examples of stacked-layer structures that can be applied to a semiconductor device of one embodiment of the present invention are described below. FIG. 1 is a schematic cross-sectional view of a stacked-layer structure 10 described below.

The stacked-layer structure 10 includes a first layer 11 including a first transistor, a first insulating layer 21, a first wiring layer 31, a barrier layer 41, a second wiring layer 32, a second insulating layer 22, and a second layer 12 including a second transistor that are stacked in this order.

The first transistor included in the first layer 11 contains a first semiconductor material. The second transistor included in the second layer 12 contains a second semiconductor material. The first semiconductor material and the second semiconductor material may be the same material but they are preferably different semiconductor materials. The first transistor and the second transistor each include a semiconductor layer, a gate electrode, a gate insulating layer, a source electrode, and a drain electrode; alternatively, the first transistor and the second transistor may each include a source region and a drain region in addition to the above components.

Examples of semiconductors that can be used as the first semiconductor material or the second semiconductor material are semiconductor materials such as silicon and germanium; compound semiconductor materials containing silicon, germanium, gallium, arsenic, or aluminum; organic semiconductor materials; and oxide semiconductor materials.

Here, the case where single crystal silicon is used as the first semiconductor material and an oxide semiconductor is used as the second semiconductor material is described.

The barrier layer 41 has a function of suppressing diffusion of water and hydrogen from the layers under the barrier layer 41. Note that the barrier layer 41 may have an opening or a plug for electrically connecting an electrode or a wiring provided over the barrier layer 41 to an electrode or a wiring provided under the barrier layer 41. For example, the barrier layer 41 may have a plug for electrically connecting a wiring or an electrode included in the first wiring layer 31 to a wiring or an electrode included in the second wiring layer 32.

The first wiring layer 31 and the second wiring layer 32 are provided so that the barrier layer 41 is interposed therebetween. The first wiring layer 31 includes at least a first electrode, and the second wiring layer 32 includes at least a second electrode overlapping the first electrode. Here, a capacitor consisting of the first electrode, the barrier layer 41, and the second electrode can be formed.

As a material that is used for the wirings or the electrodes included in the first wiring layer 31 and the second wiring layer 32, a conductive metal oxide can be used as well as a metal or an alloy material. A single layer or a stack of two or more layers including any of these materials may be used.

The first insulating layer 21 has a function of electrically insulating the first layer 11 from the first wiring layer 31. The first insulating layer 21 may have an opening or a plug for electrically connecting the first transistor, an electrode, or a wiring included in the first layer 11 to an electrode or a wiring included in the first wiring layer 31.

The second insulating layer 22 has a function of electrically insulating the second layer 12 from the second wiring layer 32. The second insulating layer 22 may have an opening or a plug for electrically connecting the second transistor, an electrode, or a wiring included in the second layer 12 to an electrode or a wiring included in the second wiring layer 32.

The second insulating layer 22 preferably contains an oxide. In particular, the second insulating layer 22 preferably contains an oxide material from which part of oxygen is released by heating. The second insulating layer 22 preferably contains an oxide containing oxygen more than that in the stoichiometric composition. In the case where an oxide semiconductor is used as the second semiconductor material, oxygen released from the second insulating layer 22 is supplied to the oxide semiconductor, so that oxygen vacancies in the oxide semiconductor can be reduced. Consequently, changes in the electrical characteristics of the second transistor can be reduced and the reliability of the second transistor can be improved.

It is preferable that hydrogen, water, or the like in the layers under the barrier layer 41 be reduced as much as possible. Hydrogen or water might become a factor that causes changes in the electrical characteristics of an oxide semiconductor. Hydrogen or water diffusing from the layers under the barrier layer 41 to the layers over the barrier layer 41 can be suppressed by the barrier layer 41; however, the hydrogen or water might diffuse to the layers over the barrier layer 41 through an opening, a plug, or the like provided in the barrier layer 41.

In order to reduce hydrogen or water contained in the layers under the barrier layer 41, heat treatment for removing the hydrogen or the water is preferably performed before the formation of the barrier layer 41 or immediately after the formation of an opening for forming a plug in the barrier layer 41. The temperature of the heat treatment is preferably as high as possible as long as the heat resistance of a conductive film and the like included in a semiconductor device is considered and the electrical characteristics of the transistor do not deteriorate. Specifically, the temperature may be, for example, 450° C. or higher, preferably 490° C. or higher, further preferably 530° C. or higher, or may be 650° C. or higher. It is preferable that the heat treatment be performed under an inert gas atmosphere or a reduced pressure atmosphere for 1 hour or longer, preferably 5 hours or longer, further preferably 10 hours or longer. In addition, the temperature of the heat treatment may be determined in consideration of the heat resistance of a material of the first layer 11, a material of a wiring or an electrode included in the first wiring layer 31, or a material of a plug provided in the first insulating layer 21; in the case where the heat resistance of the material is low, the heat treatment may be performed at 550° C. or lower, 600° C. or lower, 650° C. or lower, or 800° C. or lower. Such heat treatment may be performed at least once but is preferably performed more than once.

It is preferable that the amount of released hydrogen of the insulating layer provided under the barrier layer 41, which is measured by thermal desorption spectrometry (TDS) analysis, at a substrate surface temperature of 400° C. be lower than or equal to 130%, preferably lower than or equal to 110% of that at a substrate surface temperature of 300° C. Alternatively, it is preferable that the amount of released hydrogen measured by TDS analysis at a substrate surface temperature of 450° C. be lower than or equal to 130%, preferably lower than or equal to 110% of that at a substrate surface temperature of 350° C.

It is preferable that water or hydrogen contained in the barrier layer 41 be also reduced. For example, it is preferable to use, for the barrier layer 41, a material having an amount of released hydrogen molecules (M/z=2) measured by TDS of less than $2\times10^{15}/cm^2$, preferably less than $1\times10^{15}/cm^2$, further preferably less than $5\times10^{14}/cm^2$ at a substrate surface temperature ranging from 20° C. to 600° C. Alternatively, it is preferable to use, for the barrier layer 41, a material having an amount of released hydrogen molecules (M/z=18) measured by TDS of less than $1\times10^{16}/cm^2$, preferably $5\times10^{15}/cm^2$, further preferably less than $2\times10^{12}/cm^2$ at a substrate surface temperature ranging from 20° C. to 600° C.

In the case where single crystal silicon is used for a semiconductor layer in the first transistor included in the first layer 11, the heat treatment can also serve as treatment (also referred to as hydrogenation treatment) for terminating dangling bonds of silicon with hydrogen. By the hydrogenation treatment, part of hydrogen contained in the first layer 11 and the insulating layer 21 diffuses to the semiconductor layer in the first transistor to terminate dangling bonds of silicon, so that the reliability of the first transistor can be improved.

Examples of materials that can be used for the barrier layer 41 are silicon nitride, silicon nitride oxide, aluminum oxide, aluminum oxynitride, gallium oxide, gallium oxynitride, yttrium oxide, yttrium oxynitride, hafnium oxide, and hafnium oxynitride. Aluminum oxide is particularly preferable because of its excellent barrier property against water or hydrogen.

The barrier layer 41 may be a stack of a layer of a material relatively impermeable to water or hydrogen and a layer containing an insulating material. The barrier layer 41 may be, for example, a stack of a layer containing silicon oxide or silicon oxynitride, a layer containing a metal oxide, and the like.

For the barrier layer 41, a material relatively impermeable to oxygen is preferably used. The materials given above have excellent barrier properties against oxygen as well as hydrogen and water. The use of any of the materials can suppress diffusion of oxygen released when the second insulating layer 22 is heated to the layers under the barrier layer 41. Consequently, the amount of oxygen that is released from the second insulating layer 22 and is likely to be supplied to a semiconductor layer in the second transistor included in the second layer 12 can be increased.

The barrier layer 41 can also serve as a dielectric layer of the capacitor. Thus, a material with high dielectric constant (high-k material) is preferably used for the barrier layer 41, in which case capacitance per unit area can be increased. In addition, a plurality of layers are preferably stacked as the barrier layer 41, in which case leakage current of the capacitor can be reduced.

As described above, in one embodiment of the present invention, diffusion of hydrogen or water to the second layer 12 is suppressed by reducing the concentration of hydrogen or water contained in the layers under the barrier layer 41, by removing hydrogen or water, or by the barrier layer 41. Thus, the amount of hydrogen or water contained in the second insulating layer 22 or each layer in the second transistor included in the second layer 12 can be extremely low. The concentration of hydrogen contained in the second insulating layer 22 and the semiconductor layer or the gate insulating layer in the second transistor can be reduced to, for example, lower than $5\times10^{18}$ cm$^{-3}$, preferably lower than $1\times10^{18}$ cm$^{-3}$, further preferably lower than $3\times10^{17}$ cm$^{-3}$.

By employing the stacked-layer structure 10 for a semiconductor device of one embodiment of the present invention, the first transistor included in the first layer 11 and the second transistor included in the second layer 12 both can have high reliability, so that the semiconductor device can have extremely high reliability.

Structure Example 1

Figure 2A:
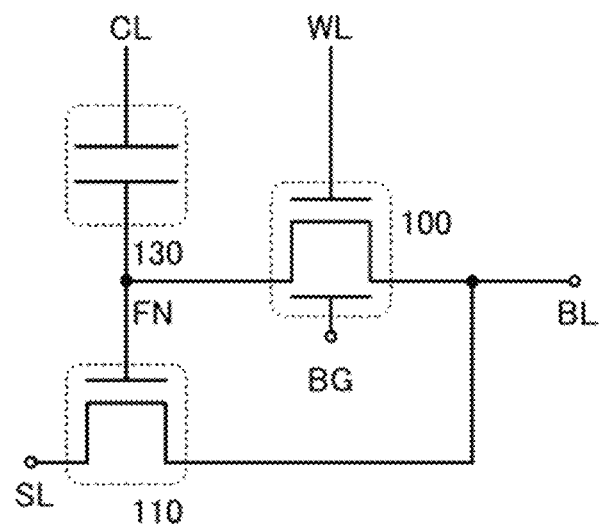
FIG. 2A is a circuit diagram of a semiconductor device of one embodiment and FIG. 2B illustrates a structure example of the semiconductor device.

FIG. 2A is an example of a circuit diagram of a semiconductor device of one embodiment of the present invention. A semiconductor device shown in FIG. 2A includes a first transistor 110, a second transistor 100, a capacitor 130, a wiring BL, a wiring WL, a wiring CL, and a wiring BG.

One of a source or a drain of the first transistor 110 is electrically connected to the wiring BL, the other is electrically connected to the wiring SL, and a gate of the first transistor 110 is electrically connected to one of a source and a drain of the second transistor 100 and one electrode of the capacitor 130. The other of the source and the drain of the second transistor 100 is electrically connected to the wiring BL, and a gate of the second transistor 100 is electrically connected to the wiring WL. The other electrode of the capacitor 130 is electrically connected to the wiring CL. The wiring BG is electrically connected to a second gate of the second transistor 100. Note that a node between the gate of the first transistor 110, the one of the source and the drain of the second transistor 100, and the one electrode of the capacitor 130 is referred to as a node FN.

A semiconductor device shown in FIG. 2A supplies a potential corresponding to the potential of the wiring BL to the node FN when the second transistor 100 is in an on state (i.e., is on). Meanwhile, the semiconductor device has a function of retaining the potential of the node FN when the second transistor 100 is in an off state (i.e., is off). In other words, the semiconductor device shown in FIG. 2A functions as a memory cell of a memory device. Note that the semiconductor device shown in FIG. 2A can function as a pixel of a display device in the case where the semiconductor device includes a display element such as a liquid crystal element or an organic electroluminescence (EL) element electrically connected to the node FN.

The on/off state of the second transistor 100 can be selected in accordance with the potential supplied to the wiring WL or the wiring BG. The threshold voltage of the second transistor 100 can be controlled by a potential supplied to the wiring WL or the wiring BG. By using a transistor with small off-state current as the second transistor 100, the potential of the node FN can be retained for a long period when the transistor is off. This can reduce the frequency of refresh operations of the semiconductor device; thus, the semiconductor device can have low power consumption. An example of the transistor with small off-state current is a transistor including an oxide semiconductor.

Note that a reference potential, a group potential, or a fixed potential such as an arbitrary fixed potential is supplied to the wiring CL. At this time, the apparent threshold voltage of the second transistor 100 changes depending on the potential of the node FN. Conduction and non-conduction states of the first transistor 110 change in response to the change in the apparent threshold voltage; thus, data of a potential retained in the node FN can be read as data.

To hold a potential retained in the node FN at 85° C. for 10 years ($3.15 \times 10^8$ seconds), off-state current is preferably lower than 4.3 yA (yoctoamperes, where 1 yA is $10^{-24}$ A) per microfarad of capacitance and per micrometer of channel width of the transistor. In that case, the allowable potential variation in the node FN is preferably within 0.5 V. Alternatively, the off-state current is preferably lower than 1.5 yA at 95° C. In the semiconductor device of one embodiment of the present invention, the concentration of hydrogen contained in the layers under the barrier layer is sufficiently reduced; thus, the transistor including an oxide semiconductor over the barrier layer can have such extremely small off-state current.

The subthreshold value (S value) of the transistor including an oxide semiconductor is 66 mV/dec. or more, preferably 60 mV/dec. or more, further preferably 50 mV/dec. or more, and 200 mV/dec. or less, preferably 150 mV/dec. or less, further preferably 100 mV/dec. or less, still further preferably 80 mV/dec. As the S value is decreased, the off-state current at a particular voltage at which the transistor is turned off can be decreased.

A plurality of the semiconductor devices shown in FIG. 2A can be arranged in a matrix, whereby a memory device (memory cell array) can be formed.

Figure 2B:
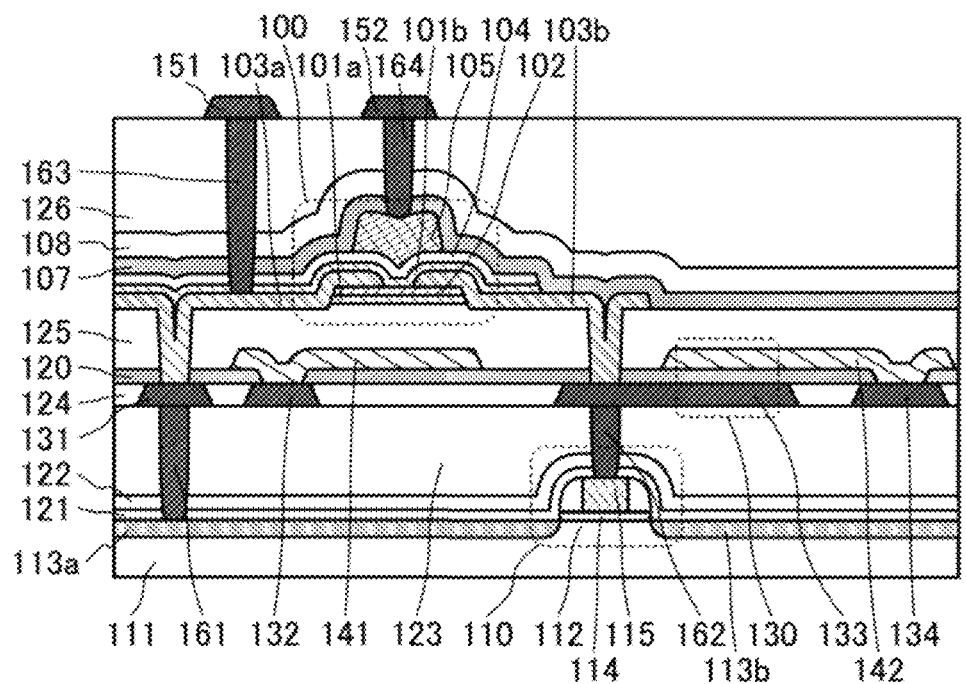

FIG. 2B illustrates an example of a cross-sectional structure of a semiconductor device in which the circuit shown in FIG. 2A can be obtained.

The semiconductor device includes the first transistor 110, the second transistor 100, and the capacitor 130. The second transistor 100 is provided over the first transistor 110, and a barrier layer 120 is provided between the first transistor 110 and the second transistor 100.

[First Layer]

The first transistor 110 is provided on a semiconductor substrate 111 and includes a semiconductor layer 112 that is a portion of the semiconductor substrate 111, a gate insulating layer 114, a gate electrode 115, and low-resistance layers 113a and 113b serving as source and drain regions The first transistor 110 may be either a p-channel transistor or an n-channel transistor, and an appropriate transistor may be used depending on the circuit configuration or the driving method.

It is preferable that a region of the semiconductor layer 112 where a channel is formed, a region in the vicinity thereof, the low-resistance layers 113a and 113b serving as source and drain regions, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the first transistor 110 may be a high-electron-mobility transistor (HEMT) with GaAs and AlGaAs or the like.

The low-resistance layers 113a and 113b contain an element that imparts n-type conductivity, such as phosphorus, or an element that imparts p-type conductivity, such as boron, in addition to a semiconductor material used for the semiconductor layer 112.

The gate electrode 115 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is particularly preferable to use a high-melting-point material that has both heat resistance and conductivity, such as tungsten or molybdenum, and it is particularly preferable to use tungsten.

Here, a structure including the first transistor 110 corresponds to the first layer 11 in the above stacked-layer structure.

Figure 3A:
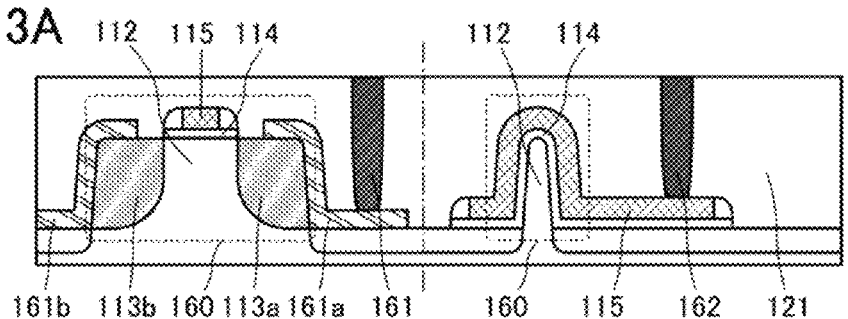
FIGS. 3A to 3C each illustrate a structure example of a semiconductor device of an embodiment.

Here, a transistor 160 illustrated in FIG. 3A may be used instead of the first transistor 110. FIG. 3A illustrates a cross section of the transistor 160 in a channel length direction on the left side and a cross section thereof in a channel width direction on the right side. In the transistor 160 illustrated in FIG. 3A, the semiconductor layer 112 (part of the semiconductor substrate) in which a channel is formed has a protrusion, and the gate insulating layer 114 and the gate electrode 115 are provided along top and side surfaces of the protrusion. The transistor 160 having such a shape is also referred to as a FIN transistor because it utilizes a protruding portion of the semiconductor substrate. Note that an insulating layer serving as a mask for forming the protruding portion may be provided in contact with the top of the protruding portion. Although the case where the protruding portion is formed by processing part of the semiconductor substrate is described here, a semiconductor layer having a protruding shape may be formed by processing an SOI substrate.

[First Insulating Layer]

The first transistor 110 is covered with an insulating layer 121, an insulating layer 122, and an insulating layer 123 that are stacked in this order.

In a manufacturing process of the semiconductor device, the insulating layer 121 functions as a protective film when heat treatment is performed to activate an element imparting conductivity that is added to a low resistance layer 113$a$ and a low resistance layer 113$b$. The insulating layer 121 is not necessarily provided.

In the case where a silicon-based semiconductor material is used for the semiconductor layer 112, the insulating layer 122 preferably contains hydrogen. When the insulating layer 122 containing hydrogen is provided over the first transistor 110 and heat treatment is performed, dangling bonds in the semiconductor layer 112 are terminated by hydrogen contained in the insulating layer 122, so that the reliability of the first transistor 110 can be improved.

The insulating layer 123 functions as a planarization film for eliminating a level difference caused by the first transistor 110 or the like underlying the insulating layer 123. A top surface of the insulating layer 123 may be planarized by planarization treatment using a chemical mechanical polishing (CMP) method or the like in order to increase the planarity.

In the insulating layers 121, 122, and 123, a plug 161 electrically connected to the low-resistance layers 113$a$ and 113$b$ and the like, and a plug 162 electrically connected to the gate electrode 115 of the first transistor 110, and the like is embedded.

The structure including the insulating layers 121, 122, and 123 corresponds to the first insulating layer 21 in the above stacked-layer structure.

[First Wiring Layer]

A wiring 131, a wiring 132, a wiring 133, and a wiring 134 are provided over the insulating layer 123.

The wiring 131 is electrically connected to the plug 161. The wiring 133 is electrically connected to the plug 162, and part of the wiring 133 functions as a first electrode of the capacitor 130.

Note that in this specification and the like, an electrode and a wiring electrically connected to the electrode may be a single component. In other words, there are cases where a portion of a wiring functions as an electrode and where a portion of an electrode functions as a wiring.

Here, the structure including the wirings 131, 132, 133, and 134, and the like corresponds to the first wiring layer 31 in the above stacked-layer structure.

The wirings 131, 132, 133, and 134, and the like can be formed using a conductive material such as a metal material, an alloy material, or a metal oxide material. It is particularly preferable to use a high-melting-point material that has both high heat resistance and high conductivity, such as tungsten or molybdenum, and it is particularly preferable to use tungsten.

It is preferable that the wirings 131, 132, 133, and 134, and the like be embedded in an insulating layer 124 and that top surfaces of the insulating layer 124, the wirings 131, 132, 133, and 134, and the like be planarized.

[Barrier Layer]

The barrier layer 120 is provided to cover the top surfaces of the insulating layer 124, the wirings 131, 132, 133, and 134, and the like. The barrier layer 120 corresponds to the barrier layer 41 in the above stacked-layer structure. The description of the barrier layer 41 can be referred to for a material of the barrier layer 120.

The barrier layer 120 also functions as a dielectric layer of the capacitor 130 in a region where a wiring 142 described later overlaps the wiring 133.

The barrier layer 120 has an opening for electrically connecting the wiring 132 to a wiring 141 described layer and an opening for electrically connecting the wiring 134 to the wiring 142 described later.

[Second Wiring Layer]

The wirings 141 and 142, and the like are provided over the barrier layer 120. A structure including the wirings 141 and 142, and the like corresponds to the second wiring layer 32 in the above stacked-layer structure.

The wiring 141 is electrically connected to the wiring 132 through the opening formed in the barrier layer 120. Part of the wiring 141 is overlapped with a channel formation region of the second transistor 100, which is described later, and functions as a second gate electrode of the second transistor 100.

Figure 4A:
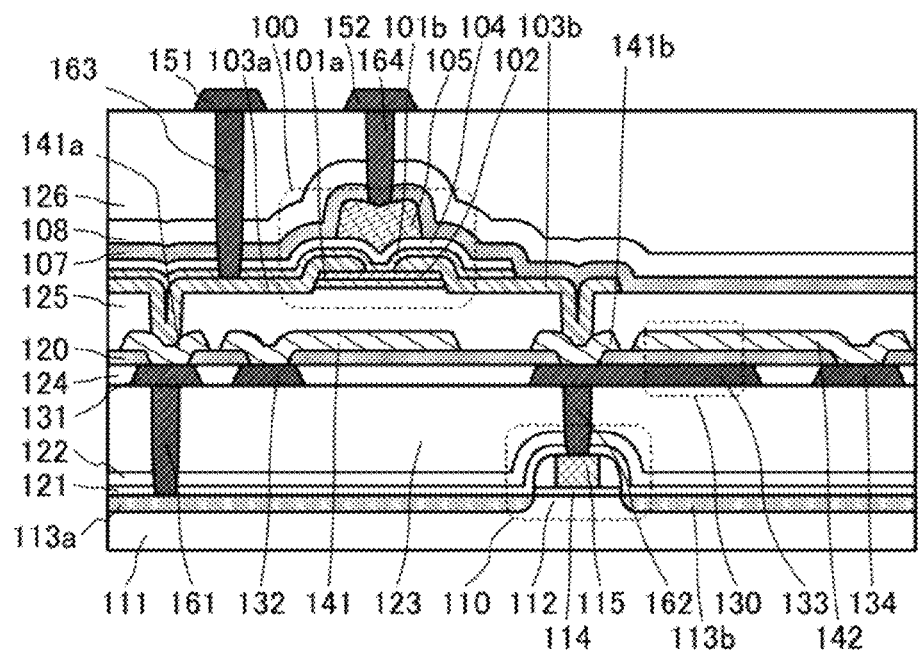
FIGS. 4A and 4B each illustrate a structure example of a semiconductor device of an embodiment.
Figure 4B:
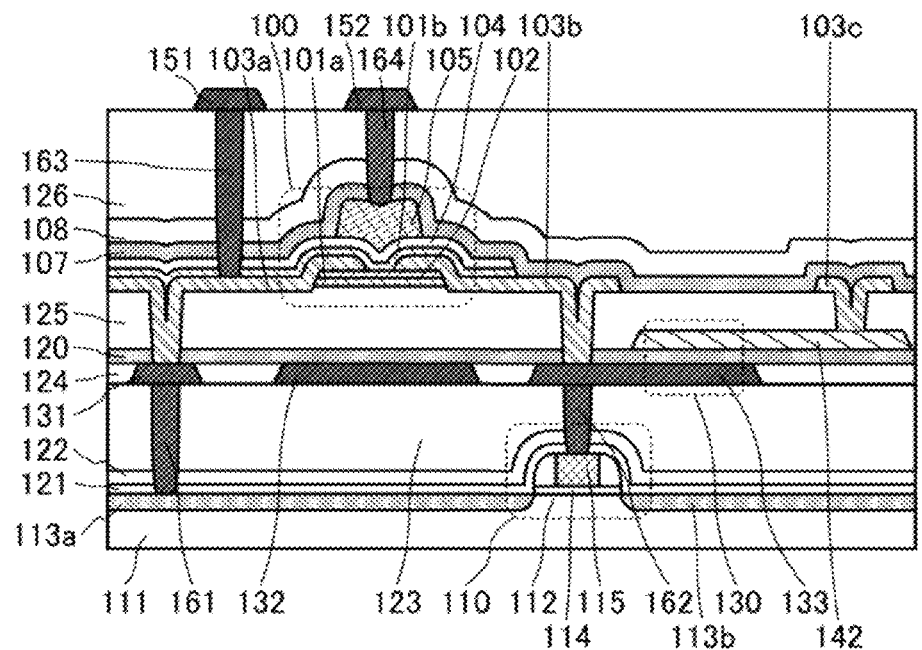

Note that as illustrated in FIG. 4B, a structure in which the wiring 132 is used as the second gate electrode of the second transistor 100 may be employed.

The wiring 142 is electrically connected to the wiring 134 through the opening formed in the barrier layer 120. Part of the wiring 142 overlaps the wiring 133 and functions as a second electrode of the capacitor 130.

Here, the wirings 141 and 142, and the like can be formed using a conductive material such as a metal material, an alloy material, or a metal oxide material. In the case where heat resistance is required, it is particularly preferable to use a high-melting-point material such as tungsten or molybdenum. A low-resistance metal material or a low-resistance alloy material is preferably used in consideration of conductivity; a single layer or a stack using a metal material such as aluminum, chromium, copper, tantalum, or titanium or an alloy material containing any of the metal materials may be used.

It is preferable to use a metal oxide containing an element other than a main component such as phosphorus, boron, carbon, nitrogen, or a transition metal element as a material for forming the wirings 141 and 142, and the like. Such a metal oxide can have high conductivity. For example, a material in which any of the above elements is contained in a metal oxide such as an In—Ga-based oxide, an In—Zn-based oxide, or an In-M-Zn-based oxide (M is Al, Ti, Ga, Y, Zr, La, Ce, Nd, or Hf) to increase the conductivity can be used. Furthermore, such a metal oxide is relatively impermeable to oxygen. Thus, by filling the openings formed in the barrier layer 120 with the wirings 141 and 142, and the like containing such a material, diffusion of oxygen released from an insulating layer 125 described later, when heat treatment is performed to the layers under the barrier layer 120 can be suppressed. Consequently, the amount of oxygen that is released from the insulating layer 125 and can be supplied to a semiconductor layer in the second transistor 100 can be increased.

Note that as illustrated in FIG. 4A, a wiring 141a and a wiring 141b that are formed and etched at the same time as the wiring 141 and the wiring 142 may be provided. The wiring 141a and the wiring 141b are connected to the wiring 131, the wiring 133, and the like.

Note that the wiring 142 may be connected not to the wiring 134 but to another wiring. As illustrated in FIG. 4B, the wiring 142 may be connected to, for example, a wiring 103c that is formed and etched at the same time as an electrode 103a and an electrode 103b.

[Second Insulating Layer]

The insulating layer 125 is provided to cover the barrier layer 120, the wirings 141 and 142, and the like. Here, a region including the insulating layer 125 corresponds to the second insulating layer 22 in the above stacked-layer structure.

It is preferable that the top surface of the insulating layer 125 be planarized by planarization treatment described above.

An oxide material from which oxygen is partly released because of heating is preferably used for the insulating layer 125.

As the oxide material from which oxygen is released by heating, an oxide containing oxygen more than that in the stoichiometric composition is preferably used. Part of oxygen is released by heating from an oxide film containing oxygen more than that in the stoichiometric composition. The oxide film containing oxygen more than that in the stoichiometric composition is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

[Second Layer]

The second transistor 100 is provided over the insulating layer 125. A structure including the second transistor 100 corresponds to the second layer 12 in the above stacked-layer structure.

The second transistor 100 includes a first oxide layer 101a in contact with a top surface of the insulating layer 125; a semiconductor layer 102 in contact with a top surface of the first oxide layer 101a; an electrode 103a and an electrode 103b in contact with a top surface of the semiconductor layer 102 and apart from each other in a region overlapping the semiconductor layer 102; a second oxide layer 101b in contact with the top surface of the semiconductor layer 102; a gate insulating layer 104 over the second oxide layer 101b; and a gate electrode 105 overlapping the semiconductor layer 102 with the gate insulating layer 104 and the second oxide layer 101b therebetween. An insulating layer 107, an insulating layer 108, and an insulating layer 126 are provided to cover the second transistor 100.

Note that at least part (or all) of the electrode 103a (and/or the electrode 103b) is provided on at least part (or all) of a surface, a side surface, a top surface, and/or a bottom surface of a semiconductor layer such as the semiconductor layer 102 (and/or the first oxide layer 101a).

Alternatively, at least part (or all) of the electrode 103a (and/or the electrode 103b) is in contact with at least part (or all) of a surface, a side surface, a top surface, and/or a bottom surface of a semiconductor layer such as the semiconductor layer 102 (and/or the first oxide layer 101a). Alternatively, at least part (or all) of the electrode 103a (and/or the electrode 103b) is in contact with at least part (or all) of a semiconductor layer such as the semiconductor layer 102 (and/or the first oxide layer 101a).

Alternatively, at least part (or all) of the electrode 103a (and/or the electrode 103b) is electrically connected to at least part (or all) of a surface, a side surface, a top surface, and/or a bottom surface of a semiconductor layer such as the semiconductor layer 102 (and/or the first oxide layer 101a). Alternatively, at least part (or all) of the electrode 103a (and/or the electrode 103b) is electrically connected to at least part (or all) of a semiconductor layer such as the semiconductor layer 102 (and/or the first oxide layer 101a).

Alternatively, at least part (or all) of the electrode 103a (and/or the electrode 103b) is provided near at least part (or all) of a surface, a side surface, a top surface, and/or a bottom surface of a semiconductor layer such as the semiconductor layer 102 (and/or the first oxide layer 101a). Alternatively, at least part (or all) of the electrode 103a (and/or the electrode 103b) is provided near at least part (or all) of a semiconductor layer such as the semiconductor layer 102 (and/or the first oxide layer 101a).

Alternatively, at least part (or all) of the electrode 103a (and/or the electrode 103b) is placed on a side of at least part (or all) of a surface, a side surface, a top surface, and/or a bottom surface of a semiconductor layer such as the semiconductor layer 102 (and/or the first oxide layer 101a). Alternatively, at least part (or all) of the electrode 103a (and/or the electrode 103b) is placed on a side of at least part (or all) of a semiconductor layer such as the semiconductor layer 102 (and/or the first oxide layer 101a).

Alternatively, at least part (or all) of the electrode 103a (and/or the electrode 103b) is provided obliquely above at least part (or all) of a surface, a side surface, a top surface, and/or a bottom surface of a semiconductor layer such as the semiconductor layer 102 (and/or the first oxide layer 101a). Alternatively, at least part (or all) of the electrode 103a (and/or the electrode 103b) is provided obliquely above at least part (or all) of a semiconductor layer such as the semiconductor layer 102 (and/or the first oxide layer 101a).

Alternatively, at least part (or all) of the electrode 103a (and/or the electrode 103b) is provided above at least part (or all) of a surface, a side surface, a top surface, and/or a bottom surface of a semiconductor layer such as the semiconductor layer 102 (and/or the first oxide layer 101a). Alternatively, at least part (or all) of the electrode 103a (and/or the electrode 103b) is provided above at least part (or all) of a semiconductor layer such as the semiconductor layer 102 (and/or the first oxide layer 101a).

The semiconductor layer 102 may contain a semiconductor such as a silicon-based semiconductor in a region where a channel is formed. It is particularly preferable that the semiconductor layer 102 contain a semiconductor having a wider band gap than silicon. The semiconductor layer 102 preferably contains an oxide semiconductor. A semiconductor material having a wider band gap and a lower carrier density than silicon is preferably used because off-state leakage current of the transistor can be reduced.

For example, the oxide semiconductor preferably contains at least indium (In) or zinc (Zn). More preferably, the oxide semiconductor contains an oxide represented by an In-M-Zn-based oxide (M is a metal such as Al, Ti, Ga, Ge, Y, Zr, Sn, La, Ce, or Hf.

As the semiconductor layer, it is particularly preferable to use an oxide semiconductor layer including a plurality of crystal parts whose c-axes are aligned perpendicular to a surface on which the semiconductor layer is formed or the top surface of the semiconductor film and in which the adjacent crystal parts have no grain boundary.

The use of such materials for the semiconductor layer makes it possible to provide a highly reliable transistor in which changes in the electrical characteristics are suppressed.

Note that details of a preferable mode and a formation method of an oxide semiconductor that can be used for the semiconductor layer are described in an embodiment below.

A semiconductor device of one embodiment of the present invention preferably includes, between an oxide semiconductor layer and an insulating layer overlapping the oxide semiconductor layer, an oxide layer that contains as its constituent element at least one of the metal elements constituting the oxide semiconductor layer. This can prevent formation of a trap state at the interface between the oxide semiconductor layer and the insulating layer overlapping the oxide semiconductor layer.

That is, one embodiment of the present invention preferably has a structure in which each of the top surface and the bottom surface of at least the channel formation region of the oxide semiconductor layer is in contact with an oxide layer that functions as a barrier film for preventing formation of an interface state of the oxide semiconductor layer. With this structure, formation of oxygen vacancies and entry of impurities that cause generation of carriers in the oxide semiconductor layer and at the interface can be prevented. Thus, a highly purified intrinsic oxide semiconductor layer can be obtained. Obtaining a highly purified intrinsic oxide semiconductor layer refers to purifying or substantially purifying the oxide semiconductor layer to be an intrinsic or substantially intrinsic oxide semiconductor layer. In this way, changes in electrical characteristics of a transistor including the oxide semiconductor layer can be suppressed, and a highly reliable semiconductor device can be provided.

Note that in this specification and the like, in the case of the substantially purified oxide semiconductor layer, the carrier density thereof is lower than $1 \times 10^{17}/\text{cm}^3$, lower than $1 \times 10^{15}/\text{cm}^3$, or lower than $1 \times 10^{13}/\text{cm}^3$. With a highly purified intrinsic oxide semiconductor layer, the transistor can have stable electric characteristics.

The first oxide layer 101a is provided between the insulating layer 125 and the semiconductor layer 102.

The second oxide layer 101b is provided between the semiconductor layer 102 and the gate insulating layer 104. Specifically, the top surface of the second oxide layer 101b is in contact with the bottom surface of the gate insulating layer 104, and the bottom surface of the second oxide insulating layer 101b is in contact with the top surfaces of the first electrode 103a and the second electrode 103b.

The first oxide layer 101a and the second oxide layer 101b each contain an oxide containing one or more metal elements that are also contained in the semiconductor layer 102.

Note that the boundary between the semiconductor layer 102 and the first oxide layer 101a or the boundary between the semiconductor layer 102 and the second oxide layer 101b is not clear in some cases.

For example, the first oxide layer 101a and the second oxide layer 101b contain In or Ga; typically, a material such as an In—Ga-based oxide, an In—Zn-based oxide, or an In-M-Zn-based oxide (M is Al, Ti, Ga, Y, Zr, La, Ce, Nd, or Hf) that has an energy level of the conduction band minimum closer to the vacuum level than that of the semiconductor layer 102 is used. Typically, the difference in energy at the bottom of the conduction band between the first oxide layer 101a or the second oxide layer 101b and the semiconductor layer 102 is preferably 0.05 eV or more, 0.07 eV or more, 0.1 eV or more, or 0.15 eV or more and 2 eV or less, 1 eV or less, 0.5 eV or less, or 0.4 eV or less.

An oxide having a Ga (serving as a stabilizer) content higher than that of the semiconductor layer 102 is used for the first oxide layer 101a and the second oxide layer 101b, between which the semiconductor layer 102 is sandwiched, in which case release of oxygen from the semiconductor layer 102 can be inhibited.

When an In—Ga—Zn-based oxide in which the atomic ratio of In to Ga and Zn is 1:1:1 or 3:1:2 is used for the semiconductor layer 102, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the first oxide layer 101a or the second oxide layer 101b. Note that the atomic ratio of each of the semiconductor layer 102, the first oxide layer 101a, and the second oxide layer 101b may vary within a range of ±20% of any of the above-described atomic ratios as an error. For the first oxide layer 101a and the second oxide layer 101b, materials with the same composition or material with different compositions may be used.

When an In-M-Zn-based oxide is used for the semiconductor layer 102, an oxide containing metal elements in the atomic ratio satisfying the following conditions is preferably used for a target for forming the semiconductor film serving as the semiconductor layer 102. Given that the atomic ratio of the metal elements in the oxide is In:M:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=3:1:2, or the like.

When an In-M-Zn-based oxide is used for the first oxide layer 101a and the second oxide layer 101b, an oxide containing metal elements in the following atomic ratio is preferably used for a target for depositing oxide films serving as the first oxide layer 101a and the second oxide layer 101b. Given that the atomic ratio of the metal elements in the target is In:M:Zn=$x_2$:$y_2$:$z_2$, it is preferable that $x_2/y_2$ be less than $x_1/y_1$, and $z_2/y_2$ be greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1:3:8, or the like.

By using a material in which the energy at the bottom of the conduction band is closer to the vacuum level than that of the semiconductor layer 102 is used for the first oxide layer 101a and the second oxide layer 101b, a channel is mainly formed in the semiconductor layer 102, so that the semiconductor layer 102 serves as a main current path.

When the semiconductor layer 102 in which a channel is formed is sandwiched between the first oxide layer 101a and the second oxide layer 101b as described above, formation of interface states between these layers is prevented; thus, the reliability of the electrical characteristics of the transistor is improved.

Note that, without limitation to those described above, a material with an appropriate composition may be used depending on required semiconductor characteristics and electrical characteristics (e.g., field-effect mobility and threshold voltage) of a transistor. In order to obtain the required semiconductor characteristics of the transistor, it is preferable that the carrier density, the impurity concentration, the defect density, the atomic ratio of a metal element to oxygen, the interatomic distance, the density, and the like of each of the semiconductor layer 102, the first oxide layer 101a, and the second oxide layer 101b be set to appropriate values.

Here, a mixed region of the first oxide layer 101a and the semiconductor layer 102 might exist between the first oxide layer 101a and the semiconductor layer 102. A mixed region of the semiconductor layer 102 and the second oxide layer 101b might exist between the semiconductor layer 102 and the second oxide layer 101b. The mixed region has a low density of interface states. For that reason, the stack including the first oxide layer 101a, the semiconductor layer 102, and the second oxide layer 101b has a band structure where energy at each interface and in the vicinity of the interface is changed continuously (continuous junction).

Here, the band structure is described. For easy understanding, the band structure is illustrated with the energy (Ec) at the bottom of the conduction band of each of the insulating layer 125, the first oxide layer 101a, the semiconductor layer 102, the second oxide layer 101b, and the gate insulating layer 104.

Figure 30A:
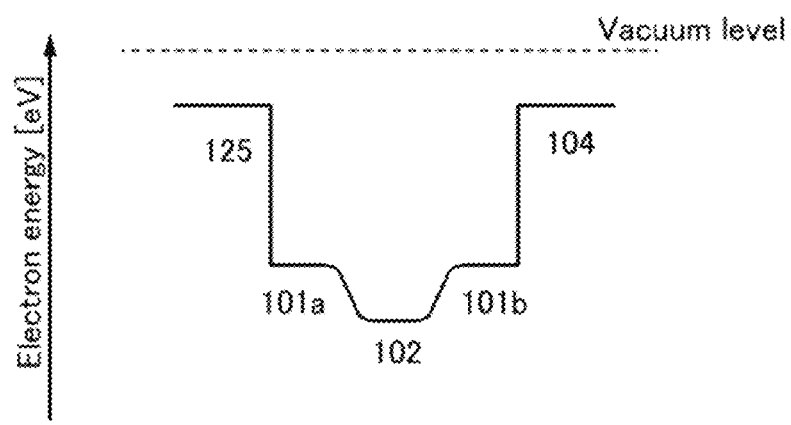
FIGS. 30A and 30B each illustrate a band structure of an embodiment.
Figure 30B:
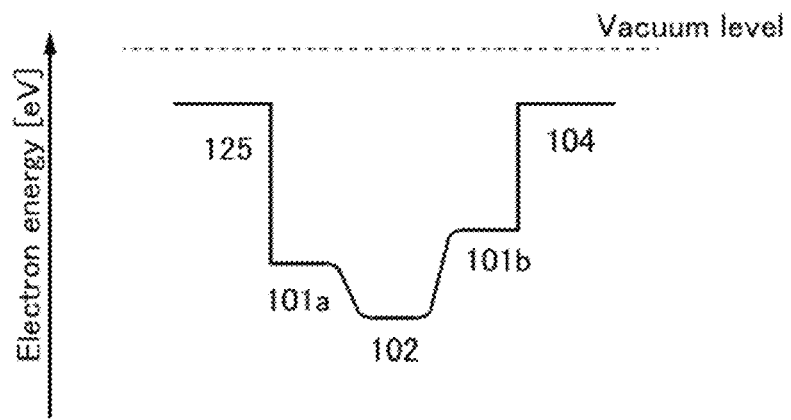

As illustrated in FIGS. 30A and 30B, the energy at the bottom of the conduction band changes continuously in the first oxide layer 101a, the semiconductor layer 102, and the second oxide layer 101b. This can be understood also from the fact that the constituent elements are common among the first oxide layer 101a, the semiconductor layer 102, and the second oxide layer 101b and oxygen easily diffuses among the first oxide layer 101a, the semiconductor layer 102, and the second oxide layer 101b. Thus, the first oxide layer 101a, the semiconductor layer 102, and the second oxide layer 101b have a continuous physical property although they are a stack of layers having different compositions.

The oxide films, which contain the same main components and are stacked, are not simply stacked but formed to have continuous junction (here, particularly a U-shaped well structure where the energy at the bottom of the conduction band is continuously changed between the films. In other words, a stacked-layer structure is formed such that there exist no impurities that form a defect level such as a trap center or a recombination center at each interface. If impurities exist between the stacked layers in the multilayer film, the continuity of the energy band is lost and carriers disappear by a trap or recombination.

Note that FIG. 30A illustrates the case where the Ec of the first oxide layer 101a and the Ec of the second oxide layer 101b are equal to each other; however, they may be different from each other. For example, part of the band structure in the case where the Ec of the second oxide layer 101b is higher than the Ec of the first oxide layer 101a is illustrated in FIG. 30B.

As illustrated in FIGS. 30A and 30B, the semiconductor layer 102 serves as a well and a channel of the transistor 100 is formed in the semiconductor layer 102. Note that since the energies at the bottoms of the conduction bands are changed continuously, the first oxide layer 101a, the semiconductor layer 102, and the second oxide layer 101b can also be referred to as a U-shaped well. A channel formed to have such a structure can also be referred to as a buried channel.

Note that trap states caused by impurities or defects might be formed in the vicinity of the interface between an insulating film such as a silicon oxide film and each of the first oxide layer 101a and the second oxide layer 101b. The semiconductor layer 102 can be distanced away from the trap states owing to the existence of the first oxide layer 101a and the second oxide layer 101b. However, when the energy difference between the Ec of the first oxide layer 101a or the second oxide layer 101b and the Ec of the semiconductor layer 102 is small, electrons in the semiconductor layer 102 might reach the trap states across the energy difference. When electrons to be negative charge are captured by the trap states, the threshold voltage of the transistor is shifted in the positive direction.

Thus, to reduce changes in the threshold voltage of the transistor, an energy difference between the Ec of the semiconductor layer 102 and the Ec of each of the first oxide layer 101a and the second oxide layer 101b is necessary. Each of the energy differences is preferably greater than or equal to 0.1 eV, further preferably greater than or equal to 0.15 eV.

The first oxide layer 101a, the semiconductor layer 102, and the second oxide layer 101b preferably include crystal parts. In particular, when crystals with c-axis alignment are used, the transistor can have stable electrical characteristics.

In the band structure illustrated in FIG. 30B, instead of the second oxide layer 101b, an In—Ga oxide (e.g., with an atomic ratio of In:Ga=7:93) may be provided between the semiconductor layer 102 and the gate insulating layer 104.

For the semiconductor layer 102, an oxide having an electron affinity higher than those of the first oxide layer 101a and the second oxide layer 101b is used. For example, for the semiconductor layer 102, an oxide having an electron affinity higher than that of each of the first oxide layer 101a and the second oxide layer 101b by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the bottom of the conduction band.

Here, the thickness of the semiconductor layer 102 is preferably larger than that of the first oxide layer 101a. The thicker the semiconductor layer 102 is, the larger the on-state current of the transistor is. The thickness of the first oxide layer 101a may be set as appropriate as long as formation of an interface state at an interface with the semiconductor layer 102 is inhibited. For example, the thickness of the semiconductor layer 102 is larger than that of the first oxide layer 101a, preferably 2 times or more, further preferably 4 times or more, still further preferably 6 times or more as large as that of the first oxide layer 101a. Note that the above does not apply in the case where the on-state current of the transistor does not need to be increased, and the thickness of the first oxide layer 101a may be thicker than the semiconductor layer 102.

The thickness of the second oxide layer 101b may be set as appropriate, in a manner similar to that of the first oxide layer 101a, as long as generation of an interface state at an interface with the semiconductor layer 102 is inhibited. For example, the thickness of the second oxide layer 101b may be set smaller than or equal to that of the first oxide layer 101a. If the second oxide layer 101b is thick, it might become difficult for an electric field from the gate electrode 105 to reach the semiconductor layer 102. Therefore, it is preferable that the second oxide layer 101b be thin, for example, thinner than the semiconductor layer 102. Note that the thickness of the second oxide layer 101b is not limited to the above, and may be set as appropriate depending on driving voltage of the transistor in consideration of the withstand voltage of the gate insulating layer 104.

Here, in the case where the semiconductor layer 102 is in contact with an insulating layer containing different constituent elements (e.g., an insulating film containing a silicon oxide film), an interface state is sometimes formed at the interface between the two layers and the interface state forms a channel. In this case, a second transistor having a different threshold voltage appears, so that an apparent threshold voltage of the transistor changes. In the transistor having this structure, however, the first oxide layer 101a containing one or more kinds of metal elements constituting the semiconductor layer 102 is provided, which makes it difficult for an interface state to be formed at the interface between the first oxide layer 101a and the semiconductor layer 102. Thus, providing the first oxide layer 101a makes it possible to reduce variations or changes in the electrical characteristics of the transistor, such as threshold voltage.

When a channel is formed at the interface between the gate insulating layer 104 and the semiconductor layer 102, interface scattering occurs at the interface and the field-effect mobility of the transistor is reduced in some cases. In the transistor having this structure, however, since the second oxide layer 101b contains one or more kinds of metal elements constituting the semiconductor layer 102, scattering of carriers is less likely to occur at an interface between the semiconductor layer 102 and the second oxide layer 101b; thus, the field-effect mobility of the transistor can be increased.

One of the electrodes 103a and 103b serves as a source electrode and the other serves as a drain electrode.

The electrode 103a is electrically connected to the wiring 131 through the opening formed in the insulating layer 125 and the barrier layer 120. The electrode 103b is electrically connected to the wiring 133 through a similar opening.

Figure 3B:
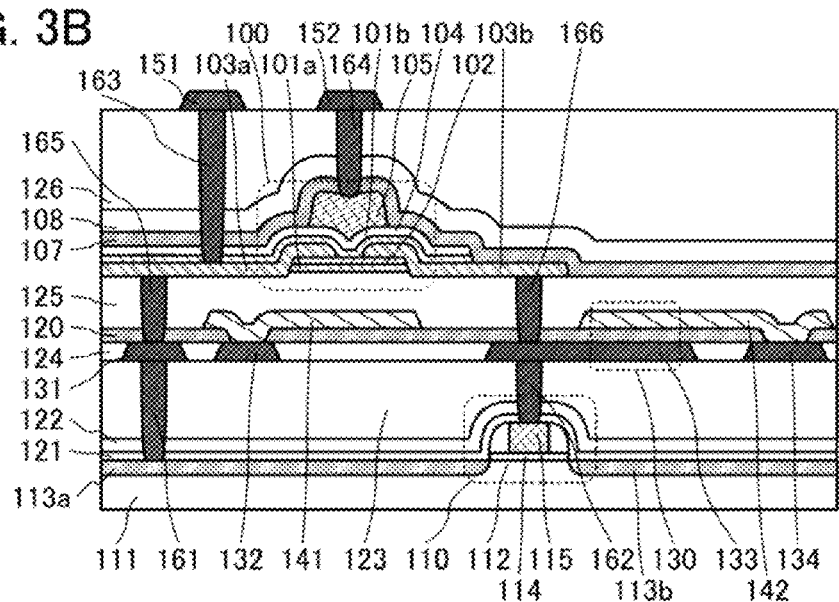

The structure in which the electrode 103a and the electrode 103b are in contact with the wiring 131 and the wiring 133, respectively is illustrated in FIG. 2B. However, as illustrated in FIG. 3B, a structure in which the electrode 103a and the electrode 103b are electrically connected to the wiring 131 and the wiring 133, respectively through a plug 165 and a plug 166 embedded in the insulating layer 125 and the barrier layer 120 may be employed.

Each of the electrodes 103a and 103b is formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The gate insulating layer 104 can be formed to have a single-layer structure or a stacked-layer structure using, for example, one or more of silicon oxide, silicon oxynitride, silicon nitride oxide, aluminum oxide, hafnium oxide, gallium oxide, Ga—Zn-based metal oxide, silicon nitride, and the like.

Alternatively, the gate insulating layer 104 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), or yttrium oxide.

As the gate insulating layer 104, like the insulating layer 125, an oxide insulating film that contains more oxygen than that in the stoichiometric composition is preferably used.

When the specific material is used for the gate insulating layer, electrons are trapped in the gate insulating layer under the specific conditions and the threshold voltage can be increased. For example, like a stacked-layer film of silicon oxide and hafnium oxide, part of the gate insulating layer uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor layer to the gate electrode, and some of the electrons are captured by the electron trap states.

In the transistor in which a necessary amount of electrons is captured by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wire metal connected to the source electrode or the drain electrode of the transistor, after the preceding process (wafer processing), after a wafer-dicing step, after packaging, or the like. In any case, it is preferable that the transistor not be exposed to a temperature higher than or equal to 125° C. for one hour or more after that.

The gate electrode 105 can be formed using, for example, a metal selected from aluminum, chromium, copper, tantalum, titanium, molybdenum, and tungsten; an alloy containing any of these metals as a component; an alloy containing any of these metals in combination; or the like. Alternatively, one or both of manganese and zirconium may be used. Alternatively, a semiconductor typified by polycrystalline silicon doped with an impurity element such as phosphorus, or a silicide such as nickel silicide may be used for the gate electrode 105. Furthermore, the gate electrode 105 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film that contains aluminum and one or more metals selected from titanium, tantalum, tungsten, molybdenum, chromium, neodymium, and scandium may be used.

The gate electrode 105 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

An In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 105 and the gate insulating layer 104. These films each have a work function higher than or equal to 5 eV, preferably higher than or equal to 5.5 eV, which is higher than the electron affinity of an oxide semiconductor. Thus, the threshold voltage of the transistor including an oxide semiconductor can be shifted in the positive direction, and what is called a normally-off switching element can be achieved. For example, in the case of using an In—Ga—Zn-based oxynitride semiconductor film, an In—Ga—Zn-based oxynitride semiconductor film having a higher nitrogen concentration than that of at least the semiconductor layer 102, specifically, an In—Ga—Zn-based oxynitride semiconductor film having a nitrogen concentration of 7 at. % or higher is used.

For the insulating layer 107, as in the case of the barrier layer 120, a material to which water or hydrogen does not easily diffuse is preferably used. In particular, a material that is relatively impermeable to oxygen is preferably used for the insulating layer 107.

By covering the semiconductor layer 102 with the insulating layer 107 including a material relatively impermeable to oxygen, oxygen can be prevented from being released from the semiconductor layer 102 to a portion over the insulating layer 107. Furthermore, oxygen released from the insulating layer 125 can be trapped below the insulating layer 107, resulting in an increase in the amount of oxygen to be supplied to the semiconductor layer 102.

The insulating layer 107 that is relatively impermeable to water or hydrogen can inhibit entry of water or hydrogen, which is an impurity for an oxide semiconductor, so that changes in electrical characteristics of the second transistor 100 can be suppressed and the second transistor 100 can have high reliability.

Note that an insulating layer from which oxygen is released by heating, like the insulating layer 125, may be provided under the insulating layer 107 to supply oxygen also from a portion over the semiconductor layer 102 through the gate insulating layer 104.

Figure 5A:
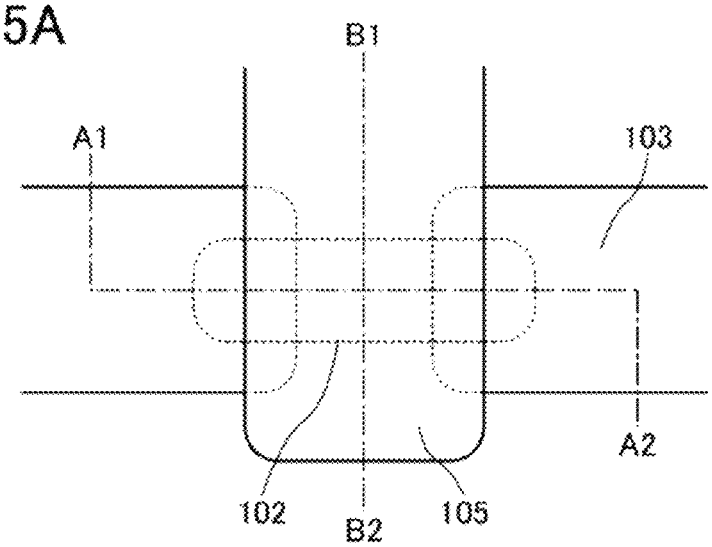
FIGS. 5A to 5C each illustrate a structure example of a semiconductor device of an embodiment.
Figure 5B:
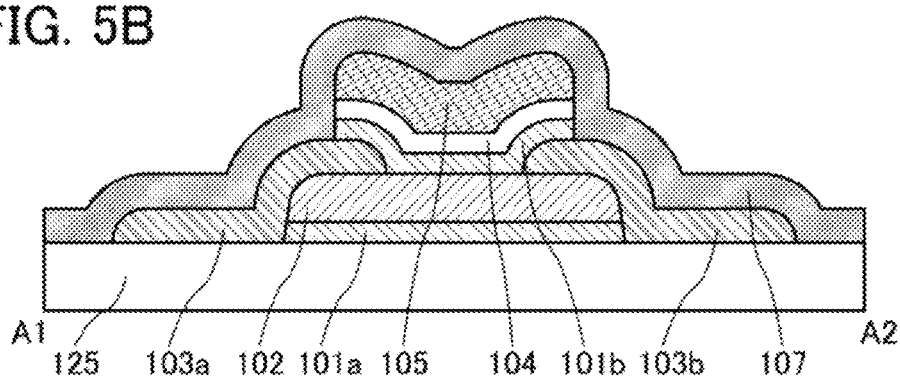
Figure 5C:
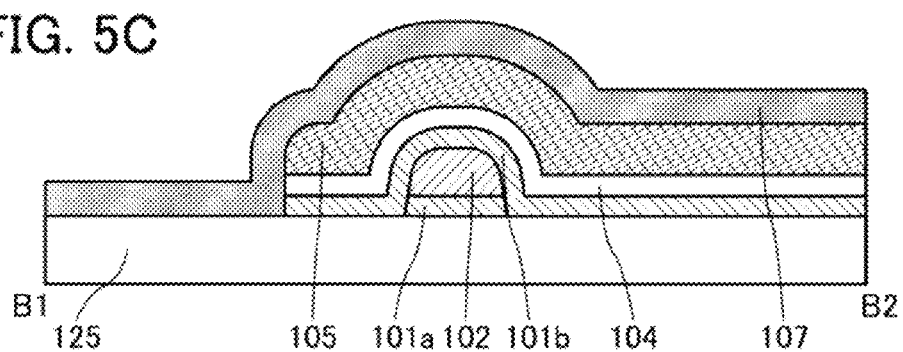

Here, another example of a structure of a transistor that can be used as the second transistor 100 is described. FIG. 5A is a schematic top view of a transistor described below as an example, and FIGS. 5B and 5C are schematic cross-sectional views taken along the section lines A1-A2 and B1-B2, respectively, in FIG. 5A. Note that FIG. 5B corresponds to a cross section of the transistor in a channel length direction, and FIG. 5C corresponds to a cross section of the transistor in a channel width direction.

FIGS. 5A to 5C illustrate an example in which the gate insulating layer 104, the second oxide layer 101b, and the gate electrode 105 are processed with the use of one photomask so that the top-view shapes of the gate insulating layer 104, the second oxide layer 101b, and the gate electrode 105 become substantially the same, unlike the case of the second transistor 100 illustrated in FIG. 2B.

Note that in this specification and the like, the expression "the top-view shapes (of two or more layers) are substantially the same" means that outlines of stacked two or more layers at least partly overlap each other. For example, what is expressed by the expression is a case where an upper layer and a lower layer are processed with the use of the same mask pattern or partly processed with the use of the same mask pattern. In some cases, however, the outlines of such upper and lower layers do not completely overlap each other; for example, the edge of the upper layer may be on an inner/outer side than the edge of the lower layer. The expression "the top-view shapes (of two or more layers) are substantially the same" may also apply to such cases.

As illustrated in FIG. 5C, the gate electrode 105 is provided so as to face top and side surfaces of the semiconductor layer 102 in the cross section of the transistor in the channel width direction. Thus, a channel is formed not only in the vicinity of the top surface but also in the vicinity of the side surface of the semiconductor layer 102, and the effective channel width is increased, which results in increased current in an on state of the transistor (i.e., on-state current). In particular, in the case where the width of the semiconductor layer 102 is very small (e.g., 50 nm or less, preferably 30 nm or less, further preferably 20 nm or less), a region where the channel is formed expands to an inner portion of the semiconductor layer 102. Thus, as miniaturization advances, contribution of this structure to on-state current increases.

Figure 3C:
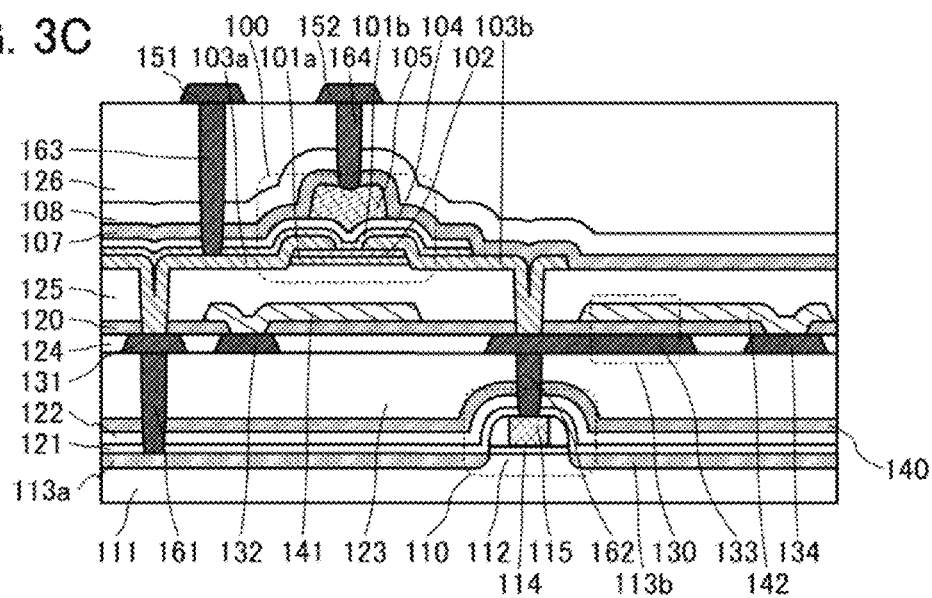
Figure 6A:
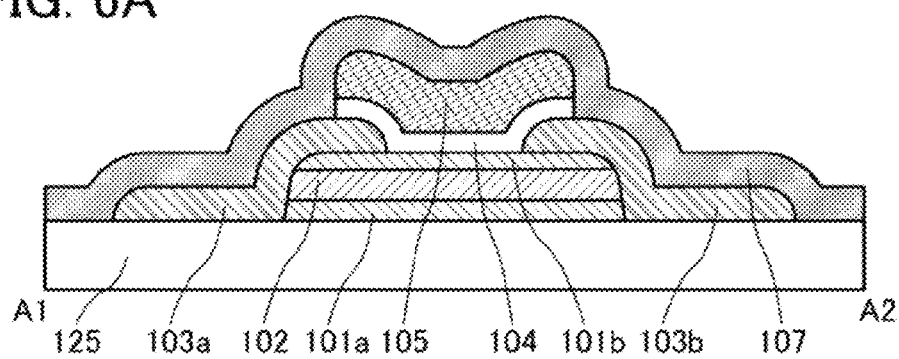
FIGS. 6A and 6B each illustrate a structure example of a semiconductor device of an embodiment.
Figure 6B:
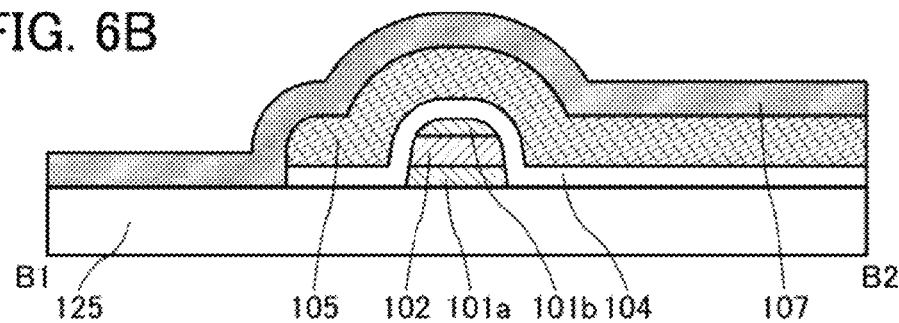

A transistor illustrated in FIGS. 6A and 6B is mainly different from the transistor illustrated in FIGS. 3A to 3C in that the second oxide layer 101b is provided in contact with bottom surfaces of the electrodes 103a and 103b.

Such a structure enables films used for the first oxide layer 101a, the semiconductor layer 102, and the second oxide layer 101b to be formed successively without contact with the air, which can reduce defects at each interface.

Although the first oxide layer 101a and the second oxide layer 101b are provided in contact with the semiconductor layer 102 in the above-described structure, only one of the first oxide layer 101a and the second oxide layer 101b or neither of them may be provided.

Figure 7A:
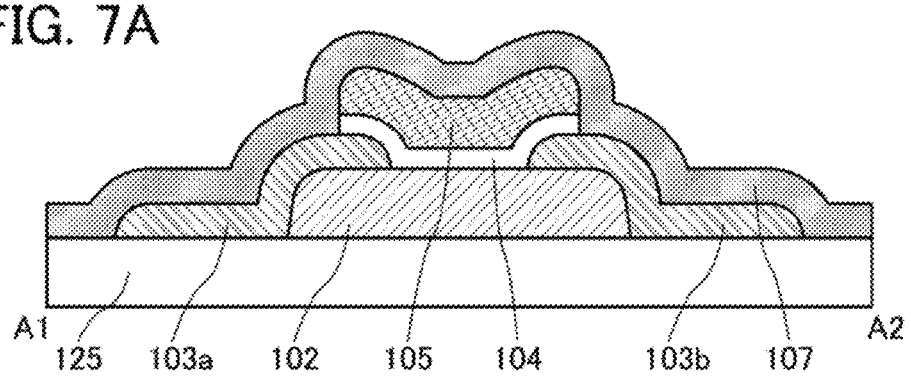
FIGS. 7A and 7B each illustrate a structure example of a semiconductor device of an embodiment.
Figure 7B:
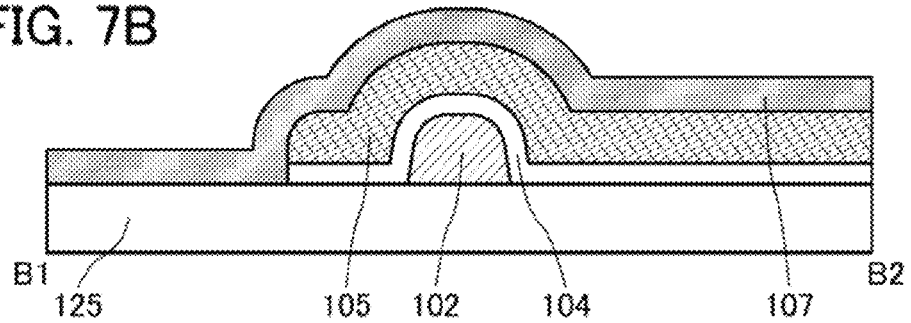
Figure 8A:
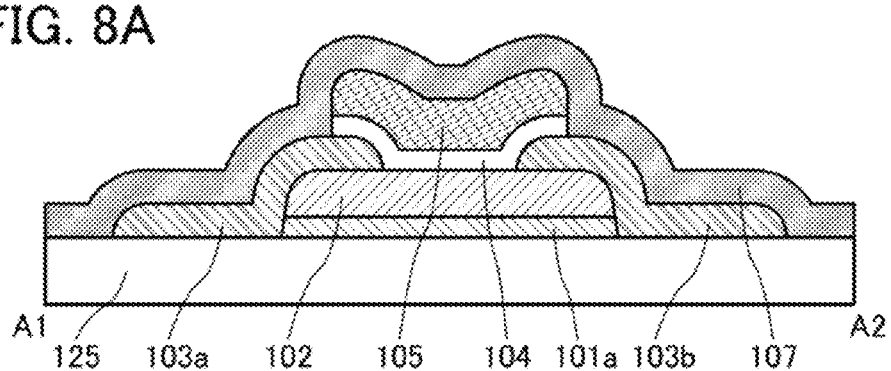
FIGS. 8A and 8B each illustrate a structure example of a semiconductor device of an embodiment.
Figure 8B:
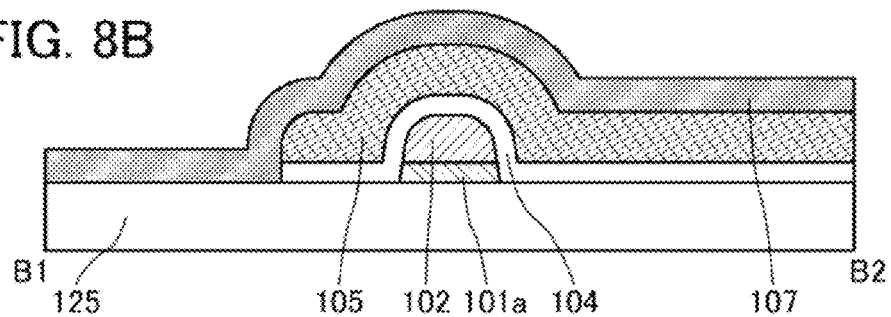
Figure 10A:
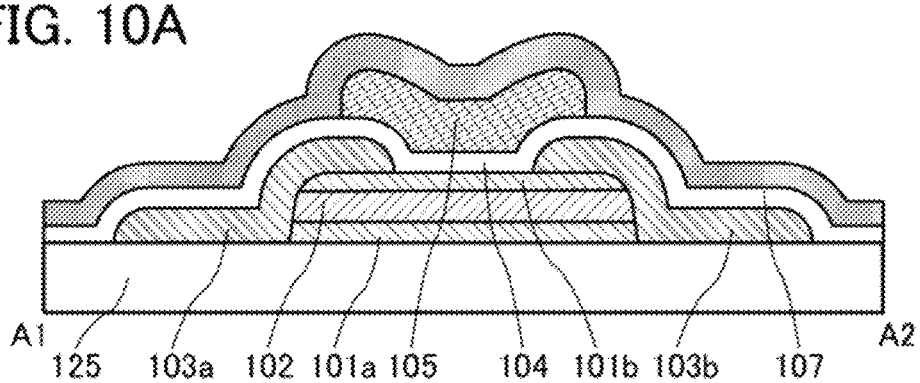
FIGS. 10A and 10B each illustrate a structure example of a semiconductor device of an embodiment.
Figure 10B:
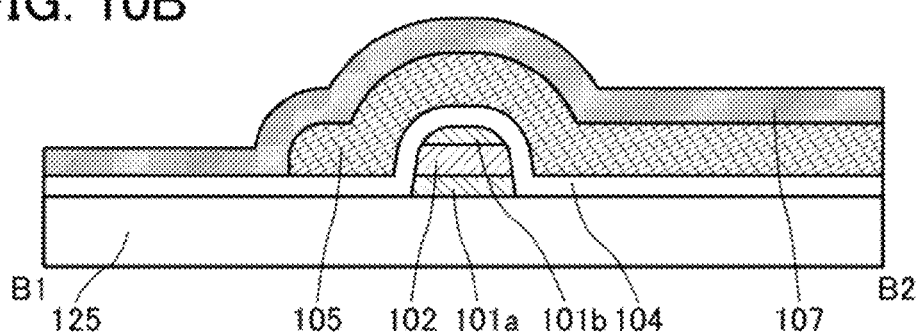
Figure 11A:
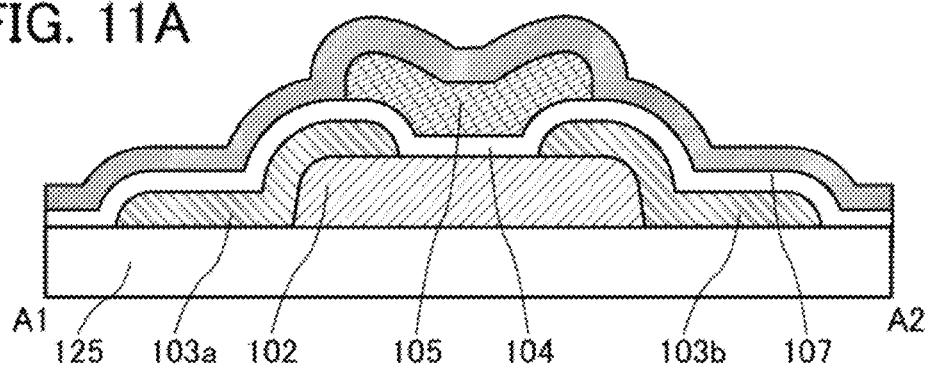
FIGS. 11A and 11B each illustrate a structure example of a semiconductor device of an embodiment.
Figure 11B:
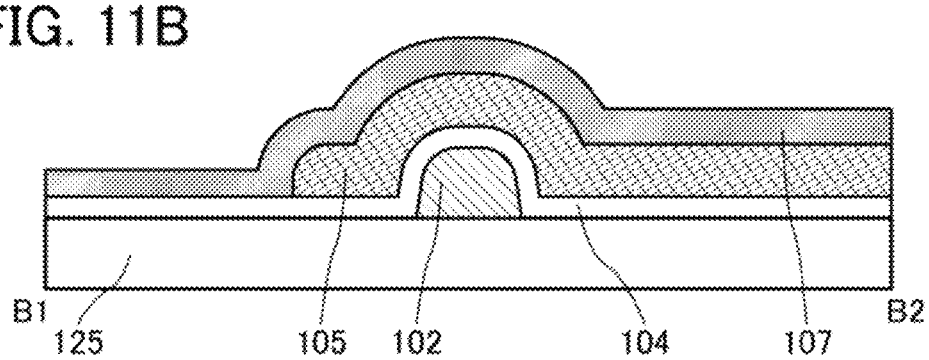
Figure 12A:
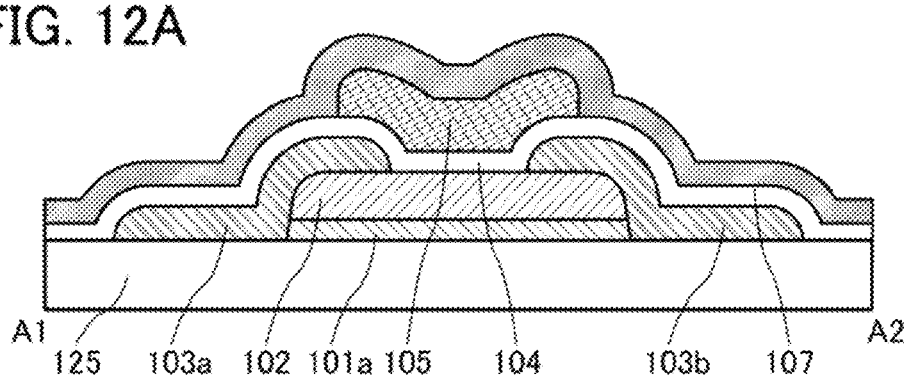
FIGS. 12A and 12B each illustrate a structure example of a semiconductor device of an embodiment.
Figure 12B:
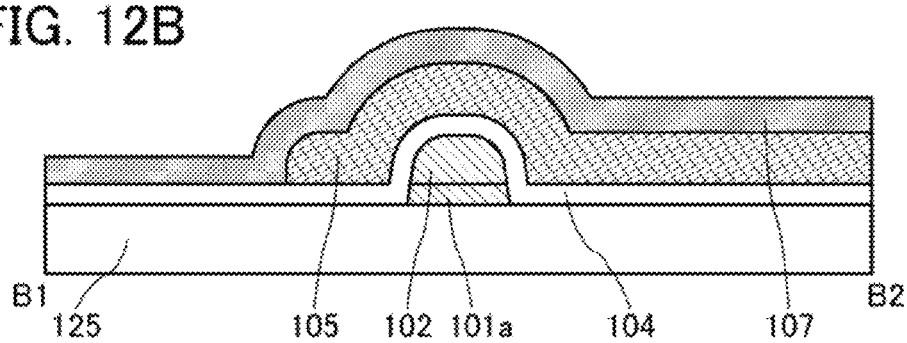

FIGS. 7A and 7B illustrate an example in which the first oxide layer 101a and the second oxide layer 101b are not provided. FIGS. 8A and 8B illustrate an examples in which the first oxide layer 101a is provided and the second oxide layer 101b is not provided. FIGS. 9A and 9B illustrate an example in which the second oxide layer 101b is provided and the first oxide layer 101a is not provided.

The gate insulating layer 104 and the gate electrode 105 are processed so that the top-view shapes of the gate insulating layer 104 and the gate electrode 105 become substantially the same in the structures illustrated in FIGS. 5A to 5C, FIGS. 6A and 6B, FIGS. 7A and 7B, FIGS. 8A and 8B, and FIGS. 9A and 9B. However, one embodiment of the present invention is not limited thereto, and the gate insulating layer 104 and the gate electrode 105 may be processed so that the gate electrode 105 is positioned on the inner side than the gate insulating layer 104 when seen from the above at least in a region where the semiconductor layer 102, the gate insulating layer 104, and the gate electrode 105 overlap each other. Also in the case where the second oxide layer 101b is provided, the second oxide layer 101b may be processed so that the shape of a top surface of the second oxide layer 101b is different from that of the gate electrode 105 or the gate insulating layer 104. Examples of the case are illustrated in FIGS. 10A and 10B, FIGS. 11A and 11B, and FIGS. 12A and 12B.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

The above is the description of the second transistor 100

In FIG. 2B and the like, the insulating layer 126 that covers the second transistor 100 functions as a planarization layer that covers an uneven surface shape of an underlying layer. The insulating layer 108 may function as a protective layer when the insulating layer 126 is formed. Note that the insulating layer 108 is not necessarily provided.

A plug 163 electrically connected to the electrode 103a, a plug 164 electrically connected to the gate electrode 105, and the like are embedded in the insulating layers 107, 108, and 126.

A wiring 151 electrically connected to the plug 163, a wiring 152 electrically connected to the plug 164, and the like are provided over the insulating layer 126.

In FIG. 2B, the wiring 151 corresponds to the wiring BL illustrated in FIG. 2A. Similarly, the wiring 152, the wiring 134, and the wiring 132 correspond to the wiring WL, the wiring CL, and the wiring BG, respectively. A node including the gate electrode 115 of the first transistor 110, the wiring 133 functioning as a first electrode of the capacitor 130, and the electrode 103b of the second transistor 100 corresponds to the node FN illustrated in FIG. 2A.

The semiconductor device of one embodiment of the present invention includes the first transistor 110 and the second transistor 100 over the first transistor. Since these transistors are stacked, the area occupied by the elements can be reduced. Furthermore, the barrier layer 120 provided between the first transistor 110 and the second transistor 100 can suppress diffusion of impurities such as water and hydrogen from the layers under the barrier layer 120 to the second transistor 100 side. Furthermore, the wiring 133 part of which functions as the first electrode and the wiring 142 part of which functions as a second electrode are provided with the barrier layer 120 therebetween to form the capacitor 130; thus, the capacitor 130 can be easily formed without additional steps for forming the capacitor 130.

As illustrated in FIG. 3C, an insulating layer 140 that contains a material similar to that contained in the barrier layer 120 may be provided over the insulating layer 122 containing hydrogen. This structure can effectively suppress diffusion of water or hydrogen remaining in the insulating layer 122 containing hydrogen to a portion over the insulating layer 122. In that case, heat treatment for removing water or hydrogen is preferably performed twice or more in total: before formation of the insulating layer 140, and after formation of the insulating layer 140 and before formation of the barrier layer 120.

The above is the description of Structure Example 1.

Structure Example 2

A structure example that is partly different from Structure Example 1 is described with reference to drawings. Note that portions similar to those described above are not described in some cases in the following description.

Figure 13:
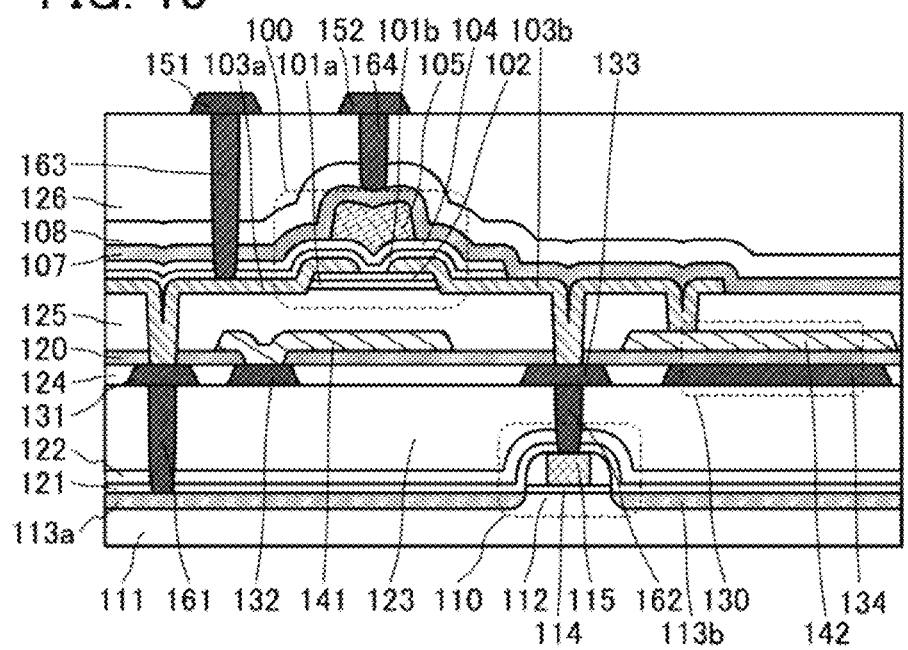
FIG. 13 illustrates a structure example of a semiconductor device of an embodiment.

FIG. 13 illustrates an example of a cross-sectional structure of a semiconductor device in which the circuit shown in FIG. 2A can be obtained.

The semiconductor device illustrated in FIG. 13 includes the first transistor 110, the second transistor 100, and the capacitor 130. The second transistor 100 is provided over the first transistor 110. The barrier layer 120 is provided between the first transistor 110 and the second transistor 100.

The semiconductor device illustrated in FIG. 13 is mainly different from the semiconductor device illustrated in FIG. 2B in the structures of the capacitor 130 and the vicinity thereof. Specifically, the wiring 134, instead of the wiring 133, functions as one of a pair of electrodes of the capacitor 130. The electrode 103b is electrically connected to each of the wiring 133 and the wiring 142 through openings formed in the insulating layer 125. The wiring 134 and the wiring 142 overlap each other, where the capacitor 130 is formed.

In other words, the structure illustrated in FIG. 13 and the structure illustrated in FIG. 2B are mainly different from each other as follows: the wiring (the wiring 133) positioned over the barrier layer 120 (on the second transistor 100 side), of the pair of electrodes of the capacitor 130, forms part of the node FN in FIG. 13, whereas the wiring (the wiring 142) positioned under the barrier layer 120 (on the first transistor 110 side), of the pair of electrodes of the capacitor 130, forms part of the node FN in FIG. 2B.

Figure 14A:
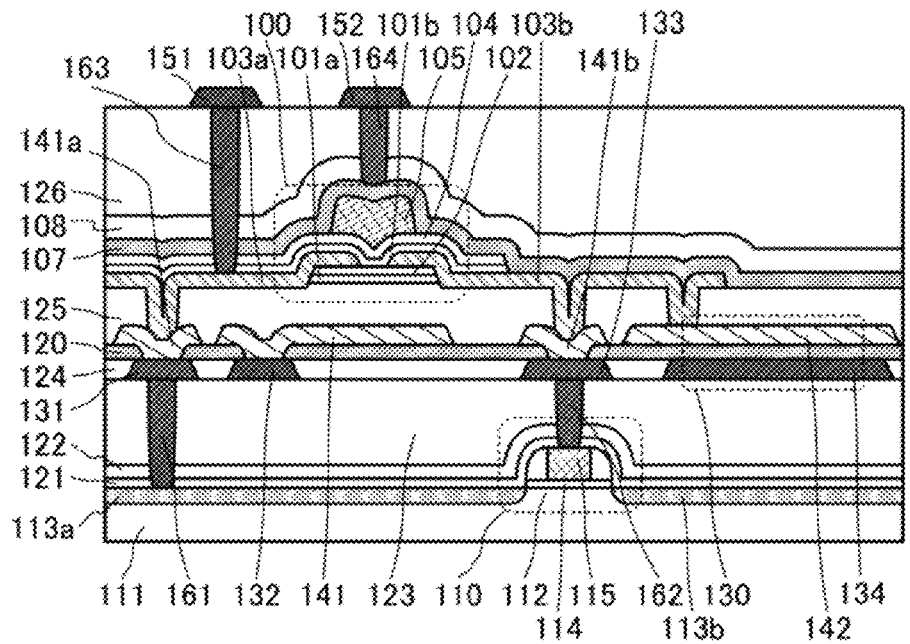
FIGS. 14A and 14B each illustrate a structure example of a semiconductor device of an embodiment.

Note that as illustrated in FIG. 14A, the wiring 141a and the wiring 141b that are formed and etched at the same time as the wiring 141 and the wiring 142 may be provided. The wiring 141a and the wiring 141b are connected to the wiring 131, the wiring 133, and the like.

Figure 14B:
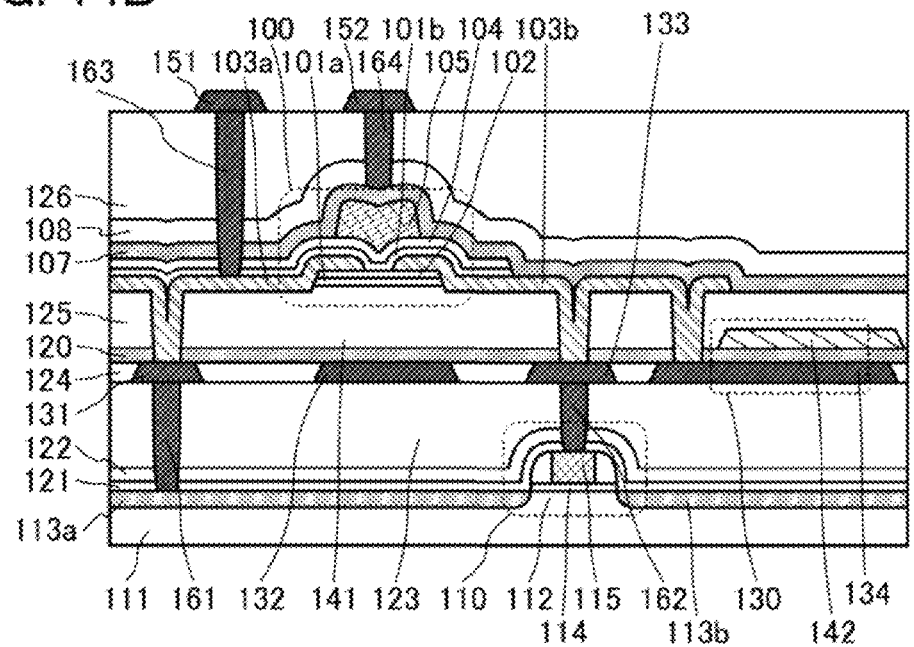

As illustrated in FIG. 14B, the wiring 132 may be used as a second gate electrode of the second transistor 100. In addition, as illustrated in FIG. 14B, the electrode 103b can be connected not to the wiring 142 but to the wiring 134.

Figure 15A:
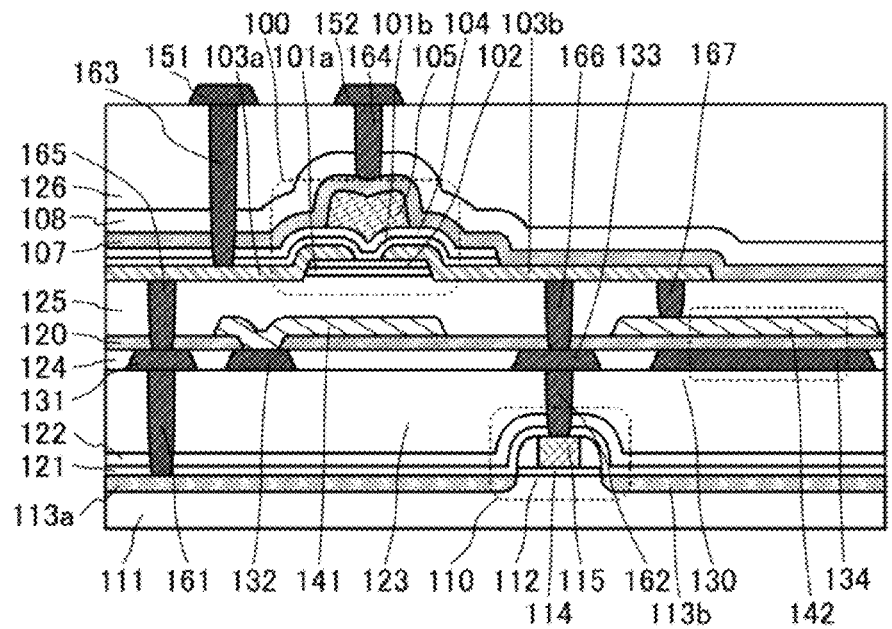
FIGS. 15A and 15B each illustrate a structure example of a semiconductor device of an embodiment.

The structure in which the electrode 103a and the wiring 131 are in contact with each other, the electrode 103b and the wiring 133 are in contact with each other, and the electrode 103b and the wiring 142 are in contact with each other is illustrated in FIG. 13. However, as illustrated in FIG. 15A, a structure in which they are electrically connected to each other through the plug 165, the plug 166, and a plug 167 embedded in the insulating layer 125 and the barrier layer 120 may be employed.

The semiconductor device of one embodiment of the present invention includes the first transistor 110 and the second transistor 100 over the first transistor. Since these transistors are stacked, the area occupied by the elements can be reduced. Furthermore, the barrier layer 120 provided between the first transistor 110 and the second transistor 100 can suppress diffusion of impurities such as water and hydrogen from the layers under the barrier layer 120 to the second transistor 100 side. Furthermore, the wiring 134 part of which functions as the first electrode and the wiring 142 part of which functions as a second electrode are provided with the barrier layer 120 therebetween to form the capacitor 130; thus, the capacitor 130 can be easily formed without additional steps for forming the capacitor 130.

Figure 15B:
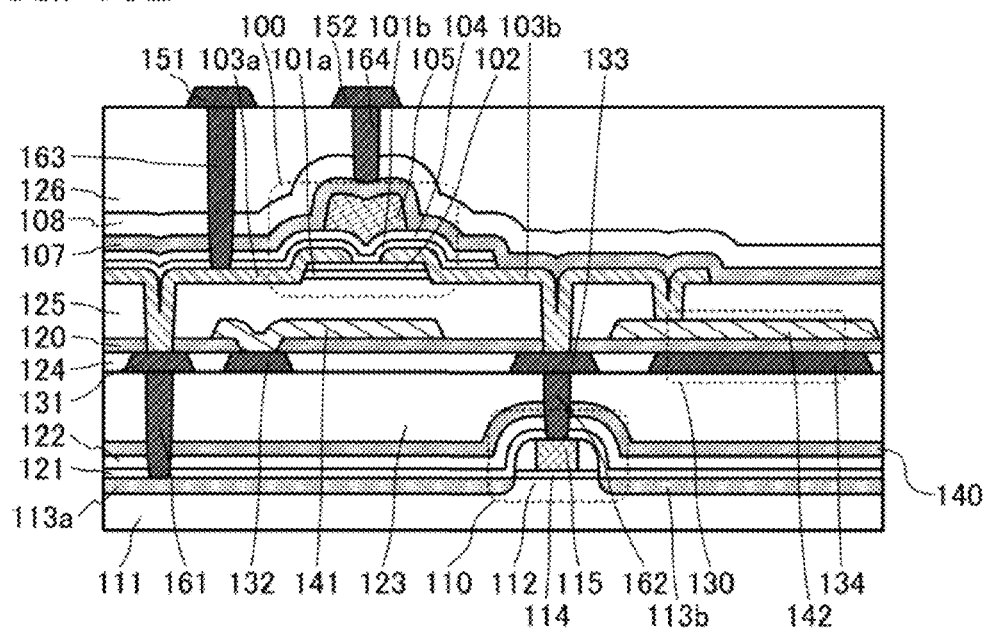

As illustrated in FIG. 15B, an insulating layer 140 that contains a material similar to that contained in the barrier layer 120 may be provided over the insulating layer 122 containing hydrogen. This structure can effectively suppress diffusion of water or hydrogen remaining in the insulating layer 122 containing hydrogen to a portion over the insulating layer 122. In that case, heat treatment for removing water or hydrogen is preferably performed twice or more in total: before formation of the insulating layer 140, and after formation of the insulating layer 140 and before formation of the barrier layer 120.

Figure 16:
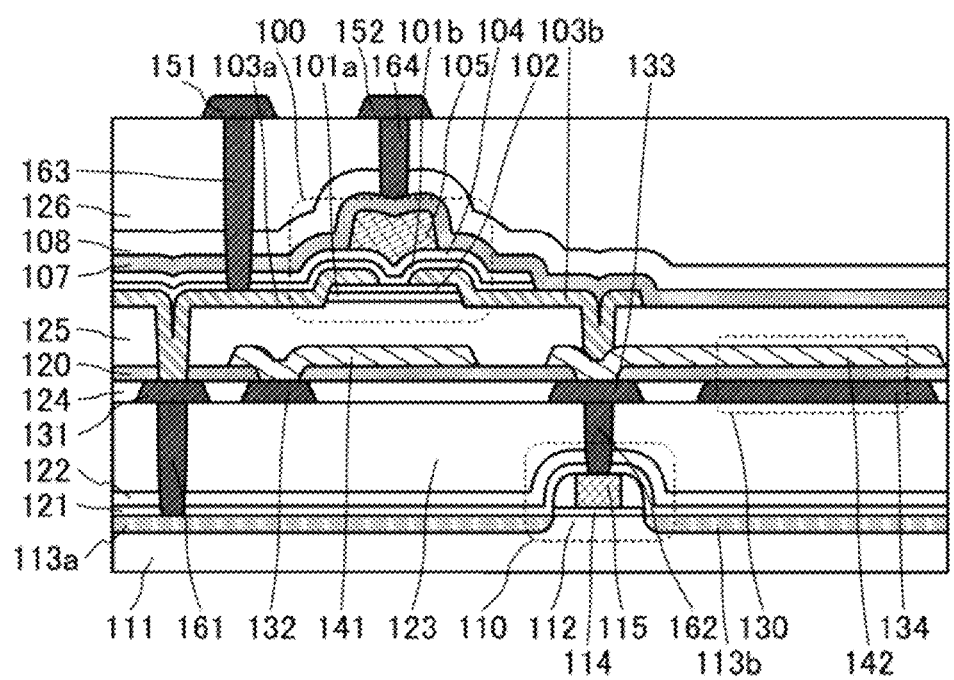
FIG. 16 illustrates a structure example of a semiconductor device of an embodiment.

FIG. 16 is a schematic cross-sectional view of a semiconductor device with a structure that is partly different from the structure illustrated in FIG. 13. In the semiconductor device illustrated in FIG. 16, part of the wiring 142 is electrically connected to the wiring 133 through an opening formed in the barrier layer 120. The electrode 103b of the second transistor 100 is electrically connected to the wiring 142 through an opening in the insulating layer 125, which is formed in a region where the electrode 103b overlaps the wiring 133. In other words, the electrode 103b, the wiring 142, and the wiring 133 are electrically connected to one another in a region overlapping one opening formed in the insulating layer 125. This structure can reduce the number of openings formed in the insulating layer 125 and the area occupied by the semiconductor device.

The above is the description of Structure Example 2.

Structure Example 3

A structure example of a semiconductor device that is partly different from Structure Example 1 and Structure Example 2 is described with reference to drawings. Note that portions similar to those described above are not described in some cases in the following description.

Figure 17A:
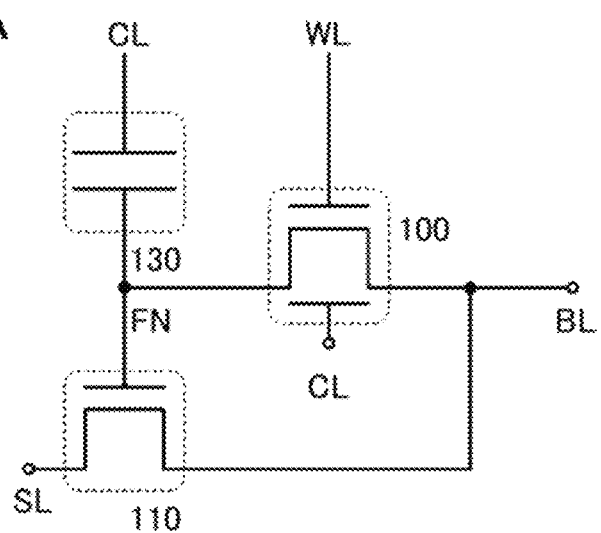
FIG. 17A is a circuit diagram of a semiconductor device of one embodiment and 17B illustrates a structure example of the semiconductor device.

FIG. 17A shows an example of a circuit diagram of a semiconductor device of one embodiment of the present invention. The semiconductor device shown in FIG. 17A is different from the semiconductor device shown in FIG. 2A in that a second gate of the second transistor 100 is electrically connected not to the wiring BG but to the wiring CL.

Figure 17B:
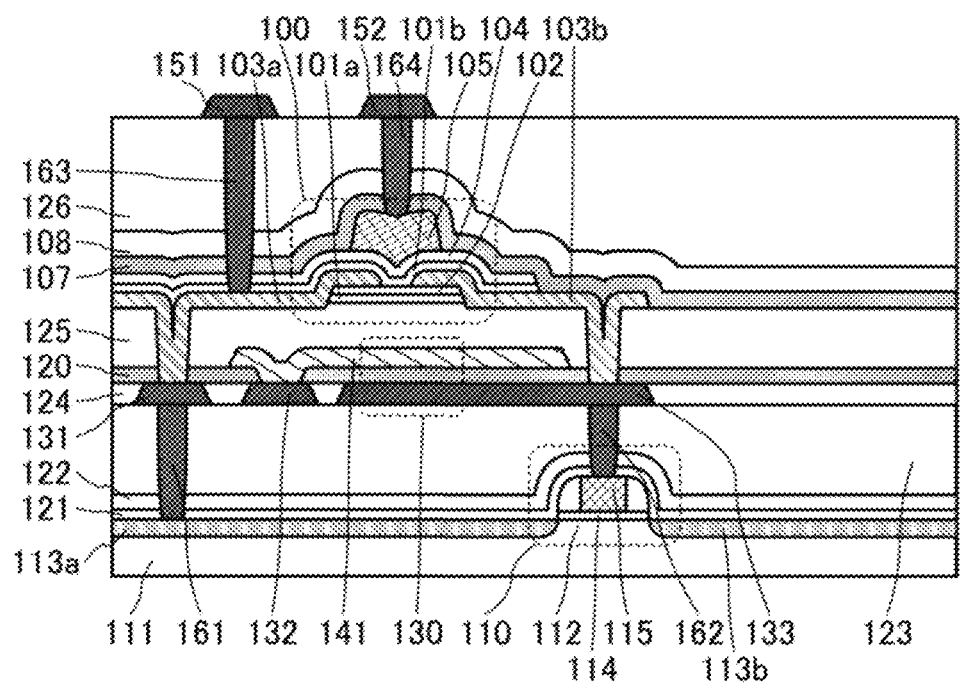

FIG. 17B illustrates an example of a cross-sectional structure of a semiconductor device in which the circuit shown in FIG. 17A can be obtained.

The semiconductor device illustrated in FIG. 17B includes the first transistor 110, the second transistor 100, and the capacitor 130. The second transistor 100 is provided over the first transistor 110. The barrier layer 120 is provided between the first transistor 110 and the second transistor 100.

The semiconductor device illustrated in FIG. 17B is mainly different from the semiconductor device illustrated in FIG. 2B in the structures of the capacitor 130 and the vicinity thereof: specifically, the wirings 142 and 134, and the like are not provided. The wiring 133 and a wiring 141 overlap each other, where the capacitor 130 is formed. The barrier layer 120 also functions as a dielectric layer of the capacitor 130 in a region where the wiring 133 and the wiring 141 described later overlap each other.

In other words, the capacitor 130 is overlapped with the second transistor 100 and is provided below the second transistor 100. Specifically, the wiring 133 that is overlapped with at least a channel formation region of the semiconductor layer 102 in the second transistor 100 and functions as a first electrode of the capacitor 130 and the wiring 141 that functions as a second electrode of the capacitor 130 are provided with the barrier layer 120 interposed therebetween, so that the capacitor 130 is formed. By providing the capacitor 130 and the second transistor 100 to overlap each other in such a manner, the area occupied by the semiconductor device can be effectively reduced.

In FIG. 17B, the wiring 151 corresponds to the wiring BL shown in FIG. 17A. Similarly, the wiring 152 and the wiring 132 correspond to the wiring WL and the wiring CL, respectively. A node including the gate electrode 115 of the first transistor 110, the wiring 133 functioning as a first electrode of the capacitor 130, and the electrode 103b of the second transistor 100 corresponds to the node FN illustrated in FIG. 17A.

The semiconductor device of one embodiment of the present invention includes the first transistor 110 and the second transistor 100 over the first transistor. Since these transistors are stacked, the area occupied by the elements can be reduced. Furthermore, the barrier layer 120 provided between the first transistor 110 and the second transistor 100 can suppress diffusion of impurities such as water and hydrogen from the layers under the barrier layer 120 to the second transistor 100 side. Furthermore, the wiring 133 part of which functions as the first electrode and the wiring 141 part of which functions as a second electrode are provided with the barrier layer 120 therebetween to form the capacitor 130; thus, the capacitor 130 can be easily formed without additional steps for forming the capacitor 130.

Figure 18:
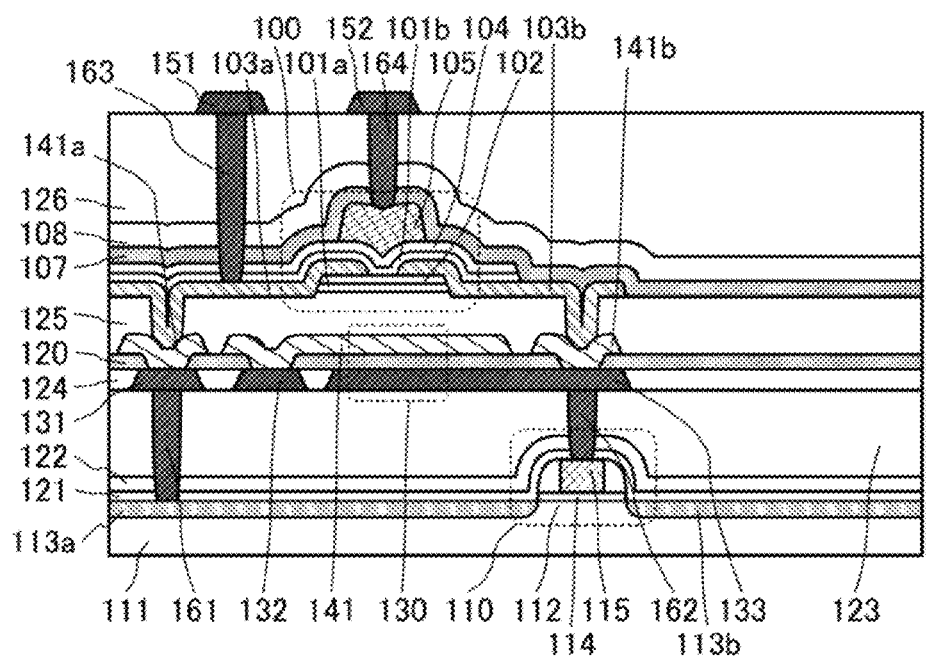
FIG. 18 illustrates a structure example of a semiconductor device of an embodiment.

Note that as illustrated in FIG. 18, the wiring 141a and the wiring 141b that are formed and etched at the same time as the wiring 141 may be provided. The wiring 141a and the wiring 141b are connected to the wiring 131, the wiring 133, and the like.

Figure 19A:
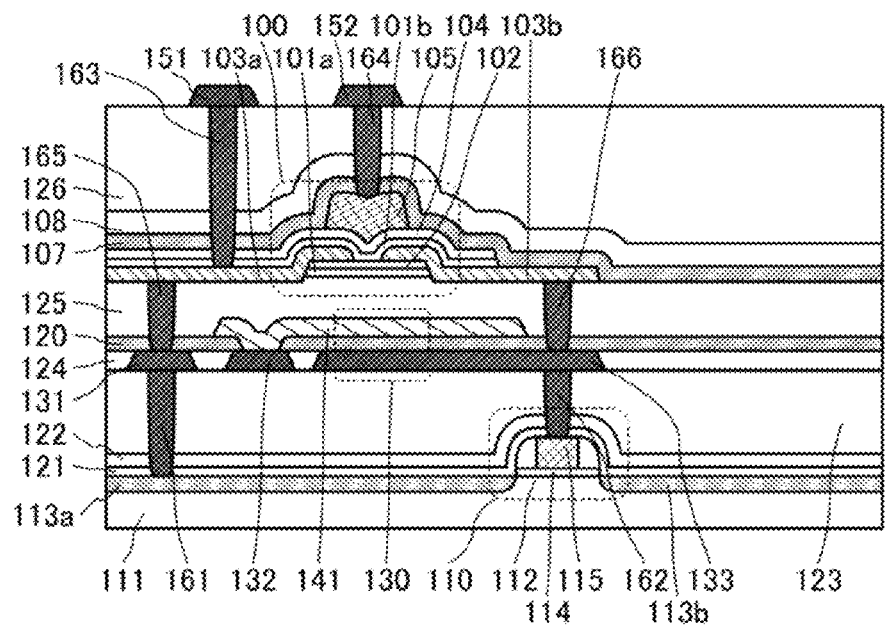
FIGS. 19A and 19B each illustrate a structure example of a semiconductor device of an embodiment.

The structure in which the electrode 103a and the wiring 131 are in contact with each other and the electrode 103b and the wiring 133 are in contact with each other is illustrated in FIG. 17B. However, as illustrated in FIG. 19A, a structure in which they are electrically connected to each other through the plugs 165 and 166 and the like embedded in the insulating layer 125 and the barrier layer 120 may be employed.

Figure 19B:
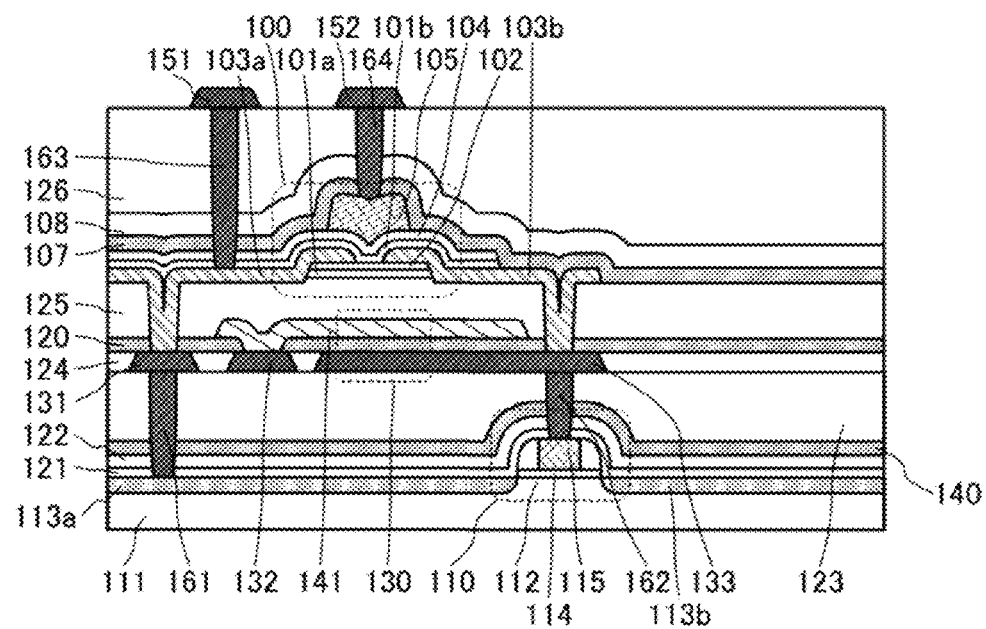

As illustrated in FIG. 19B, an insulating layer 140 that contains a material similar to that contained in the barrier layer 120 may be provided over the insulating layer 122 containing hydrogen. This structure can effectively suppress diffusion of water or hydrogen remaining in the insulating layer 122 containing hydrogen to a portion over the insulating layer 122. In that case, heat treatment for removing water or hydrogen is preferably performed twice or more: before formation of the insulating layer 140; and after formation of the insulating layer 140 and before formation of the barrier layer 120.

Figure 20A:
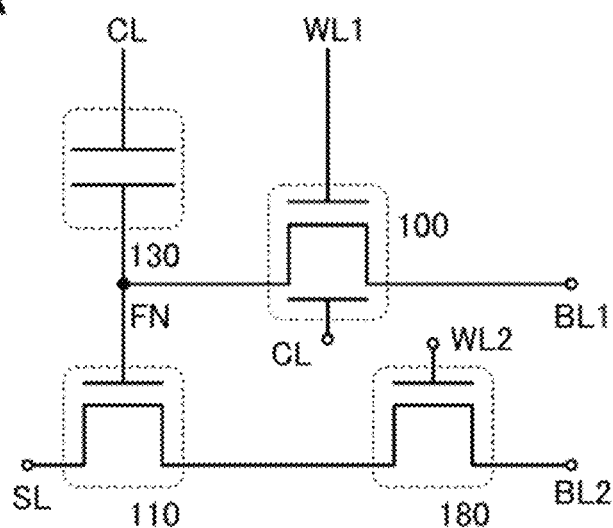
FIG. 20A is a circuit diagram of a semiconductor device of an embodiment and FIG. 20B illustrates a structure example of the semiconductor device.

FIG. 20A is circuit diagram of a semiconductor device with a structure that is partly different from the structure shown in FIG. 17A.

The semiconductor device shown in FIG. 20A is mainly different from the semiconductor device shown in FIG. 17A in that a third transistor 180 is provided, a wiring BL1 and a wiring BL2 are provided instead of the wiring BL, and a wiring WL1 and a wiring WL2 are provided instead of the wiring WL.

A gate of the third transistor 180 is electrically connected to the wiring WL2, one of a source and a drain of the third transistor 180 is electrically connected to the other of a source and a drain of the first transistor 110, and the other of the source and the drain of the third transistor 180 is electrically connected to the wiring BL2. A gate of the second transistor 100 is electrically connected not to the wiring WL1 but to the wiring WL, and the other of a source and a drain of the second transistor 100 is electrically connected not to the wiring BL but to the wiring BL1.

Figure 20B:
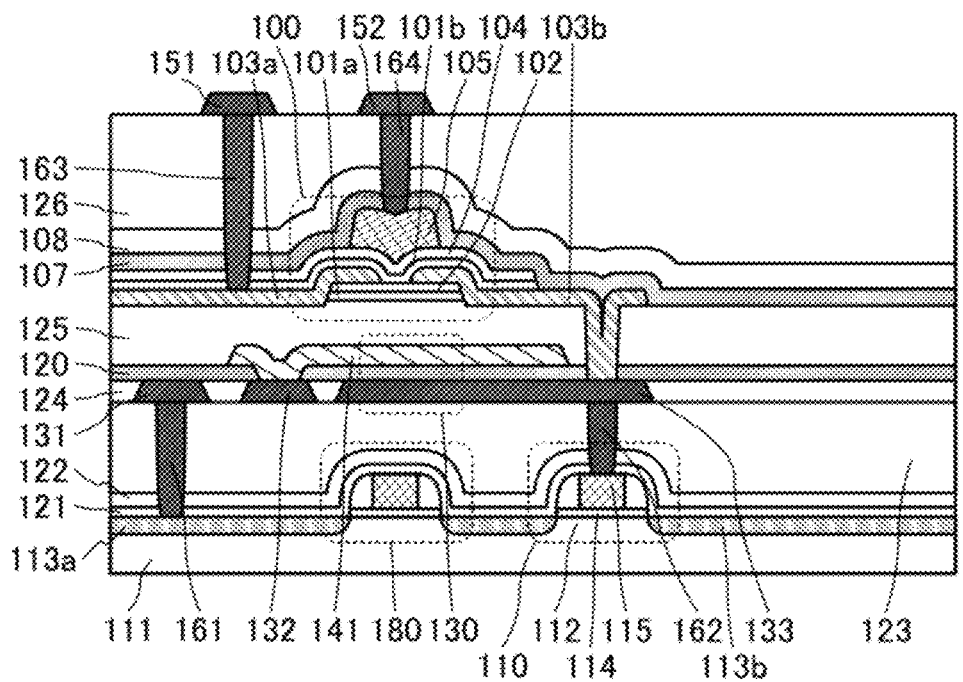

FIG. 20B is a schematic cross-sectional view of a semiconductor device that can be used for the circuit shown in FIG. 20A. In FIG. 20B, the third transistor 180 can have a structure similar to that of the first transistor 110. The structure illustrated in FIG. 20B is different from that illustrated in FIG. 17B in that the electrode 103a of the second transistor 100 is not electrically connected to the wiring 131.

The wiring 152, the wiring 151, and the wiring 131 in the semiconductor device illustrated in FIG. 20B correspond to the wiring WL1, the wiring BL1, and the wiring BL2, respectively. In addition, a gate electrode of the third transistor 180 or a wiring (not illustrated) electrically connected to the gate electrode corresponds to the wiring WL2.

With such a structure, in the case where part of the wiring 141 is used as a second gate of the second transistor 100 and a potential for controlling the threshold voltage of the second transistor 100 is supplied to the wiring 141, influence of the potential supplied to the wiring 141 on the potential of the wiring BL2 for reading data can be prevented.

The above is the description of Structure Example 3.

Manufacturing Method Example 1

An example of a method for manufacturing the semiconductor device described in the above Structure Example 1 is described below with reference to FIGS. 21A to 21D, FIGS. 22A to 22C, and FIGS. 23A and 23B.

First, the semiconductor substrate 111 is prepared. As the semiconductor substrate 111, for example, a single crystal silicon substrate (including a p-type semiconductor substrate or an n-type semiconductor substrate), a compound semiconductor substrate containing silicon carbide or gallium nitride, or the like can be used. An SOI substrate may also be used as the semiconductor substrate 111. The case where single crystal silicon is used for the semiconductor substrate 111 is described below.

Next, an element isolation layer, which is not illustrated, is formed in the semiconductor substrate 111. The element isolation layer may be formed by a local oxidation of silicon (LOCOS) method, a shallow trench isolation (STI) method, or the like.

In the case where a p-channel transistor and an n-channel transistor are formed on the same substrate, an n-well or a p-well may be formed in part of the semiconductor substrate 111. For example, a p-well may be formed by adding an impurity element imparting p-type conductivity, such as boron, to an n-type semiconductor substrate 111, and an n-channel transistor and a p-channel transistor may be formed on the same substrate.

Next, an insulating film to be the gate insulating layer 114 is formed over the semiconductor substrate 111. For example, a surface of the semiconductor substrate 111 is oxidized, whereby a silicon oxide film is formed. Alternatively, the insulating film may be formed as a stack of a silicon oxide film and a silicon oxynitride film formed in such a manner that the silicon oxide film is formed by thermal oxidation, and then a surface of the silicon oxide film is nitrided by nitridation treatment. Further alternatively, the insulating film may be formed using silicon oxide, silicon oxynitride, a metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like.

The insulating film may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

Next, a conductive film to be the gate electrode 115 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Further alternatively, a stacked-layer structure of a film of metal nitride and a film of any of the above metals may be used. As the metal nitride, tungsten nitride, molybdenum nitride, or titanium nitride can be used. When the metal nitride film is provided, adhesiveness of the metal film can be increased; thus, separation can be prevented.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, a resist mask is formed over the conductive film by a photolithography process or the like and an unnecessary portion of the conductive film is removed. After that, the resist mask is removed. In this manner, the gate electrode 115 can be formed.

Here, a method for processing a film is described. In the case of finely processing a film, a variety of fine processing techniques can be used. For example, a method may be used in which a resist mask formed by a photolithography process or the like is subjected to slimming treatment. Alternatively, a method may be used in which a dummy pattern is formed by a photolithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

An organic resin film having a function of improving adhesion between a film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In the case of fine processing, in particular, a material serving as a film having a function of preventing reflection of light for the exposure is preferably used for the organic resin film. Examples of the organic resin film having such a function include a bottom anti-reflection coating (BARC) film. The organic resin film may be removed at the same time as the removal of the resist mask or after the removal of the resist mask.

After the gate electrode 115 is formed, a sidewall covering a side surface of the gate electrode 115 may be formed. The sidewall can be formed in such a manner that an insulating film thicker than the gate electrode 115 is formed and subjected to anisotropic etching so that only a portion of the insulating film on the side surface of the gate electrode 115 remains.

The insulating film to be the gate insulating layer 114 is etched at the same time as the formation of the sidewall, whereby the gate insulating layer 114 is formed under the gate electrode 115 and the sidewall. Alternatively, after the gate electrode 115 is formed, the gate insulating layer 114 may be formed by etching the insulating film using the gate electrode 115 or a resist mask for forming the gate electrode 115 as an etching mask. Alternatively, the insulating film can be used as the gate insulating layer 114 without being processed by etching.

Figure 21A:
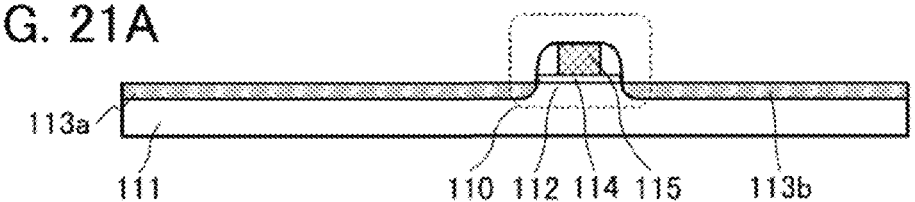
FIGS. 21A to 21D illustrate an example of a method for manufacturing a semiconductor device of an embodiment.

Next, an element imparting n-type conductivity, such as phosphorus, or an element imparting p-type conductivity, such as boron, is added to a region of the semiconductor substrate 111 where the gate electrode 115 (and the sidewall) is not provided. FIG. 21A is a schematic cross-sectional view at this stage.

Next, the insulating layer 121 is formed, and then, first heat treatment is performed to activate the aforementioned element that imparts conductivity.

The insulating layer 121 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating layer 121 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

The first heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the first transistor 110 is formed.

Next, the insulating layer 122 and the insulating layer 123 are formed.

The insulating layer 122 can be formed using any of the materials that can be used for the insulating layer 121, and is preferably formed using silicon nitride containing oxygen and hydrogen (SiNOH) because the amount of hydrogen released by heating can be increased. The insulating layer 123 can be formed using any of the materials that can be used for the insulating layer 121, and is preferably formed using silicon oxide with high step coverage that is formed by reacting tetraethyl orthosilicate (TEOS), silane, or the like with oxygen, nitrous oxide, or the like.

The insulating layer 122 and the insulating layer 123 can be formed by, for example, a sputtering method, a CVD method (including a thermal CVD method, an MOCVD method, a PECVD method, and the like), an MBE method, an ALD method, or a PLD method. In particular, it is preferable that the insulating layers 122 and 123 be formed by a CVD method, further preferably a plasma CVD method because coverage can be further improved. It is preferable to use a thermal CVD method, an MOCVD method, or an ALD method in order to reduce plasma damage.

Next, a top surface of the insulating layer 123 is planarized by a CMP method or the like.

After that, second heat treatment is performed so that dangling bonds in the semiconductor layer 112 are terminated by hydrogen released from the insulating layer 122. By the second heat treatment, water and hydrogen are released from each layer; thus, the water content and the hydrogen content can be reduced.

The second heat treatment can be performed under the conditions given as an example in the above description of the stacked-layer structure.

Next, openings are formed in the insulating layers 121, 122, and 123 so as to reach the low-resistance layers 113a and 113b, the gate electrode 115, and the like. After that, a conductive film is formed so as to fill the openings, and the conductive film is subjected to planarization treatment to expose a top surface of the insulating layer 123, whereby the plug 161, the plug 162, and the like are formed. The conductive film can be formed by a sputtering method, a CVD method (including a thermal CVD method, an MOCVD method, a PECVD method, and the like), an MBE method, an ALD method, a PLD method, or the like.

Next, a conductive film is formed over the insulating layer 123. Then, a resist mask is formed by a method similar to that described above, and unnecessary portions of the conductive film are removed by etching. After that, the resist mask is removed. In this manner, the wirings 131, 132, 133, and 134, and the like can be formed.

Figure 21B:
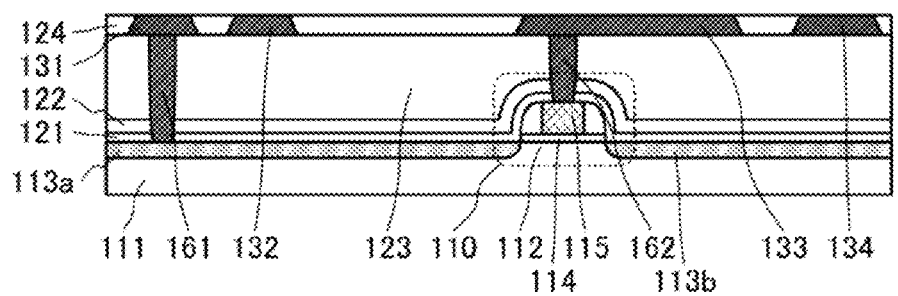

Next, an insulating film is formed to cover the wirings 131, 132, 133, and 134, and the like, and is subjected to planarization treatment to expose top surfaces of the wirings, whereby the insulating layer 124 is formed. FIG. 21B is a schematic cross-sectional view at this stage.

An insulating film to be the insulating layer 124 can be formed using a material and a method similar to those for the insulating layer 121 or the like.

After the insulating layer 124 is formed, third heat treatment is preferably performed. By the third heat treatment, water and hydrogen are released from each layer; thus, the contents of water and hydrogen can be reduced. In the case where the third heat treatment is performed shortly before formation of the barrier layer 120 to be described later to thoroughly remove hydrogen and water from layers under the barrier layer 120 and then the barrier layer 120 is formed, it is possible to suppress diffusion of water and hydrogen to the side under the barrier layer 120 in a later step.

The third heat treatment can be performed under the conditions given as an example in the above description of the stacked-layer structure.

Figure 21C:
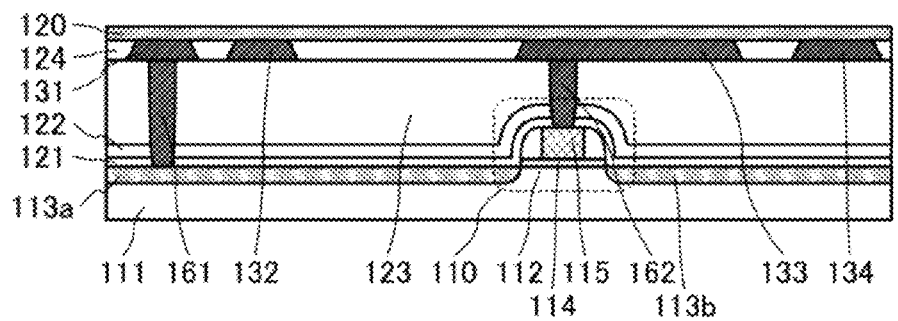

Next, the barrier layer 120 is formed over the insulating layer 124, the wirings, 131, 132, 133, and 134, and the like (FIG. 21C).

The barrier layer 120 can be formed by, for example, a sputtering method, a CVD method (including a thermal CVD method, an MOCVD method, a PECVD method, and the like), an MBE method, an ALD method, or a PLD method. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

After the barrier layer 120 is formed, heat treatment may be performed to remove water and hydrogen contained in the barrier layer 120.

Next, a resist mask is formed over the barrier layer 120 by a method similar to that described above, and unnecessary portions of the barrier layer 120 are removed by etching. After that, the resist mask is removed. In this manner, openings reaching the wirings 132 and 134, and the like are formed.

Next, a conductive film is formed over the barrier layer 120, and then a resist mask is formed by a method similar to that described above, and unnecessary portions of the conductive film are removed by etching. After that, the resist mask is removed.

Figure 21D:
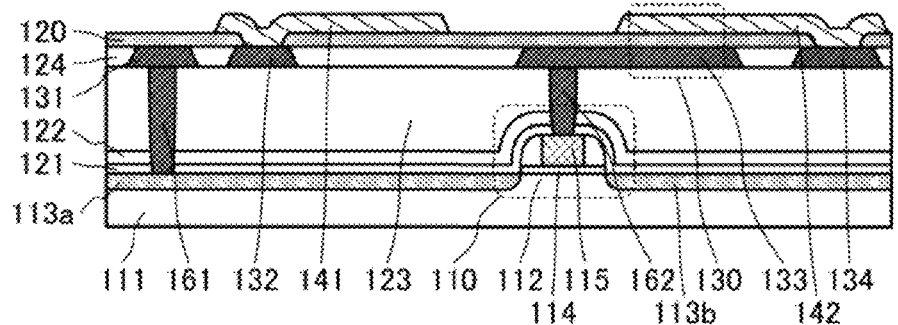

In this manner, the wirings 141 and 142, and the like can be formed (FIG. 21D).

At this stage, the capacitor 130 is formed. The wiring 133 part of which functions as a first electrode, the wiring 142 part of which functions as a second electrode, and the barrier layer 120 interposed therebetween constitute the capacitor 130.

Next, the insulating layer 125 is formed.

The insulating layer 125 can be formed by, for example, a sputtering method, a CVD method (including a thermal CVD method, an MOCVD method, a PECVD method, and the like), an MBE method, an ALD method, or a PLD method. In particular, it is preferable that the insulating layer 125 be formed by a CVD method, further preferably a plasma CVD method because coverage can be further improved. It is preferable to use a thermal CVD method, an MOCVD method, or an ALD method in order to reduce plasma damage.

In order to make the insulating layer 125 contain excess oxygen, the insulating layer 125 may be formed in an oxygen atmosphere, for example. Alternatively, a region containing excess oxygen may be formed by introducing oxygen into the insulating layer 125 that has been formed. Both the methods may be combined.

For example, oxygen (at least including any of oxygen radicals, oxygen atoms, and oxygen ions) is introduced into the insulating layer 125 that has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introduction treatment. As the gas containing oxygen, oxygen, dinitrogen monoxide, nitrogen dioxide, carbon dioxide, carbon monoxide, and the like can be used. A rare gas may be contained in the gas containing oxygen for the oxygen introduction treatment.

After the insulating layer 125 is formed, the insulating layer 125 may be subjected to planarization treatment using a CMP method or the like to improve the planarity of a top surface of the insulating layer 125.

Next, an oxide film to be the first oxide layer 101a and a semiconductor film to be the semiconductor layer 102 are formed in this order. The oxide film and the semiconductor film are preferably formed successively without contact with the air.

After the oxide film and the semiconductor film are formed, fourth heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more, in order to compensate for released oxygen. The heat treatment may be performed directly after formation of the semiconductor film or after the semiconductor film is processed into the island-shaped semiconductor layer 102. Through the heat treatment, oxygen can be supplied to the semiconductor film from the insulating layer 125 and the oxide film; thus, oxygen vacancies in the semiconductor film can be reduced.

Next, a resist mask is formed over the semiconductor film by a method similar to that described above, and unnecessary portions of the semiconductor film and the oxide film are removed by etching. After that, the resist mask is removed. In this manner, a stacked-layer structure of the island-shaped first oxide layer 101a and the island-shaped semiconductor layer 102 can be formed (FIG. 22A).

Figure 22A:
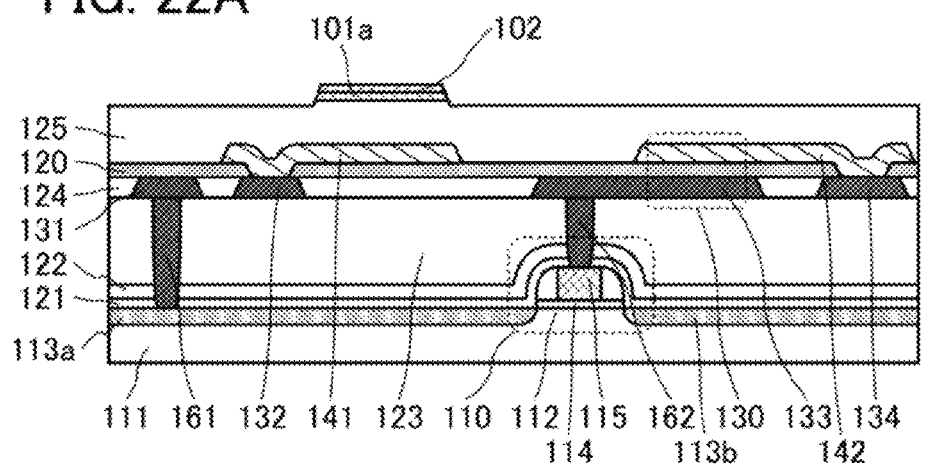
FIGS. 22A to 22C illustrate an example of a method for manufacturing the semiconductor device of the embodiment.

Note that as illustrated in FIG. 22A, the insulating layer 125 is partly etched when the oxide film and the semiconductor film are etched and the thickness of the insulating layer 125 in a region that is not covered with the first oxide layer 101a and the semiconductor layer 102 is reduced in some cases. For this reason, the insulating layer 125 is preferably formed to have a large thickness so as not to be removed by the etching.

Next, openings are formed in the insulating layer 125 and the barrier layer 120 so as to reach the wirings 131 and 133, and the like by a method similar to that described above.

Figure 22B:
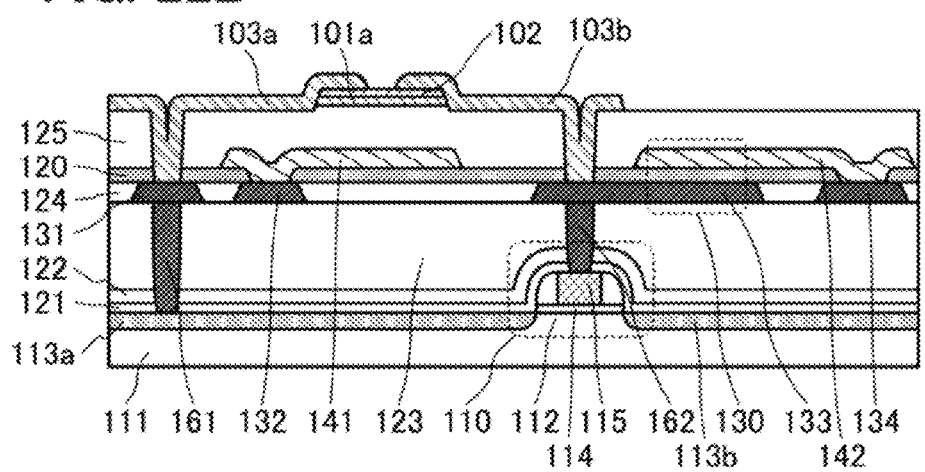

Next, a conductive film is formed, a resist mask is formed over the conductive film by a method similar to that described above, and unnecessary portions of the conductive film are removed by etching. After that, the resist mask is removed. In this manner, the electrodes 103a and 103b can be formed (FIG. 22B).

The conductive film can be formed by, for example, a sputtering method, a CVD method (including a thermal CVD method, an MOCVD method, a PECVD method, and the like), an MBE method, an ALD method, or a PLD method. In particular, it is preferable that the conductive film be formed by a CVD method, further preferably a plasma CVD method because coverage can be further improved. It is preferable to use a thermal CVD method, an MOCVD method, or an ALD method in order to reduce plasma damage.

Here, in some cases, parts of the upper portions of the semiconductor layer 102 and the insulating layer 125 are etched in the etching of the conductive film to reduce the thickness of a portion where the electrode 103a and the electrode 103b do not overlap the semiconductor layer 102. For this reason, the semiconductor film to be the semiconductor layer 102, and the like are preferably formed to have a large thickness in advance in consideration of the etching depth.

Next, an oxide film, an insulating film, and a conductive film are stacked in this order. Then, a resist mask is formed over the conductive film by a method similar to that described above, and an unnecessary portion of the conductive film is removed. After that, the resist mask is removed. In this manner, the gate electrode 105 can be formed. Next, a resist mask is similarly formed over the gate electrode 105 and the insulating film, and unnecessary portions of the insulating film and the oxide film are removed by etching. After that, the resist mask is removed. In this manner, the gate insulating layer 104 and the second oxide layer 101b can be formed at the same time.

In the case where the gate insulating layer 104 and the second oxide layer 101b are formed so that the top-view shapes the gate insulating layer 104 and the second oxide layer 101b become substantially the same as that of the gate electrode 105 as illustrated in FIGS. 5B and 5C and the like, the insulating film and the oxide film are etched using the resist mask for forming the gate electrode 105. Alternatively, the insulating film and the oxide film may be etched using the gate electrode 105 as a hard mask after the gate electrode 105 is formed and the resist mask is removed.

At this stage, the second transistor 100 is formed.

Figure 22C:
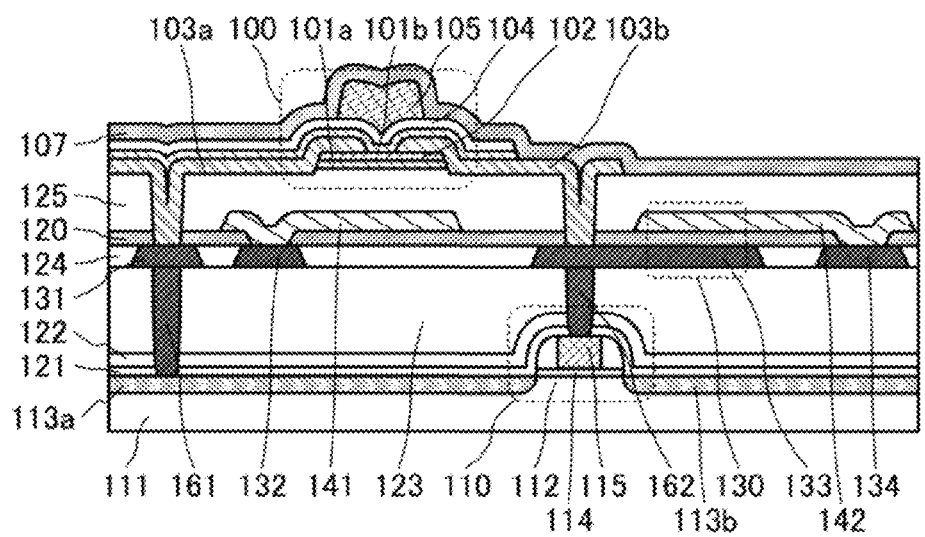

Next, the insulating layer 107 is formed (FIG. 22C). The insulating layer 107 can be formed by, for example, a sputtering method, a CVD method (including a thermal CVD method, an MOCVD method, a PECVD method, and the like), an MBE method, an ALD method, or a PLD method. In particular, it is preferable that the insulating layer be formed by a CVD method, further preferably a plasma CVD method because coverage can be further improved. It is preferable to use a thermal CVD method, an MOCVD method, or an ALD method in order to reduce plasma damage.

After the insulating layer 107 is formed, fifth heat treatment is preferably performed. Through the heat treatment, oxygen can be supplied to the semiconductor layer 102 from the insulating layer 125 and the like; thus, oxygen vacancies in the semiconductor layer 102 can be reduced. At this time, oxygen released from the insulating layer 125 is blocked by the barrier layer 120 and the insulating layer 107 and does not diffuse to a layer under the barrier layer 120 and a layer over the insulating layer 107; thus, oxygen can be effectively confined. Thus, the amount of oxygen supplied to the semiconductor layer 102 can be increased, so that oxygen vacancies in the semiconductor layer 102 can be effectively reduced.

Figure 23A:
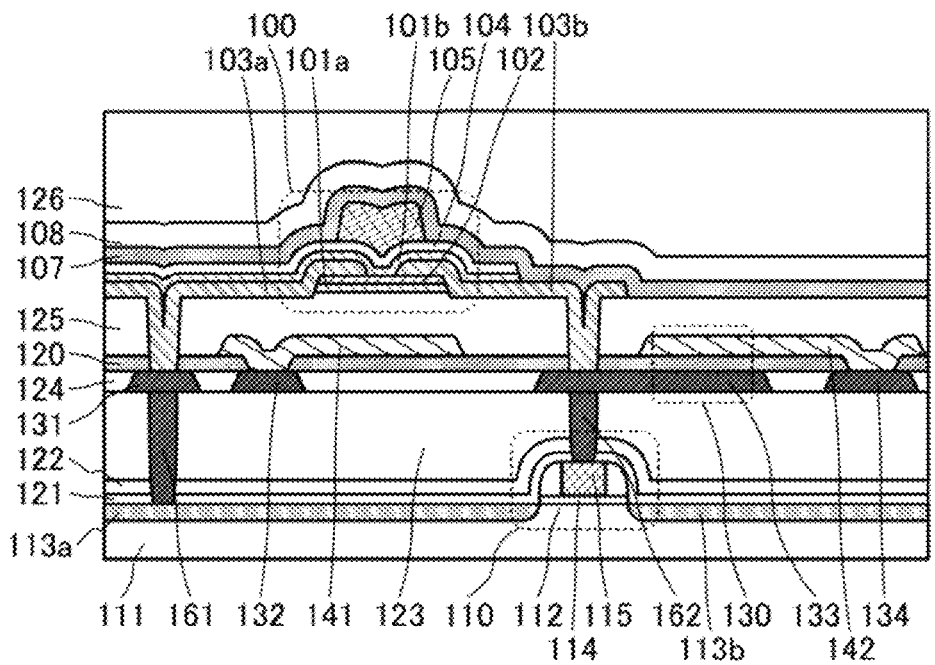
FIGS. 23A and 23B illustrate an example of a method for manufacturing the semiconductor device of the embodiment.

Next, the insulating layer 108 and the insulating layer 126 are formed in this order (FIG. 23A). The insulating layer 108 and the insulating layer 126 can be formed by, for example, a sputtering method, a CVD method (including a thermal CVD method, an MOCVD method, a PECVD method, and the like), an MBE method, an ALD method, or a PLD method. In particular, the insulating layer 107 is preferably formed by a CVD method, further preferably a plasma CVD method, in which case coverage can be favorable. It is preferable to use a thermal CVD method, an MOCVD method, or an ALD method in order to reduce plasma damage. In the case where the insulating layer 126 is formed using an organic insulating material such as an organic resin, a coating method such as a spin coating method may be used. After the insulating layer 126 is formed, a top surface thereof is preferably subjected to planarization treatment.

Next, by a method similar to that described above, the plug 163 reaching the electrode 103a, the plug 164 reaching the gate electrode 105, and the like are formed in the insulating layers 126, 108, and 107.

Figure 23B:
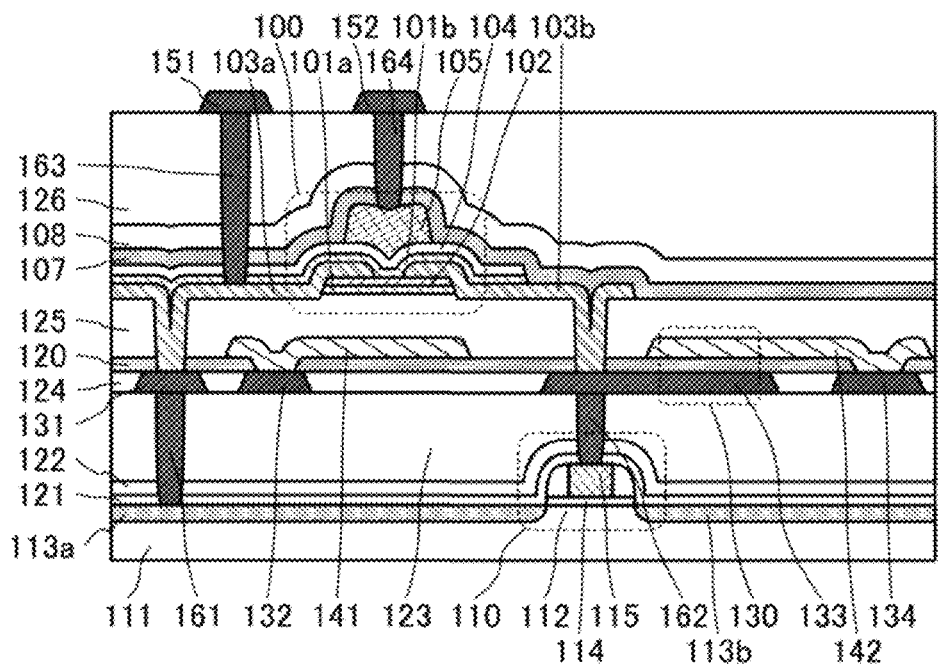

Next, a conductive film is formed over the insulating layer 126. Then, a resist mask is formed by a method similar to that described above, and unnecessary portions of the conductive film are removed by etching. After that, the resist mask is removed. In this manner, the wirings 151 and 152, and the like can be formed (FIG. 23B).

Through the above-described steps, the semiconductor device of one embodiment of the present invention can be manufactured.

Manufacturing Method Example 2

An example of a method for manufacturing the semiconductor device described in the above Structural Example 2 is described below with reference to FIGS. 24A to 24D, FIGS. 25A to 25C, and FIGS. 26A and 26B. Note that portions similar to those described in the above Manufacturing Method Example 1 are not described in some cases.

First, an element isolation layer is formed in the semiconductor substrate 111. After that, the semiconductor layer 112, the gate insulating layer 114, and the gate electrode 115 are formed by methods similar to those described above (FIG. 24A).

Then, the insulating layer 121 is formed, and then first heat treatment for activation is performed, whereby the low-resistance layers 113a and 113b are formed. In this manner, the first transistor 110 is formed.

Next, the insulating layer 122 and the insulating layer 123 are formed, and a top surface of the insulating layer 123 is planarized by a CMP method or the like. Then, second heat treatment is performed.

Figure 24A:
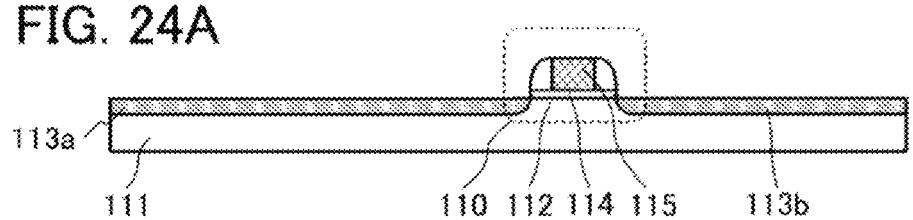
FIGS. 24A to 24D illustrate an example of a method for manufacturing a semiconductor device of an embodiment.
Figure 24B:
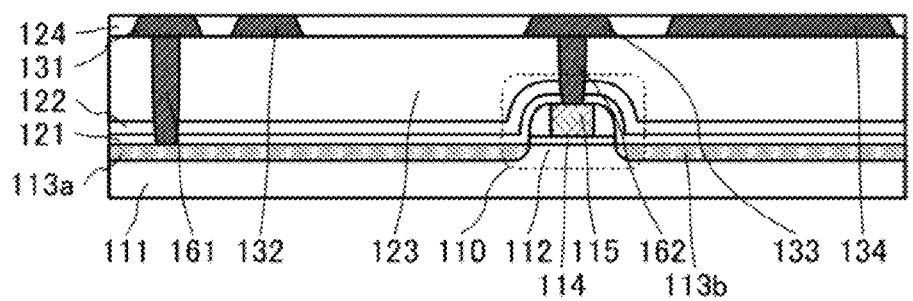

Next, openings are formed in the insulating layers 121, 122, and 123 so as to reach the low-resistance layers 113a and 113b, the gate electrode 115, and the like, and then the plug 161, the plug 162, and the like are formed. Next, the wiring 131, the wiring 132, the wiring 133, the wiring 134, and the like are formed, and then the insulating layer 124 is formed (FIG. 24B). After the insulating layer 124 is formed, third heat treatment is preferably performed.

Figure 24C:
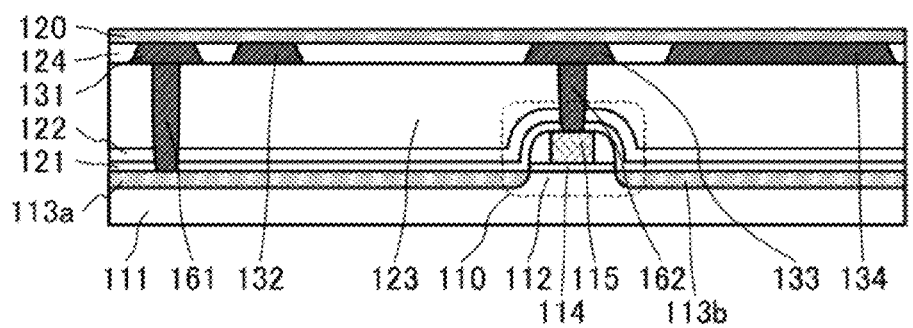

Next, the barrier layer 120 is formed over the insulating layer 124, the wirings 131, 132, 133, and 134, and the like (FIG. 24C). After the barrier layer 120 is formed, heat treatment may be performed to remove water and hydrogen contained in the barrier layer 120.

Figure 24D:
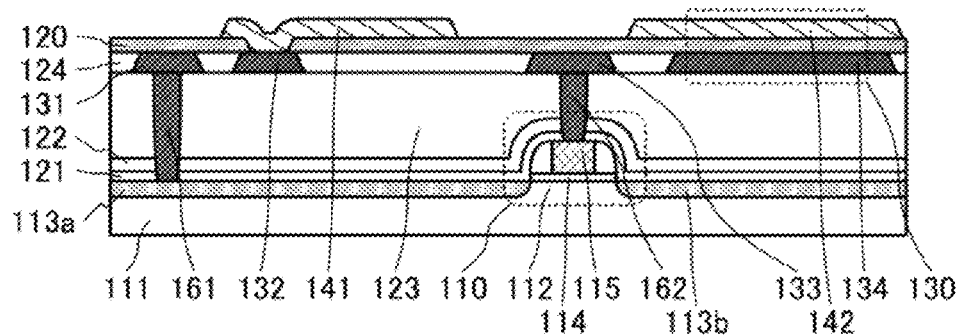

Then, an opening is formed in the barrier layer 120 so as to reach the wiring 132 or the like. After that, the wiring 141, the wiring 142, and the like are formed over the barrier layer 120 (FIG. 24D).

At this stage, the capacitor 130 is formed. The wiring 134 part of which functions as a first electrode, the wiring 142 part of which functions as a second electrode, and the barrier layer 120 interposed therebetween constitute the capacitor 130.

Next, the insulating layer 125 is formed. After the insulating layer 125 is formed, the insulating layer 125 may be subjected to planarization treatment using a CMP method or the like to improve the planarity of a top surface of the insulating layer 125.

Figure 25A:
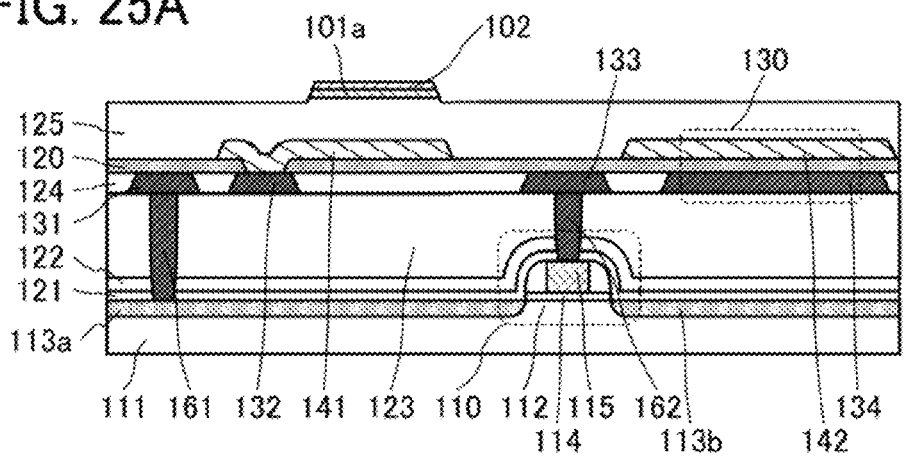
FIGS. 25A to 25C illustrate an example of a method for manufacturing the semiconductor device of the embodiment.

Then, a stacked-layer structure of the island-shaped first oxide layer 101a and the island-shaped semiconductor layer 102 is formed (FIG. 25A). Fourth heat treatment is preferably performed after an oxide film to be the first oxide layer 101a and a semiconductor film to be the semiconductor layer 102 are formed.

Next, openings are formed in the insulating layer 125 and the barrier layer 120 so as to reach the wirings 131, 133, and 142, and the like. After that, the electrode 103a and the electrode 103b are formed (FIG. 25B).

Figure 25B:
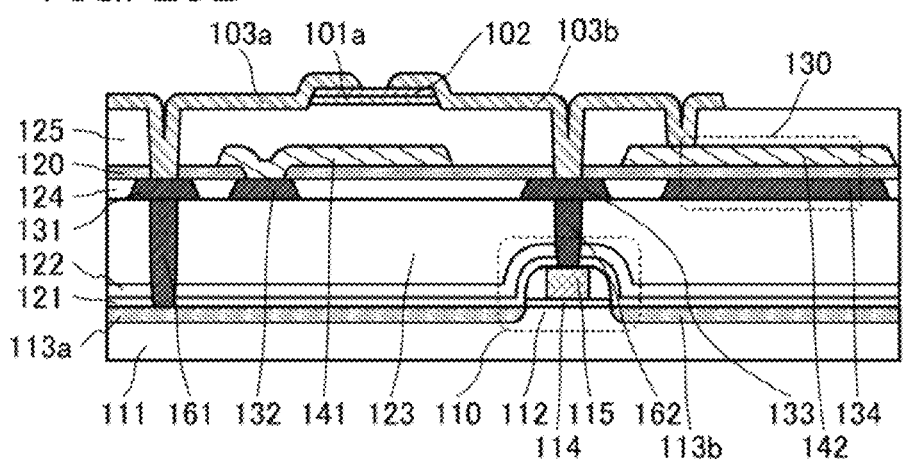

Then, the gate electrode 105, the gate insulating layer 104, and the second oxide layer 101b are formed (FIG. 25B). At this stage, the second transistor 100 is formed.

Figure 25C:
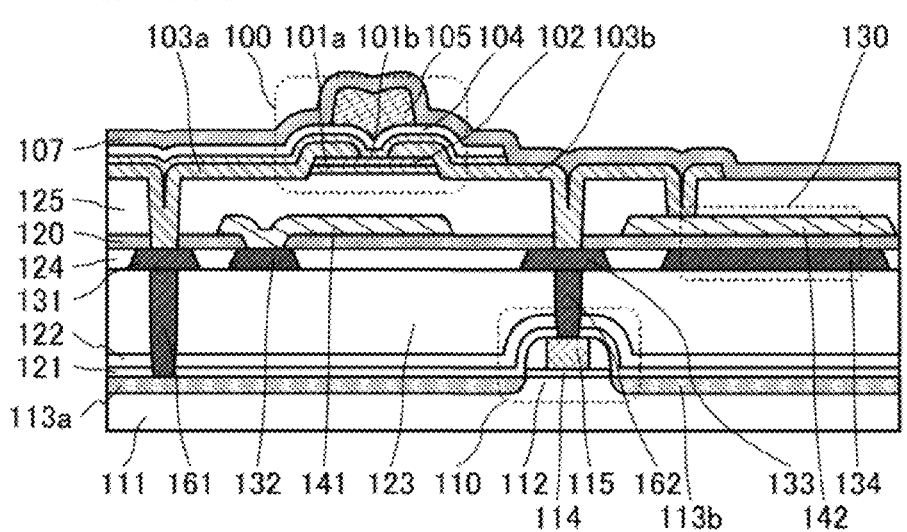

Then, the insulating layer 107 is formed (FIG. 25C). Fifth heat treatment is preferably performed after the insulating layer 107 is formed.

Figure 26A:
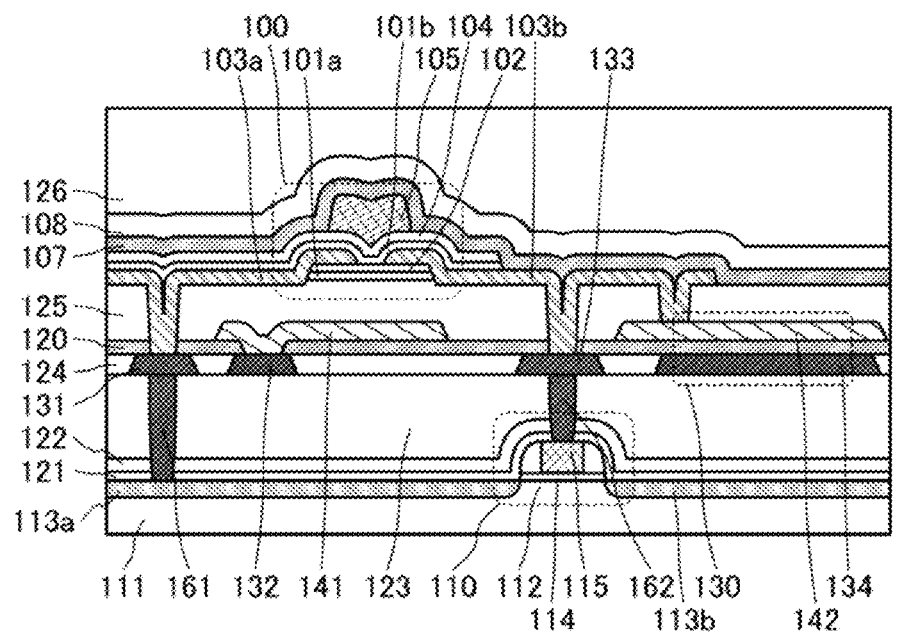
FIGS. 26A and 26B illustrate an example of a method for manufacturing the semiconductor device of the embodiment.

Next, the insulating layer 108 and the insulating layer 126 are formed in this order (FIG. 26A). After the insulating layer 126 is formed, a top surface thereof is preferably subjected to planarization treatment. After that, the plug 163 reaching the electrode 103a, the plug 164 reaching the gate electrode 105, and the like are formed in the insulating layers 126, 108, and 107.

Figure 26B:
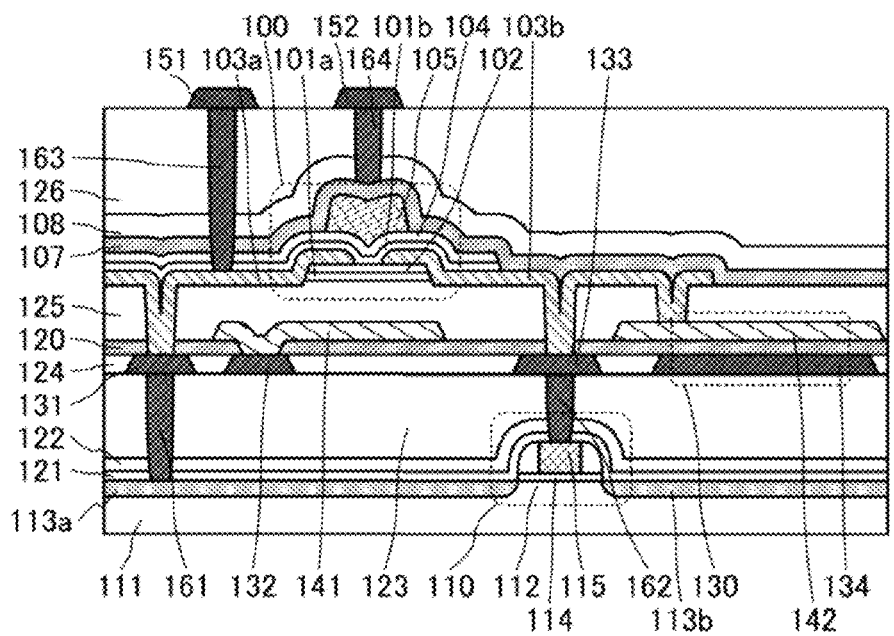

Then, the wiring 151, the wiring 152, and the like are formed (FIG. 26B).

Through the above-described steps, the semiconductor device of one embodiment of the present invention can be manufactured.

Manufacturing Method Example 3

An example of a method for manufacturing the semiconductor device described in the above Structural Example 2 is described below with reference to FIGS. 27A to 27D, FIGS. 28A to 28C, and FIGS. 29A and 29B. Note that portions similar to those described in the above Manufacturing Method Example 1 and Manufacturing Method Example 2 are not described in some cases.

First, an element isolation layer is formed in the semiconductor substrate 111. After that, the semiconductor layer 112, the gate insulating layer 114, and the gate electrode 115 are formed by methods similar to those described above (FIG. 27A).

Next, the insulating layer 121 is formed, and then first heat treatment for activation is performed, whereby the low-resistance layers 113a and 113b are formed. In this manner, the first transistor 110 is formed.

Next, the insulating layer 122 and the insulating layer 123 are formed, and a top surface of the insulating layer 123 is planarized by a CMP method or the like. Then, second heat treatment is performed.

Figure 27A:
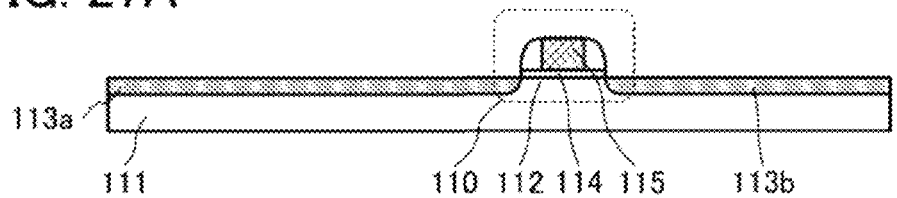
FIGS. 27A to 27D illustrate an example of a method for manufacturing a semiconductor device of an embodiment.
Figure 27B:
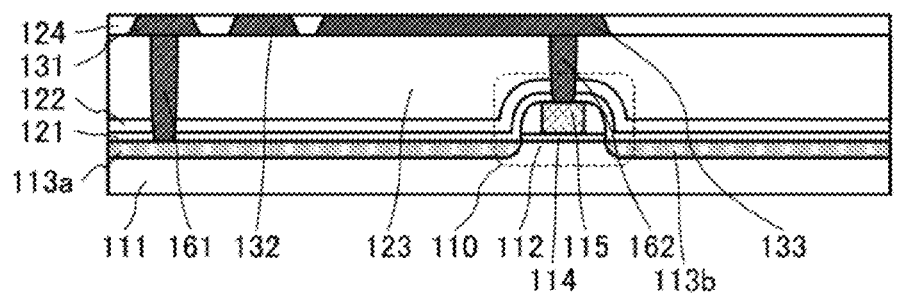

Next, openings are formed in the insulating layers 121, 122, and 123 so as to reach the low-resistance layers 113a and 113b, the gate electrode 115, and the like, and then the plug 161, the plug 162, and the like are formed. Next, the wiring 131, the wiring 132, the wiring 133, and the like are formed, and then the insulating layer 124 is formed (FIG. 27B). After the insulating layer 124 is formed, third heat treatment is preferably performed.

Figure 27C:
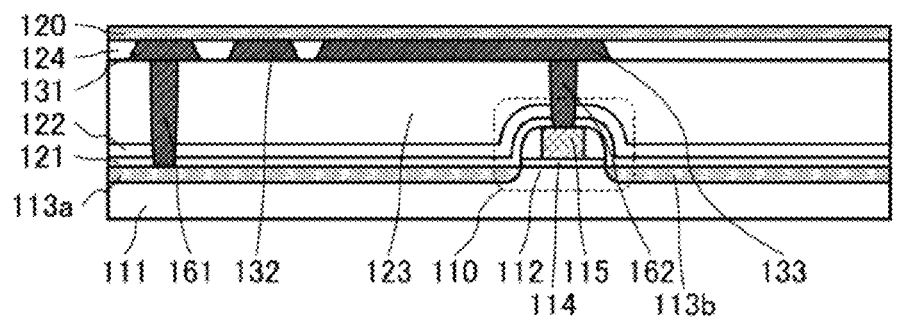

Next, the barrier layer 120 is formed over the insulating layer 124, the wirings 131, 132, and 133, and the like (FIG. 27C). After the barrier layer 120 is formed, heat treatment may be performed to remove water and hydrogen contained in the barrier layer 120.

Figure 27D:
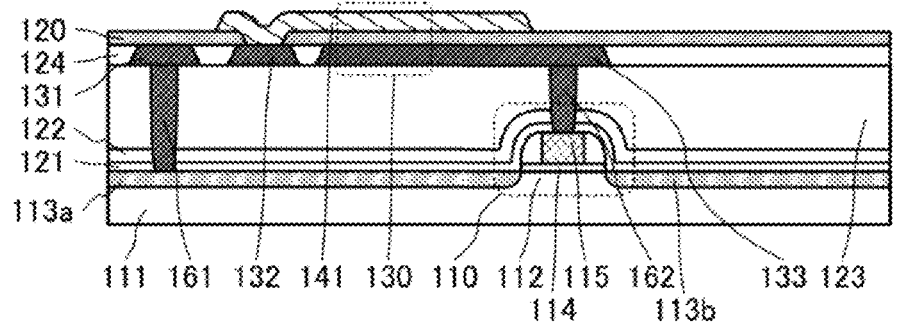

Next, an opening is formed in the barrier layer 120 so as to reach the wiring 132 or the like. After that, the wiring 141 or the like is formed over the barrier layer 120 (FIG. 27D).

At this stage, the capacitor 130 is formed. The wiring 133 part of which functions as a first electrode, the wiring 141 part of which functions as a second electrode, and the barrier layer 120 interposed therebetween constitute the capacitor 130.

Next, the insulating layer 125 is formed. After the insulating layer 125 is formed, the insulating layer 125 may be subjected to planarization treatment using a CMP method or the like to improve the planarity of a top surface of the insulating layer 125.

Figure 28A:
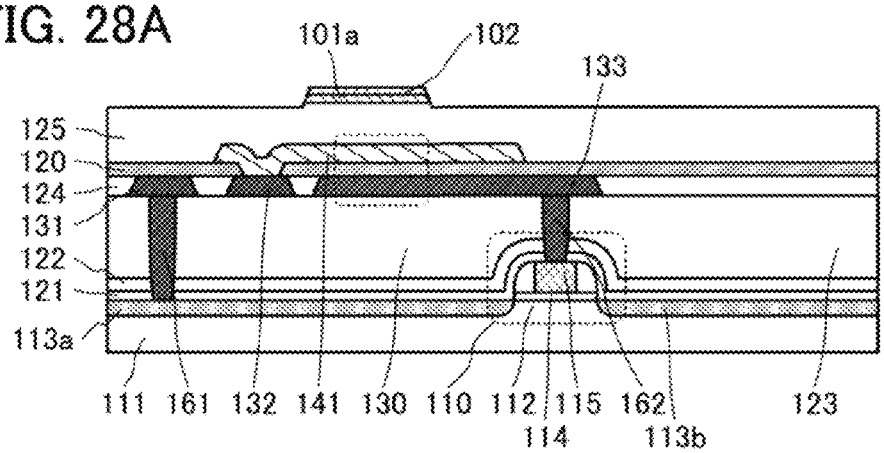
FIGS. 28A to 28C illustrate an example of a method for manufacturing the semiconductor device of the embodiment.

Next, a stacked-layer structure of the island-shaped first oxide layer 101a and the island-shaped semiconductor layer 102 is formed (FIG. 28A). Fourth heat treatment is preferably performed after an oxide film to be the oxide layer 101a and a semiconductor film to be the semiconductor layer 102 are formed.

Figure 28B:
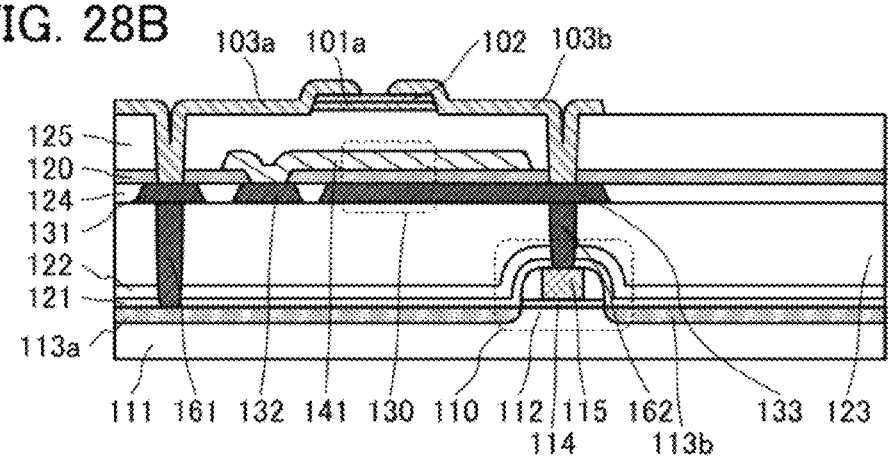

Next, openings are formed in the insulating layer 125 and the barrier layer 120 so as to reach the wirings 131 and 133, and the like. After that, the electrode 103a and the electrode 103b are formed (FIG. 28B).

Next, the gate electrode 105, the gate insulating layer 104, and the second oxide layer 101b are formed. At this stage, the second transistor 100 is formed.

Figure 28C:
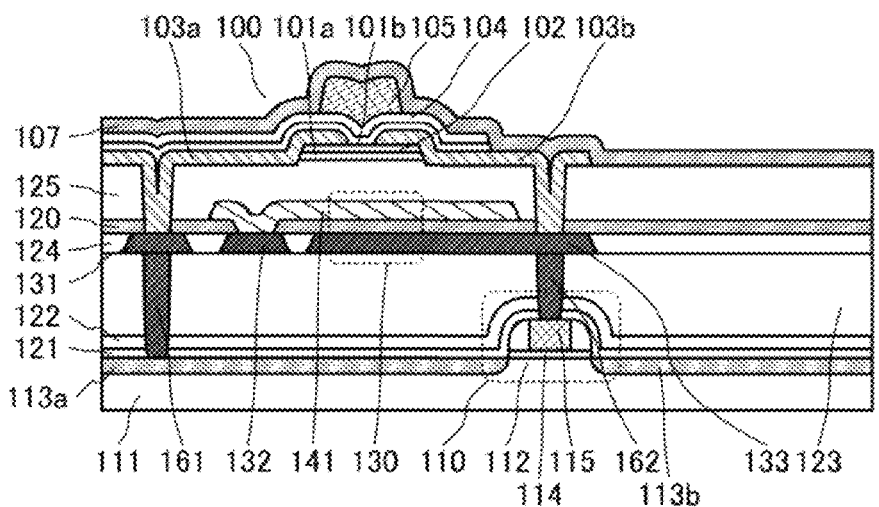

Next, the insulating layer 107 is formed (FIG. 28C). Fifth heat treatment is preferably performed after the insulating layer 107 is formed.

Figure 29A:
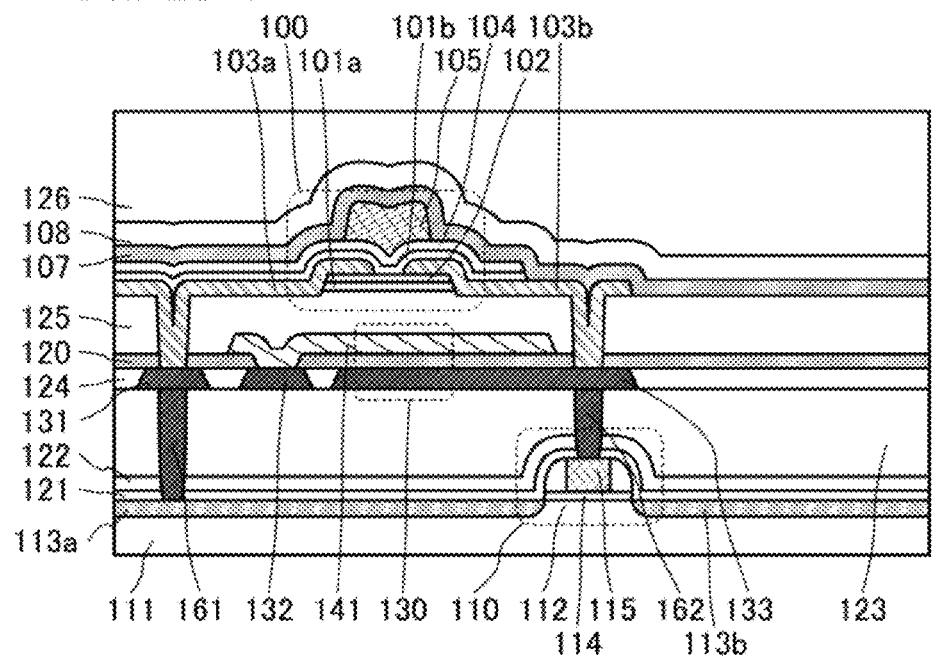
FIGS. 29A and 29B illustrate an example of a method for manufacturing the semiconductor device of the embodiment.

Next, the insulating layer 108 and the insulating layer 126 are formed in this order (FIG. 29A). After the insulating layer 126 is formed, a top surface thereof is preferably subjected to planarization treatment. After that, the plug 163 reaching the electrode 103a, the plug 164 reaching the gate electrode 105, and the like are formed in the insulating layers 126, 108, and 107.

Figure 29B:
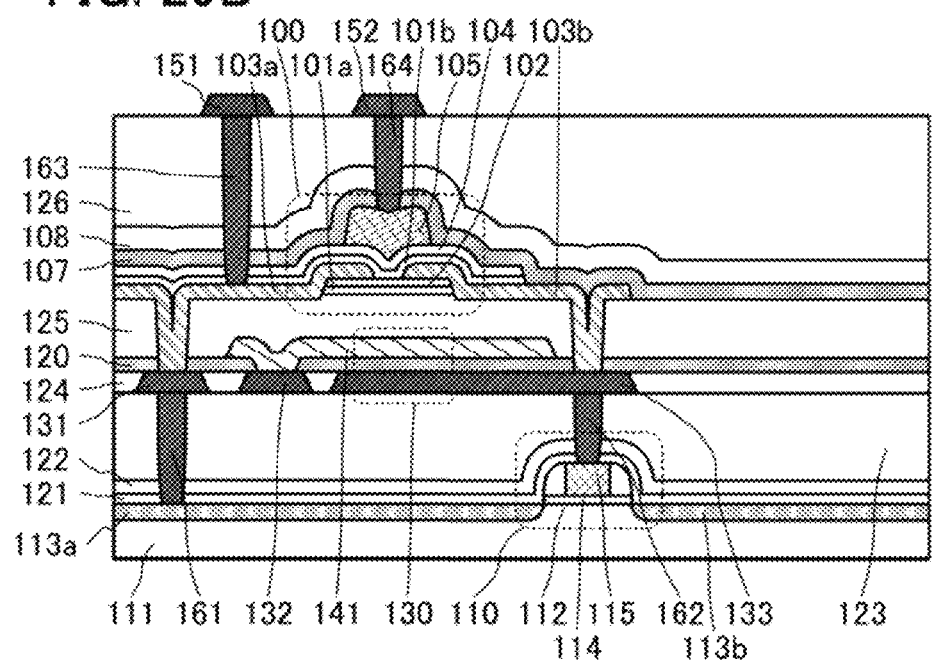

Next, the wiring 151, the wiring 152, and the like are formed (FIG. 29B).

Through the above-described steps, the semiconductor device of one embodiment of the present invention can be manufactured.

At least part of this embodiment can be implemented in combination with any of the other embodiments described in this specification as appropriate.

Embodiment 2

An oxide semiconductor that can be favorably used for a semiconductor layer of a semiconductor device of one embodiment of the present invention is described in this embodiment.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An applicable oxide semiconductor preferably contains at least indium (In) or zinc (Zn). In particular, In and Zn are preferably contained. In addition, as a stabilizer for reducing variation in electrical characteristics of the transistor including the oxide semiconductors, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, $In_2SnO_5(ZnO)_n$ (n>0, n is an integer) may be used.

For example, In—Ga—Zn-based oxide with an atomic ratio of In:Ga:Zn=1:1:1, 1:3:2, 1:3:4, 1:3:6, 3:1:2, or 2:1:3, or an oxide whose composition is in the neighborhood of the above compositions may be used.

If the oxide semiconductor film contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. It is thus preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. For that reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled the oxygen adding treatment, so that the oxide semiconductor film can be an i-type (intrinsic) oxide semiconductor film or an oxide semiconductor film extremely close to an i-type oxide semiconductor (a substantially i-type oxide semiconductor). Note that "substantially intrinsic" means that the oxide semiconductor film includes extremely few (close to zero) carriers derived from a donor, and the carrier concentration thereof is lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an i-type or substantially i-type oxide semiconductor film can have extremely favorable off-state current characteristics. For example, the drain current at the time when the transistor including an oxide semiconductor film is in an off-state at room temperature (25° C.) can be less than or equal to $1\times10^{-18}$ A, preferably less than or equal to $1\times10^{-21}$ A, and further preferably less than or equal to $1\times10^{-24}$ A; or at 85° C., less than or equal to $1\times10^{-15}$ A, preferably less than or equal to $1\times10^{-18}$ A, further preferably less than or equal to $1\times10^{-21}$ A. An off state of a transistor refers to a state where gate voltage is lower than the threshold voltage in an n-channel transistor. Specifically, the transistor is in an off state when the gate voltage is lower than the threshold voltage by 1V or more, 2V or more, or 3V or more.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

When a combined analysis image (also referred to as a high-resolution TEM image) of a bright-field image and a diffraction pattern of the CAAC-OS film is observed by a transmission electron microscope (TEM), a plurality of crystal parts is seen. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In the high-resolution plan-view TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

FIG. 31A is a high-resolution cross-sectional TEM image of a CAAC-OS film. FIG. 31B is a high-resolution cross-sectional TEM image obtained by enlarging the image of FIG. 31A. In FIG. 31B, atomic arrangement is highlighted for easy understanding.

FIG. 31C represents Fourier transform images of regions each surrounded by a circle (the diameter is about 4 nm) between A and O and between O and A' in FIG. 31B. C-axis alignment can be observed in each region in FIG. 31C. The c-axis direction between A and O is different from that between O and A', which indicates that a grain in the region between A and O is different from that between O and A'. In addition, the angle of the c-axis between A and O continuously and gradually changes, for example, from 14.3°, 16.6° to 26.4°. Similarly, the angle of the c-axis between O and A' continuously changes from −18.3°, −17.6°, to −15.9°.

Figure 32A:
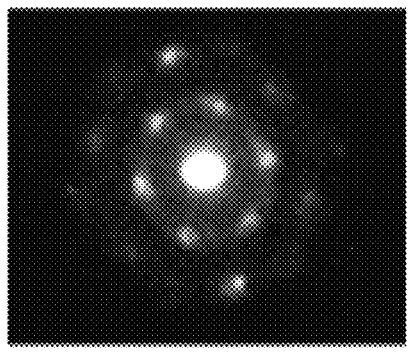
FIGS. 32A and 32B show nanobeam electron diffraction patterns of oxide semiconductor films and FIGS. 32C and 32D illustrate an example of a transmission electron diffraction measurement apparatus.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 32A).

The high-resolution cross-sectional TEM image and the high-resolution plan TEM image show that the crystal parts in the CAAC-OS film have alignment.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 nm$^2$, larger than or equal to 5 µm$^2$, or larger than or equal to 1000 µm$^2$ is observed in some cases in the high-resolution planar TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

In addition, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases.

Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (or molecular radius), and thus disturbs the atomic arrangement of the oxide semiconductor film and decreases crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has small changes in electrical characteristics and high reliability. Electric charge captured by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

In a transistor using the CAAC-OS film, changes in electrical characteristics due to irradiation with visible light or ultraviolet light are small.

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a boundary between crystals may be observed.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an InGaZnO$_4$ crystal is analyzed by an out-of-plane method, peaks of 2θ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger changes in electrical characteristics and lower reliability than a transistor including a CAAC-OS film in some cases.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

Figure 32B:
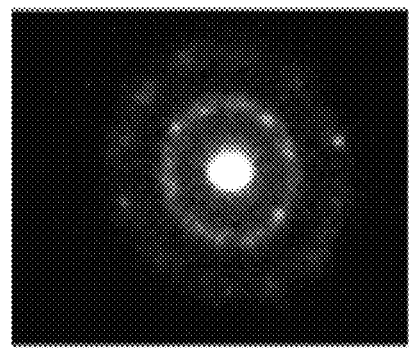

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. In a nanobeam electron diffraction pattern of the nc-OS film, regions with high luminance in a circular (ring) pattern are shown in some cases. Furthermore, in a nanobeam electron diffraction pattern of the nc-OS film, a plurality of circumferentially distributed spots are observed in some cases (see FIG. 32B).

The nc-OS film is an oxide semiconductor film that has high regularity as compared to an amorphous oxide semiconductor film. Thus, the nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger changes in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Thus, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Thus, the amorphous oxide semiconductor film has a much higher carrier density than the nc-OS film in some cases. Therefore, a transistor including the amorphous oxide semiconductor film tends to be normally on. Therefore, in some cases, such an amorphous oxide semiconductor layer can be applied to a transistor that needs to be normally on. Since the amorphous oxide semiconductor film has a high density of defect states, carrier traps might be increased. Consequently, a transistor including the amorphous oxide semiconductor film has larger changes in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased. Thus, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small changes in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Thus, the distance between the adjacent layers is equivalent to the lattice spacing on the (009) plane (also referred to as d value). The value is calculated to be 0.29 nm from crystal structural analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image. The maximum length of the region in which the lattice fringes are observed is regarded as the size of the crystal parts of the amorphous-like OS film and the nc-OS film. Note that the crystal part whose size is 0.8 nm or larger is selectively evaluated.

Note that an oxide semiconductor film may be a stacked-layer film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 32C:
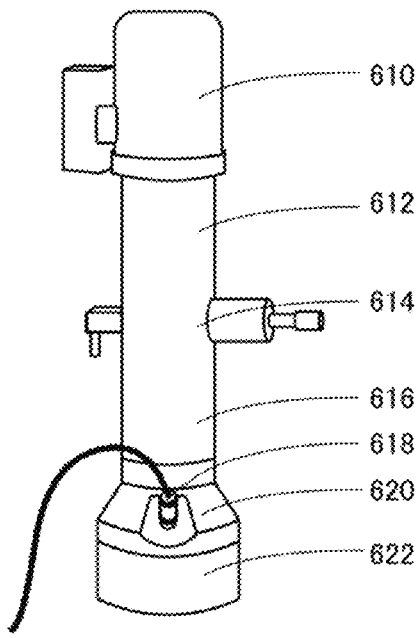

FIG. 32C illustrates a transmission electron diffraction measurement apparatus that includes an electron gun chamber 610, an optical system 612 below the electron gun chamber 610, a sample chamber 614 below the optical system 612, an optical system 616 below the sample chamber 614, an observation chamber 620 below the optical system 616, a camera 618 installed in the observation chamber 620, and a film chamber 622 below the observation chamber 620. The camera 618 is provided to face the inside of the observation chamber 620. Note that the film chamber 622 is not necessarily provided.

Figure 32D:
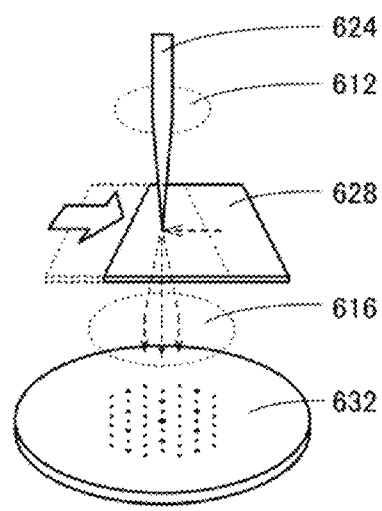

FIG. 32D illustrates an internal structure of the transmission electron diffraction measurement apparatus illustrated in FIG. 32C. In the transmission electron diffraction measurement apparatus, a substance 628 provided in the sample chamber 614 is irradiated with electrons ejected from an electron gun provided in the electron gun chamber 610 through the optical system 612. The electrons that have passed through the substance 628 enter a fluorescent plate 632 provided in the observation chamber 620 through the optical system 616. On the fluorescent plate 632, a pattern corresponding to the intensity of entered electron appears, which allows measurement of a transmission electron diffraction pattern.

The camera 618 is set toward the fluorescent plate 632 so that a pattern on the fluorescent plate 632 can be taken. An angle formed by a straight line that passes through the center of a lens of the camera 618 and the center of the fluorescent plate 632 and an upper surface of the fluorescent plate 632 is, for example, 15° or more and 80° or less, 30° or more and 75° or less, or 45° or more and 70° or less. As the angle is reduced, distortion of the transmission electron diffraction pattern taken by the camera 618 becomes larger. Note that if the angle is obtained in advance, the distortion of an obtained transmission electron diffraction pattern can be corrected. Note that the film chamber 622 may be provided with the camera 618. For example, the camera 618 may be set in the film chamber 622 so as to be opposite to the incident direction of electrons 624. In this case, a transmission electron diffraction pattern with less distortion can be taken from the rear surface of the fluorescent plate 632.

A holder for fixing the substance 628 that is a sample is provided in the sample chamber 614. The holder transmits electrons passing through the substance 628. The holder may have, for example, a function of moving the substance 628 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 628.

A method for measuring a transmission electron diffraction pattern of a substance by the transmission electron diffraction measurement apparatus described above will be described.

For example, changes in the structure of a substance can be observed by changing (scanning) the irradiation position of the electrons 624 that are a nanobeam in the substance, as illustrated in FIG. 32D. At this time, when the substance 628 is a CAAC-OS film, a diffraction pattern shown in FIG. 32A can be observed. When the substance 628 is an nc-OS film, a diffraction pattern shown in FIG. 32B can be observed.

Even when the substance 628 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

FIG. 33A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. The above results suggest that the region having a structure similar to that of an nc-OS film is rearranged by the heat treatment owing to the influence of the structure of the adjacent region, whereby the region becomes CAAC.

FIGS. 33B and 33C are high-resolution planar TEM images of the CAAC-OS film obtained just after the deposition and the CAAC-OS film subjected to the heat treatment at 450° C., respectively. Comparison between FIGS. 33B and 33C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

The CAAC-OS film is formed, for example, by the following method.

For example, the CAAC-OS film is formed by a sputtering method with a polycrystalline oxide semiconductor sputtering target.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like or pellet-like sputtered particles reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS layer during the deposition, the crystal state can be prevented from being broken by the impurities. For example, the concentration of impurities (e.g., hydrogen, water, carbon dioxide, or nitrogen) that exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film for a shorter time.

The first oxide semiconductor film with a thickness greater than or equal to 1 nm and less than 10 nm can be easily crystallized by heat treatment as compared to the case where the first oxide semiconductor film has a thickness greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film for a shorter time.

In the above-described manner, a CAAC-OS film with a total thickness of greater than or equal to 10 nm can be formed.

At least part of this embodiment can be implemented in combination with any of the other embodiments described in this specification as appropriate.

Embodiment 3

In this embodiment, an example of a circuit including the transistor of one embodiment of the present invention is described with reference to drawings

[Circuit Configuration Example]

When a connection between transistors, wirings, or electrodes is changed from that described in Embodiment 1, a variety of circuits can be formed. Examples of circuit configurations that can be achieved by using a semiconductor device of one embodiment of the present invention are shown below.

[CMOS Circuit]

Figure 34A:
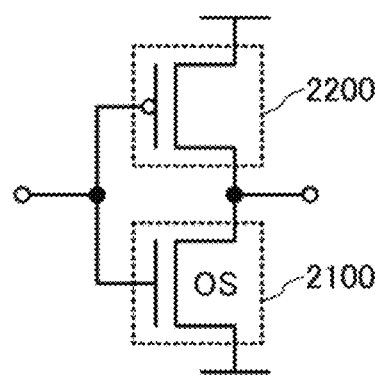
FIGS. 34A to 34D are circuit diagrams of an embodiment.

A circuit diagram in FIG. 34A shows a configuration of a so-called CMOS circuit in which a p-channel transistor 2200 and an n-channel transistor 2100 are connected to each other in series and in which gates of them are connected to each other. Note that transistors in which a second semiconductor material is used are denoted by "OS" in drawings

[Analog Switch]

Figure 34B:
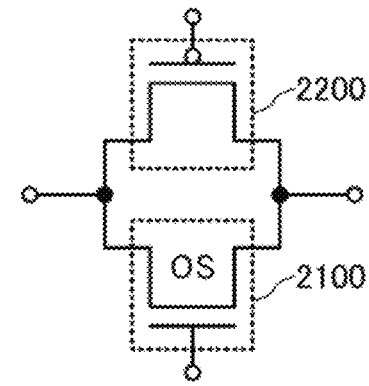

A circuit diagram in FIG. 34B shows a configuration in which sources of the transistors 2100 and 2200 are connected to each other and drains of the transistors 2100 and 2200 are connected to each other. With such a configuration, the transistors can function as a so-called analog switch.

[Example of Memory Device]

Figure 34C:
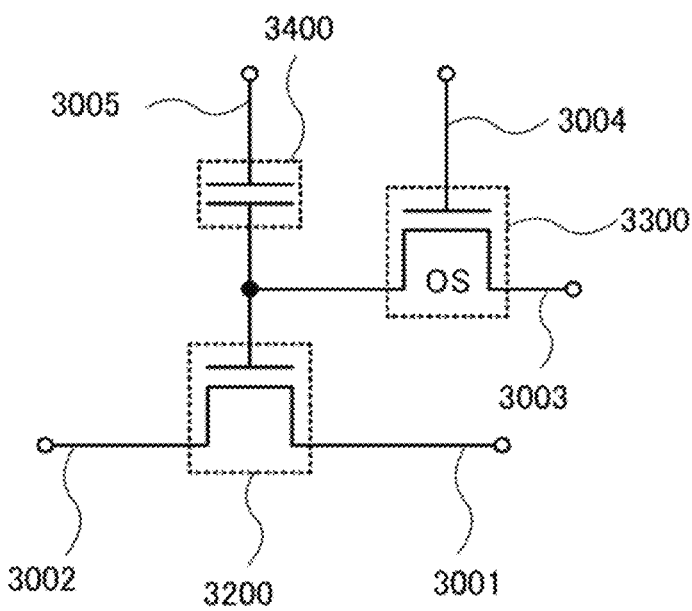

An example of a semiconductor device (memory device) that includes the transistor of one embodiment of the present invention, can retain stored data even when not powered, and has an unlimited number of write cycles is shown in FIG. 34C.

The semiconductor device illustrated in FIG. 34C includes a transistor 3200 using a first semiconductor material, a transistor 3300 using a second semiconductor material, and a capacitor 3400. Note that any of the transistors described in the above embodiments can be used as the transistor 3300.

The transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 34C, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to the gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 34C has a feature that the potential of the gate electrode of the transistor 3200 can be retained, and thus enables writing, retaining, and reading of data as follows Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is retained (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 that is needed to turn on the transistor 3200. Thus, the potential of the fifth wiring 3005 is set to a potential $V_0$ that is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, only data of desired memory cells need to be read. The fifth wiring 3005 in the case where data is not read may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

Figure 34D:
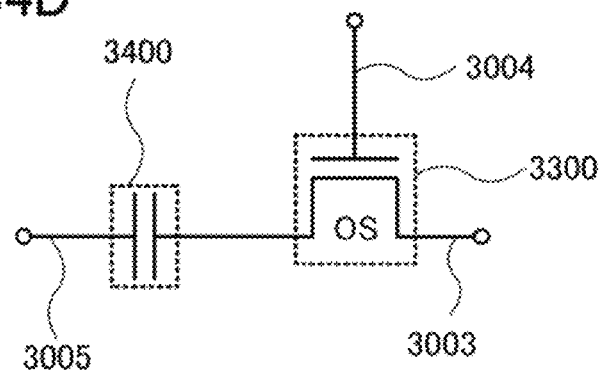

The semiconductor device illustrated in FIG. 34D is mainly different from the semiconductor device illustrated in FIG. 34C in that the transistor 3200 is not provided. Also in this case, writing and retaining operation of data can be performed in a manner similar to that of the semiconductor device illustrated in FIG. 34C.

Next, reading of data is described. When the transistor 3300 is turned on, the third wiring 3003 in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400.

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor having a channel formation region formed including an oxide semiconductor and having an extremely small off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

At least part of this embodiment can be implemented in combination with any of the other embodiments described in this specification as appropriate.

Embodiment 4

In this embodiment, an RFID tag that includes the transistor described in the above embodiments or the memory device described in the above embodiment is described with reference to FIG. 35.

The RFID tag of this embodiment includes a memory circuit, stores necessary data in the memory circuit, and transmits and receives data to/from the outside by using contactless means, for example, wireless communication. With these features, the RFID tag can be used for an individual authentication system in which an object or the like is recognized by reading the individual information, for example. Note that the RFID tag is required to have extremely high reliability in order to be used for this purpose.

A configuration of the RFID tag is described with reference to FIG. 35. FIG. 35 is a block diagram illustrating a configuration example of an RFID tag.

Figure 35:
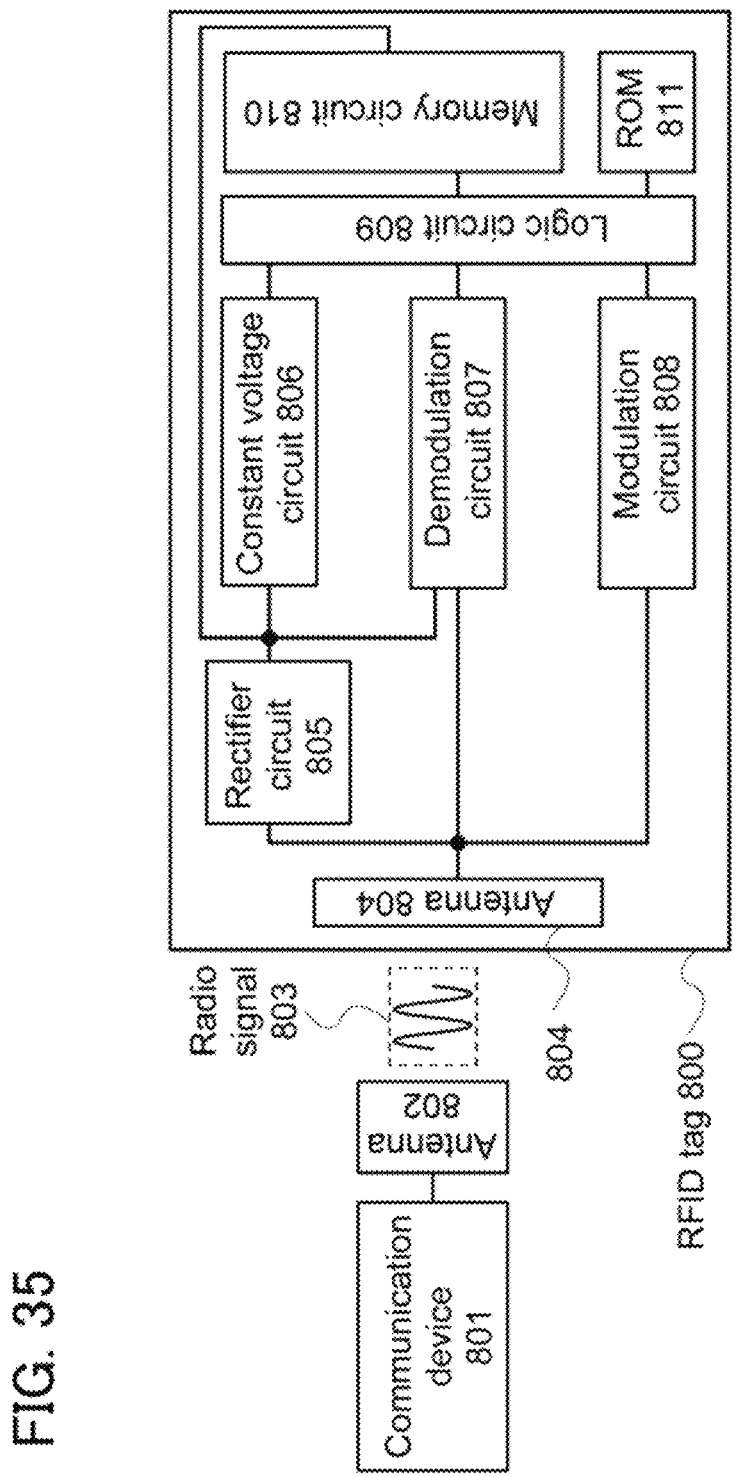
FIG. 35 illustrates a structure example of an RFID tag of an embodiment.

As shown in FIG. 35, an RFID tag 800 includes an antenna 804 that receives a radio signal 803 that is transmitted from an antenna 802 connected to a communication device 801 (also referred to as an interrogator, a reader/writer, or the like). The RFID tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 800 described in this embodiment.

Next, a configuration of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RFID tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RFID tags, it is possible to put identification numbers only to good products to be shipped. Thus, the identification numbers of the shipped products are in series and customer management corresponding to the shipped products is easily performed.

At least part of this embodiment can be implemented in combination with any of the other embodiments described in this specification as appropriate.

Embodiment 5

In this embodiment, a CPU in which at least the transistor described in any of the above embodiments can be used and the memory device described in the above embodiment is included is described.

Figure 36:
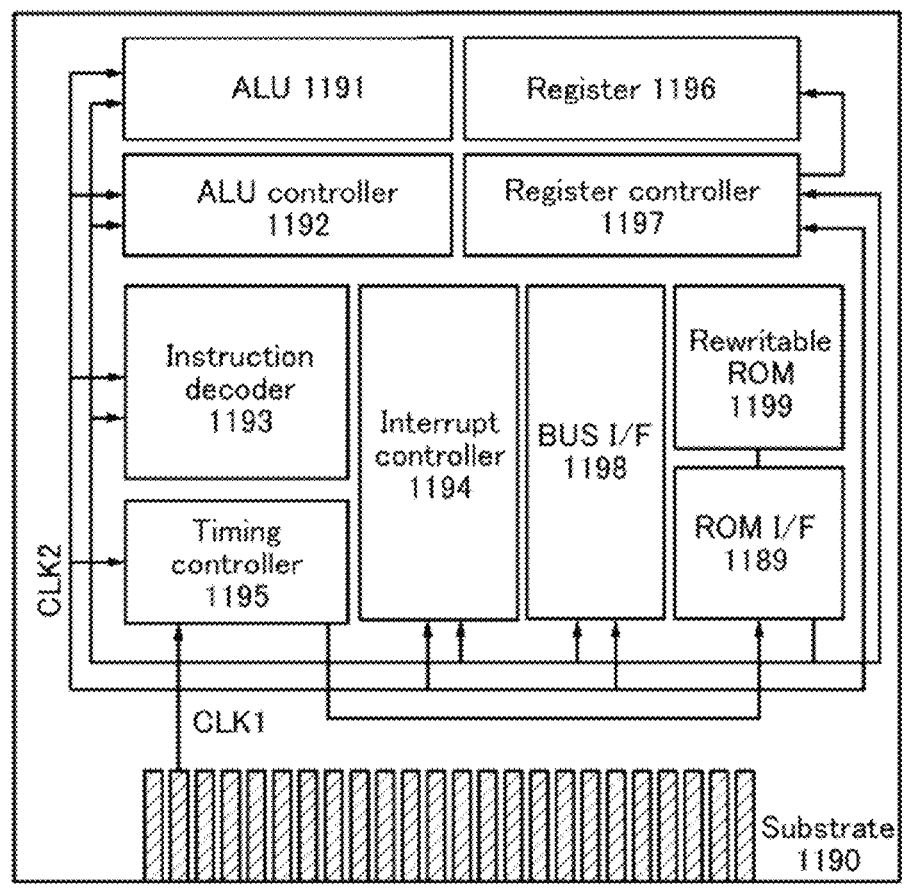
FIG. 36 illustrates a structure example of a CPU of an embodiment.

FIG. 36 is a block diagram illustrating a configuration example of a CPU at least partly including any of the transistors described in the above embodiments as a component.

The CPU illustrated in FIG. 36 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 36 is just an example in which the configuration is simplified, and an actual CPU may have a variety of configurations depending on the application. For example, the CPU may have the following configuration: a structure including the CPU illustrated in FIG. 36 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 36, a memory cell is provided in the register 1196. For the memory cell of the register 1196, any of the transistors described in the above embodiments can be used.

In the CPU illustrated in FIG. 36, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 37:
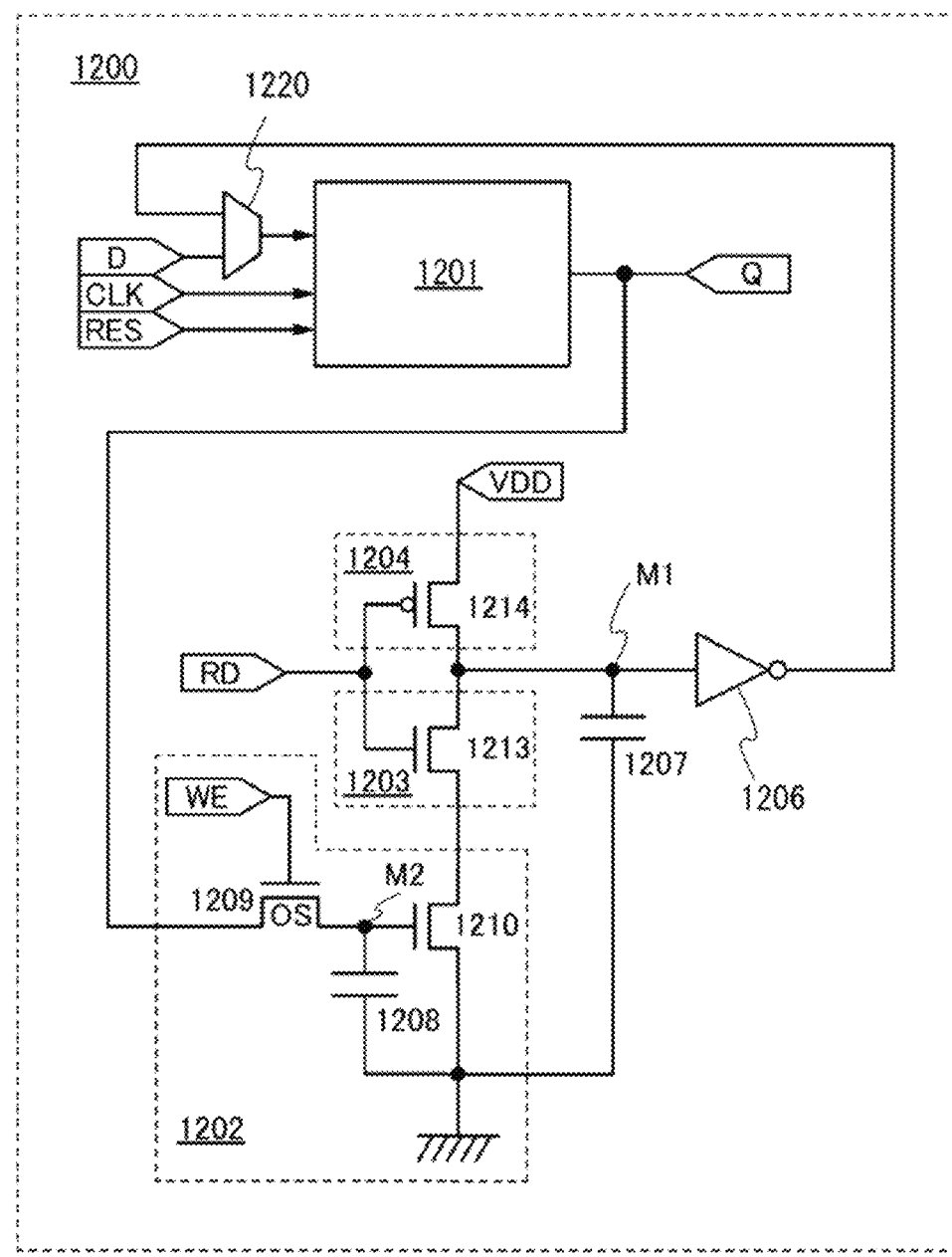
FIG. 37 is a circuit diagram of a memory element of an embodiment.

FIG. 37 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 37 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 37, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 37, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor layer can be used for all the transistors in the memory element 1200. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 37, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor layer is significantly smaller than that of a transistor in which a channel is formed in silicon having crystallinity. Thus, when the transistor is used as the transistor 1209, a signal retained in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RFID).

At least part of this embodiment can be implemented in combination with any of the other embodiments described in this specification as appropriate.

Embodiment 6

In this embodiment, a structure example of a display panel of one embodiment of the present invention is described.

Structure Example

Figure 38A:
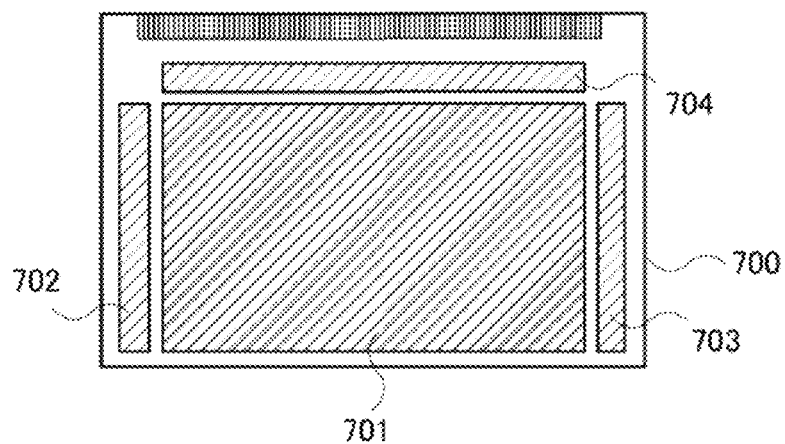
FIGS. 38A to 38C are circuit diagrams of a display device of an embodiment.
Figure 38B:
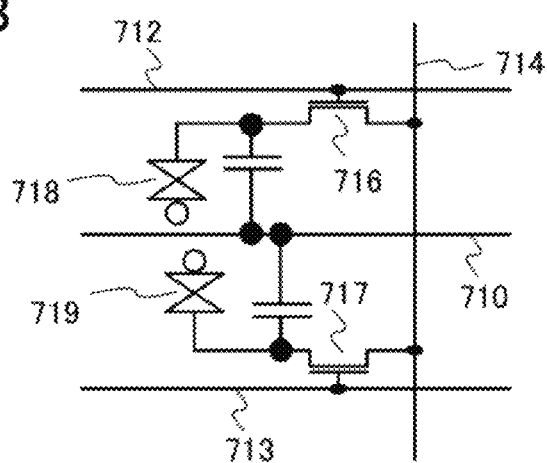
Figure 38C:
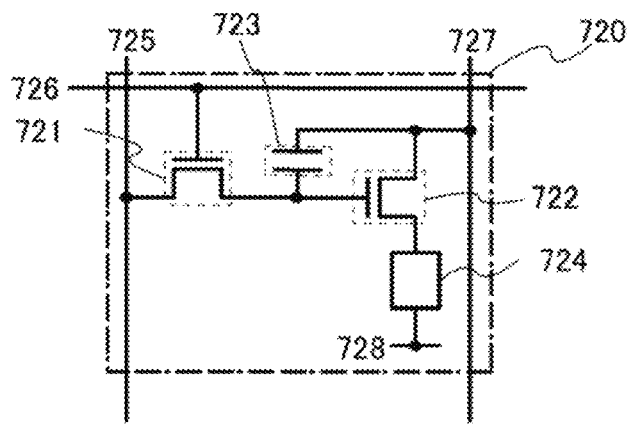

FIG. 38A is a top view of the display panel of one embodiment of the present invention. FIG. 38B is a circuit diagram illustrating a pixel circuit that can be used in the case where a liquid crystal element is used in a pixel in the display panel of one embodiment of the present invention. FIG. 38C is a circuit diagram illustrating a pixel circuit that can be used in the case where an organic EL element is used in a pixel in the display panel of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 38A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 38A, the first scan line driver circuit 702, the second scan line driver circuit 703, and the signal line driver circuit 704 are formed over the substrate 700 where the pixel portion 701 is formed. Consequently, the number of components provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Panel]

FIG. 38B illustrates an example of a circuit configuration of the pixel. Here, a pixel circuit that can be used in a pixel of a $V_A$ liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor described in any of the above embodiments can be used as appropriate as each of the transistors 716 and 717. Thus, a highly reliable liquid crystal display panel can be provided The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

In addition, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 38B. For example, a switch, a resistor, a capacitor, a transistor, a sensor, a logic circuit, or the like may be added to the pixel shown in FIG. 38B.

[Organic EL Panel]

FIG. 38C shows another example of a circuit configuration of the pixel. Here, a pixel structure of a display panel using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. On the basis of such a mechanism, this light-emitting element is referred to as a current-excitation light-emitting element.

FIG. 38C shows an example of a pixel circuit that can be used. In this example, one pixel includes two n-channel transistors. Note that a metal oxide film of one embodiment of the present invention can be used for channel formation regions of the n-channel transistors. Digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor described in any of the above embodiments can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage that is the sum of power supply line voltage and the threshold voltage $V_{th}$ of the driver transistor 722 is applied to the signal line 725.

In the case of performing analog grayscale driving, voltage greater than or equal to voltage that is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit is not limited to that shown in FIG. 38C. For example, a switch, a resistor, a capacitor, a sensor, a transistor, a logic circuit, or the like may be added to the pixel circuit shown in FIG. 38C.

In the case where the transistor described in the above embodiments is used for the circuit shown in FIGS. 38A to 38C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

At least part of this embodiment can be implemented in combination with any of the other embodiments described in this specification as appropriate.

Embodiment 7

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images. Other examples of electronic appliances that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 39A to 39F illustrate specific examples of these electronic appliances.

Figure 39A:
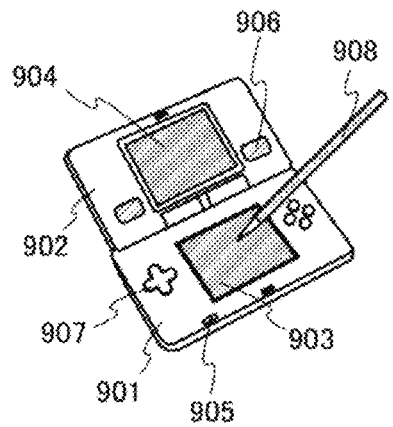
FIGS. 39A to 39F illustrate electronic appliances of an embodiment.

FIG. 39A illustrates a portable game machine, which includes a housing 901, a housing 902, a display portion 903, a display portion 904, a microphone 905, a speaker 906, an operation key 907, a stylus 908, and the like. Although the portable game machine in FIG. 39A has the two display portions 903 and 904, the number of display portions included in a portable game machine is not limited to this.

Figure 39B:
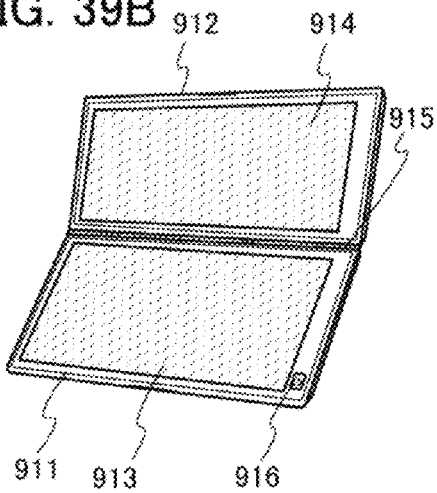

FIG. 39B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 39C:
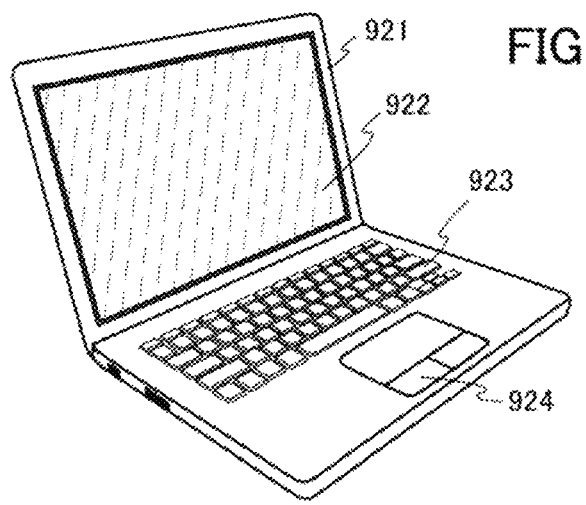

FIG. 39C illustrates a laptop personal computer, which includes a housing 921, a display portion 922, a keyboard 923, a pointing device 924, and the like.

Figure 39D:
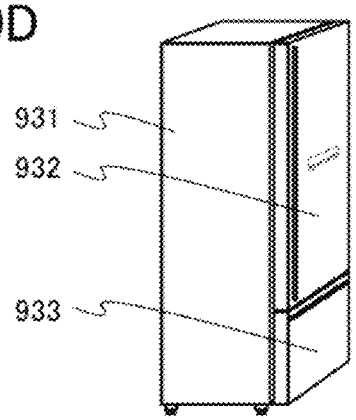

FIG. 39D illustrates an electric refrigerator-freezer, which includes a housing 931, a refrigerator door 932, a freezer door 933, and the like.

Figure 39E:
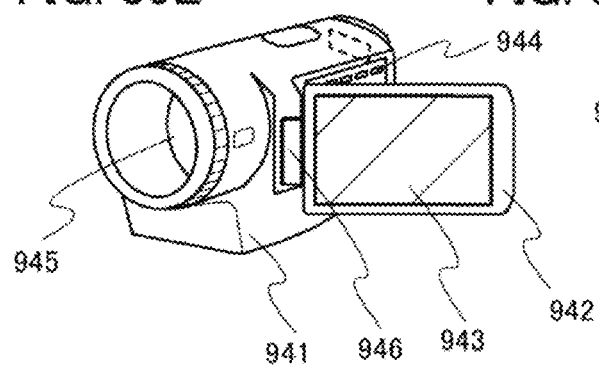

FIG. 39E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 39F:
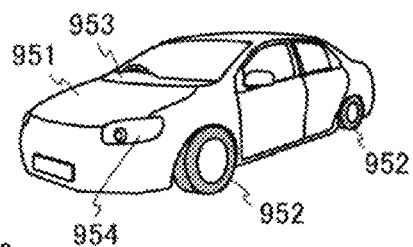
Figure 40A:
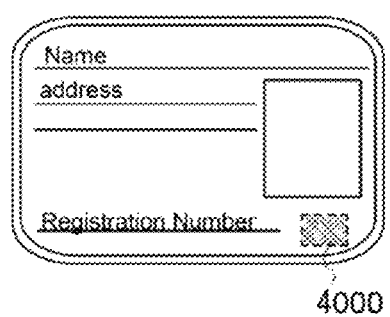
FIGS. 40A to 40F illustrate application examples of an RFID of an embodiment.
Figure 40B:
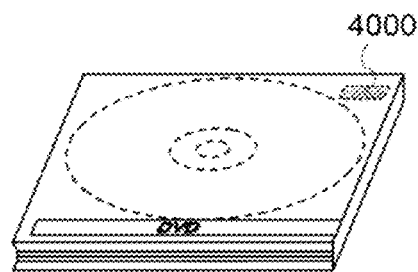
Figure 40C:
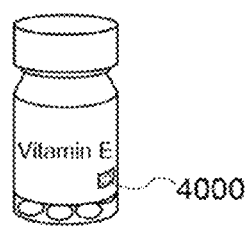
Figure 40D:
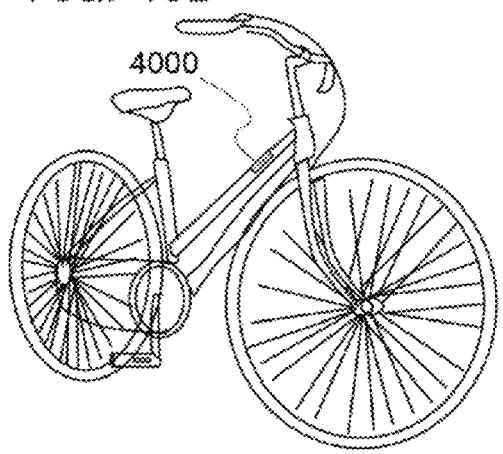
Figure 40E:
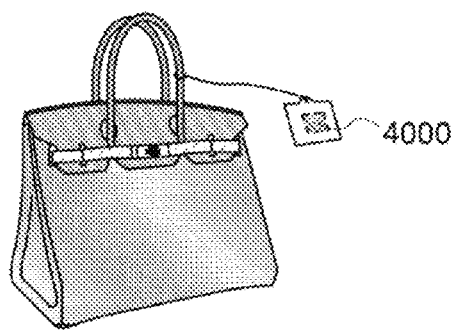
Figure 40F:
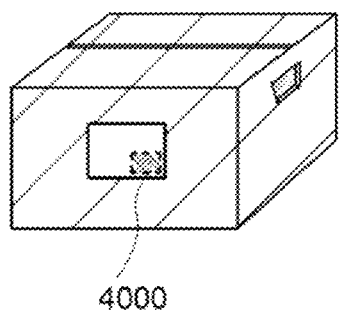

FIG. 39F illustrates a passenger car, which includes a car body 951, wheels 952, a dashboard 953, lights 954, and the like.

At least part of this embodiment can be implemented in combination with any of the other embodiments described in this specification as appropriate.

Embodiment 8

In this embodiment, application examples of an RFID of one embodiment of the present invention will be described with reference to FIGS. 40A to 40F. The RFID is widely used and can be provided for, for example, products such as bills, coins, securities, bearer bonds, documents (e.g., driver's licenses or residence cards, see FIG. 40A), packaging containers (e.g., wrapping paper or bottles, see FIG. 40C), recording media (e.g., DVD software or video tapes, see FIG. 40B), vehicles (e.g., bicycles, see FIG. 40D), personal belongings (e.g., bags or glasses), foods, plants, animals, human bodies, clothing, household goods, medical supplies such as medicine and chemicals, and electronic appliances (e.g., liquid crystal display devices, EL display devices, television sets, or cellular phones), or tags on products (see FIGS. 40E and 40F).

An RFID 4000 of one embodiment of the present invention is fixed to a product by being attached to a surface thereof or embedded therein. For example, the RFID 4000 is fixed to each product by being embedded in paper of a book, or embedded in an organic resin of a package. Since the RFID 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RFID 4000 of one embodiment of the present invention, and the identification function can be utilized to prevent counterfeiting. Moreover, the efficiency of a system such as an inspection system can be improved by providing the RFID of one embodiment of the present invention for packaging containers, recording media, personal belongings, foods, clothing, household goods, electronic appliances, or the like. Vehicles can also have higher security against theft or the like by being provided with the RFID of one embodiment of the present invention As described above, by using the RFID of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RFID can be preferably used for application in which data is not frequently written or read.

At least part of this embodiment can be implemented in combination with any of the other embodiments described in this specification as appropriate.

Example 1

In this example, a semiconductor device that included a transistor including single crystal silicon and a transistor including an oxide semiconductor stacked over the transistor was manufactured, and the electrical characteristics of the transistors were measured.

[Samples]

Methods for manufacturing samples are described below.

First, an SOI substrate including a single crystal silicon film with a thickness of 52 nm was prepared as a substrate.

Next, part of the single crystal silicon film was etched by photolithography to form an island-shaped single crystal silicon film.

Next, a surface of the single crystal silicon film was oxidized by a microwave CVD method to form a silicon oxide film with a thickness of 10 nm. Note that the microwave CVD method is also called a high-density plasma CVD method or the like. Then, heat treatment was performed at 950° C. in a nitrogen atmosphere for 1 hour. In such a manner, a gate insulating film was formed.

Next, phosphorus ions were implanted into part of the single crystal silicon film in order to form a p-channel transistor. The phosphorus ions were implanted by an ion implantation apparatus with a mass separation function at an acceleration voltage of 18 kV and a concentration of $6.5 \times 10^{11}$ ions/cm$^2$.

Next, boron ions were implanted into part of the single crystal silicon film in order to form an n-channel transistor. The boron ions were implanted by the ion implantation apparatus at an acceleration voltage of 14 kV and a concentration of $3.0 \times 10^{12}$ ions/cm$^2$.

Next, a tantalum nitride film with a thickness of 30 nm and a tungsten film with a thickness of 170 nm were sequentially formed by a sputtering method. After that, parts of the tantalum nitride film and the tungsten film were etched by photolithography to form a gate electrode.

Next, boron ions were implanted into a region in the single crystal silicon film that was to be the p-channel transistor with the use of the gate electrode as a mask. The boron ions were implanted by the ion implantation apparatus at an acceleration voltage of 9 kV and a concentration of $1.0 \times 10^{13}$ ions/cm$^2$.

Next, phosphorus ions were implanted into a region in the single crystal silicon film that was to be the n-channel transistor with the use of the gate electrode as a mask. The phosphorus ions were implanted by the ion implantation apparatus at an acceleration voltage of 9 kV and a concentration of $1.0 \times 10^{13}$ ions/cm'.

Next, a silicon oxynitride film was formed to a thickness of 300 nm by a plasma CVD method and subjected to anisotropic etching to form an insulating film (also referred to as a sidewall insulating film) in contact with a side surface of the gate electrode. Note that part of the gate insulating film was also etched when the silicon oxynitride film was etched. As a result, part of the single crystal silicon film was exposed.

Next, the region in the single crystal silicon film that was to be the p-channel transistor was doped with boron ions with the use of the gate electrode and the sidewall insulating film as masks. The region was doped with the boron ions by an ion doping apparatus without a mass separation function at an acceleration voltage of 10 kV and a concentration of $1.5 \times 10^{16}$ ions/cm$^2$. The region doped with the boron ions functions as a source region or a drain region of the p-channel transistor. In addition, a region directly under the sidewall insulating film has a carrier density between those of a channel formation region and the source or drain region, which were formed through the above-described steps, and thus functions as a lightly doped drain (LDD) region.

Next, the region in the single crystal silicon film that was to be the n-channel transistor was doped with phosphorus ions with the use of the gate electrode and the sidewall insulating film as masks. The region was doped with the phosphorus ions by the ion doping apparatus at an acceleration voltage of 10 kV and a concentration of $3.0 \times 10^{15}$ ions/cm$^2$. The region doped with the phosphorus ions functions as a source region or a drain region of the n-channel transistor. In addition, a region directly under the sidewall insulating film has a carrier density between those of a channel formation region and the source or drain region, which were formed through the above-described steps, and thus functions as an LDD region.

Next, a silicon oxynitride film was formed to a thickness of 50 nm by a plasma CVD method.

Then, heat treatment was performed at 550° C. in a nitrogen atmosphere for 1 hour.

Next, a silicon nitride oxide film was formed to a thickness of 280 nm by a plasma CVD method. Since the silicon nitride oxide film contains a large amount of hydrogen, it is also called a SiNOH film.

Next, a silicon oxynitride film was formed to a thickness of 300 nm by a thermal CVD method.

Then, heat treatment was performed at 490° C. in a nitrogen atmosphere for 1 hour. By the heat treatment, hydrogen is released from the SiNOH film. The released hydrogen reaches the single crystal silicon film and terminates dangling bonds of the single crystal silicon film. Such heat treatment is called hydrogenation treatment.

Next, parts of the 50-nm-thick silicon oxynitride film, the 280-nm-thick silicon nitride oxide film, and the 300-nm-thick silicon oxide film were etched to form openings reaching the source region, the drain region, the gate electrode, and the like.

Next, a tungsten film was formed to a thickness of 150 nm by a sputtering method.

Then, part of the tungsten film was etched by photolithography to form a first wiring layer.

Next, a silicon oxide film was formed to a thickness of 900 nm by a plasma CVD method.

Then, a top surface of the silicon oxide film was subjected to CMP treatment to be planarized so that the thickness of the silicon oxide film became approximately 400 nm to 500 nm.

Next, heat treatment was performed in a nitrogen atmosphere. Note that Sample 1 was subjected to heat treatment at 490° C. for 10 hours, whereas Sample 2 was subjected to heat treatment at 450° C. for 5 hours. The heat treatment diffuses, in the outward direction, hydrogen that remains in each layer without being diffused outward by the above-described hydrogenation treatment and without being used for termination of dangling bonds, and thus is called dehydrogenation treatment. The dehydrogenation treatment becomes more effective with a higher temperature and a longer time. Thus, Sample 1 has a smaller amount of remaining hydrogen than Sample 2.

Next, part of the silicon oxide film with a thickness of approximately 400 nm to 500 nm was etched to form an opening reaching the first wiring layer or the like.

Next, a tungsten film was formed to a thickness of 150 nm by a sputtering method.

Then, part of the tungsten film was etched by photolithography to form a conductive film 220 functioning as a second electrode and a conductive film 174 functioning as a second wiring layer.

Next, a silicon oxide film was formed to a thickness of 500 nm by a plasma CVD method.

Then, a top surface of the silicon oxide film was subjected to CMP treatment to be planarized so that the thickness of the silicon oxide film became approximately 0 nm to 50 nm, and a top surface of the tungsten film was exposed.

Next, a silicon oxide film was formed to a thickness of 100 nm by a plasma CVD method.

Next, heat treatment was performed in a nitrogen atmosphere. Note that Sample 1 was subjected to heat treatment at 490° C. for 10 hours, whereas Sample 2 was subjected to heat treatment at 450° C. for 1 hour. By the heat treatment, further dehydrogenation treatment was performed.

Next, an aluminum oxide film was formed to a thickness of 50 nm by a sputtering method. The aluminum oxide film has a function of blocking oxygen, hydrogen, and the like. Thus, by providing the aluminum oxide film, hydrogen released from the transistor including single crystal silicon or the insulating films, the conductive films, and the like provided near the transistor can be prevented from entering a transistor including an oxide semiconductor, which is to be manufactured later.

Next, a silicon oxynitride film containing excess oxygen was formed to a thickness of 100 nm by a plasma CVD method. Note that the silicon oxynitride film releases oxygen because of heat treatment performed later. The released oxygen is used in order to reduce oxygen vacancies in the oxide semiconductor, so that the electrical characteristics and reliability of the transistor can be improved. Meanwhile, when the released oxygen reaches single crystal silicon, the electrical characteristics and reliability of the transistor might be degraded. The above-described aluminum oxide film has a function of preventing entry of oxygen to single crystal silicon. Thus, even if the silicon oxynitride film containing excess oxygen is provided, the transistor including single crystal silicon can have good electrical characteristics and high reliability.

Next, for Sample 1, a 20-nm-thick first oxide semiconductor film and a 20-nm-thick second oxide semiconductor film were sequentially formed by a sputtering method. In addition, for Sample 2, a 20-nm-thick first oxide semiconductor film and a 15-nm-thick second oxide semiconductor film were sequentially formed by a sputtering method. The first oxide semiconductor films were formed using a target having an atomic ratio of In:Ga:Zn=1:3:2. The second oxide semiconductor films were formed using a target having an atomic ratio of In:Ga:Zn=1:1:1. Note that the first oxide semiconductor film and the second oxide semiconductor film are collectively referred to as an oxide semiconductor film 206.

Next, heat treatment was performed at 450° C. in a nitrogen atmosphere for 1 hour, and then heat treatment was performed at 450° C. in an oxygen atmosphere for 1 hour.

Next, part of the oxide semiconductor film 206 was etched by photolithography, whereby the oxide semiconductor film 206 had an island shape.

Then, parts of the silicon oxynitride film containing excess oxygen, the aluminum oxide film, and the silicon oxide film were etched to form openings (as an opening 260) reaching the conductive film 220, the conductive film 174, and the like.

Next, a tungsten film was formed to a thickness of 100 nm by a sputtering method.

Part of the tungsten film was etched by photolithography to form a conductive film 216a and a conductive film 216b that function as a source electrode and a drain electrode of the transistor including an oxide semiconductor.

Next, a third oxide semiconductor film was formed to a thickness of 5 nm by a sputtering method. The third oxide semiconductor film was formed using a target having an atomic ratio of In:Ga:Zn=1:3:2.

Next, a silicon oxynitride film was formed to a thickness of 20 nm by a plasma CVD method.

Next, a 30-nm-thick titanium nitride film and a 135-nm-thick tungsten film were formed sequentially by a sputtering method.

Then, parts of the titanium nitride film and the tungsten film were etched by photolithography to form a gate electrode 204.

Next, parts of the third oxide semiconductor film and the silicon oxynitride film were etched by photolithography. The silicon oxynitride film is positioned between the second oxide semiconductor film that is a channel formation region and the gate electrode 204, and thus functions as a gate insulating film.

Next, an aluminum oxide film was formed to a thickness of 150 nm by a sputtering method. The aluminum oxide film has a function of blocking oxygen, hydrogen, and the like. Thus, by providing the aluminum oxide film, hydrogen released from the transistor including single crystal silicon or the insulating films, the conductive films, and the like provided near the transistor or hydrogen from the outside of the semiconductor device can be prevented from entering the transistor including an oxide semiconductor. In addition, outward diffusion of oxygen released from the silicon oxynitride film containing excess oxygen can be prevented and oxygen can be efficiently used in order to reduce oxygen vacancies in the oxide semiconductor.

Next, heat treatment was performed at 400° C. in an oxygen atmosphere for 1 hour. By the heat treatment, part of oxygen contained in the silicon oxynitride film containing excess oxygen is released to be supplied to the first oxide semiconductor film first. Since the supplied oxygen moves like a billiard ball in the first oxide semiconductor film, oxygen seems to be also supplied to the second oxide semiconductor film. That is, by the heat treatment, oxygen vacancies in the second oxide semiconductor film that is the channel formation region can be reduced. At this time, an aluminum oxide film is provided in the periphery of the second oxide semiconductor film. Thus, oxygen released from the silicon oxynitride film containing excess oxygen is efficiently used in order to reduce the oxygen vacancies in the second oxide semiconductor film.

Next, a silicon oxynitride film was formed to a thickness of 300 nm by a plasma CVD method.

Then, parts of the silicon oxynitride film and the aluminum oxide film were etched to form openings reaching the conductive film 216a, the conductive film 216b, and the like.

Next, a 50-nm-thick titanium film, a 200-nm-thick aluminum film, and a 50-nm-thick titanium film were formed sequentially by a sputtering method.

Then, parts of the above-described titanium film, aluminum film, and titanium film were etched by photolithography to form a second wiring layer.

In the above-described manner, as Sample 1 and Sample 2, the semiconductor devices including the transistors including single crystal silicon and the transistors including an oxide semiconductor were manufactured.

[Measurement]

The electrical characteristics of the transistors including single crystal silicon and the transistors including oxide semiconductors included in Sample 1 and Sample 2 were measured.

Note that Sample 1 and Sample 2 are different from each other only in the conditions of the two dehydrogenation treatment steps. Specifically, for Sample 1, heat treatment at 490° C. in a nitrogen atmosphere for 10 hours was performed as the first and second dehydrogenation treatment steps, whereas for Sample 2, heat treatment at 450° C. in a nitrogen atmosphere for 5 hours was performed as the first dehydrogenation treatment step and heat treatment at 450° C. in a nitrogen atmosphere for 1 hour was performed as the second dehydrogenation treatment step.

Figure 41:
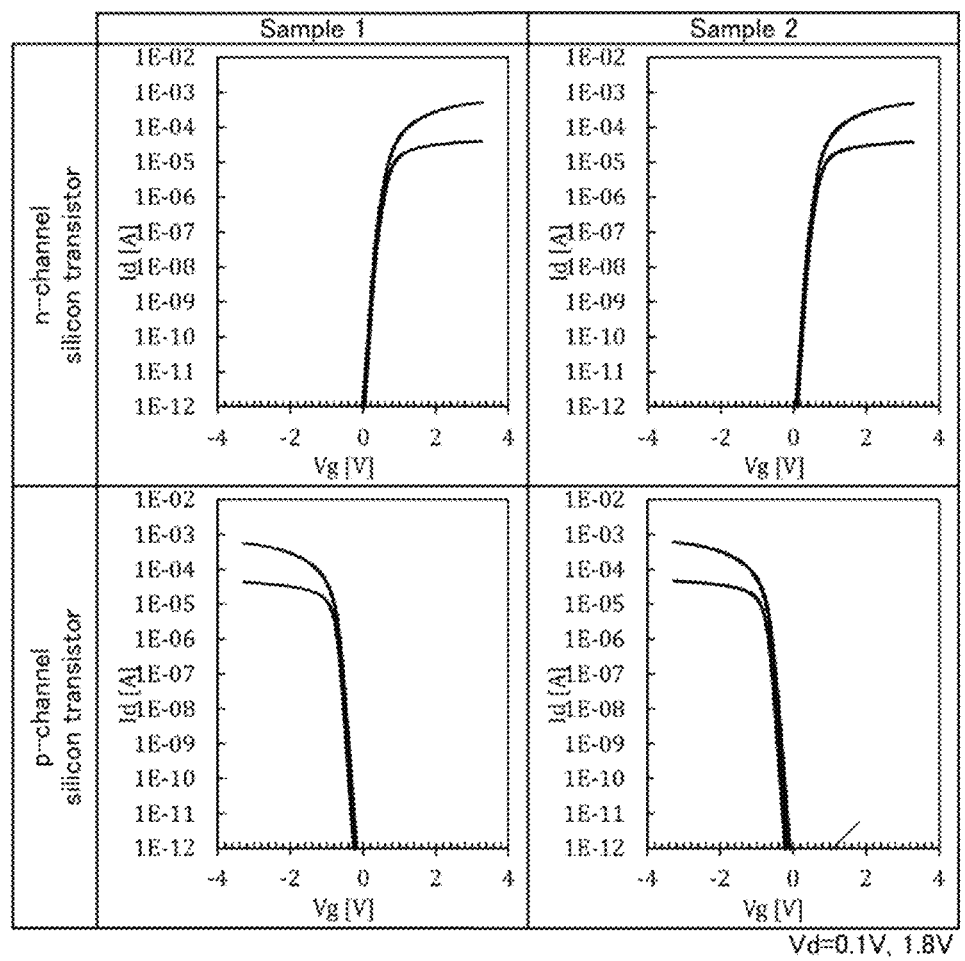
FIG. 41 shows electrical characteristics of transistors.

FIG. 41 shows the $V_g$-$I_d$ characteristics of the transistors including single crystal silicon. The $V_g$-$I_d$ characteristics measurement of the n-channel transistors was performed by measuring drain current ($I_d$) when the drain voltage ($V_d$) was set to 0.1 V or 1.8 V and the gate voltage ($V_g$) was swept in the range of −1.8 V to 3.3 V at 0.1 V intervals. The $V_g$-$I_d$ characteristics measurement of the p-channel transistors was performed by measuring drain current ($I_d$) when the gate voltage ($V_g$) was swept in the range of 1.8 V to −3.3 V at 0.1 V intervals. Note that the design values of the channel length and the channel width of the transistors were 0.35 μm and 1.6 μm, respectively. The measurement was performed on 25 transistors uniformly arranged over a substrate with a size of 126.6 mm².

As shown in FIG. 41, there was little difference in the electrical characteristics of the transistors including single crystal silicon between Sample 1 and Sample 2. Specifically, the n-channel transistor in Sample 1 had a threshold voltage of 0.47 V and a subthreshold swing value (also referred to as an S value) of 67.0 mV/dec. The n-channel transistor in Sample 2 had a threshold voltage of 0.51 V and an S value of 67.6 mV/dec. The p-channel transistor in Sample 1 had a threshold voltage of −0.59 V and an S value of 69.0 mV/dec. The p-channel transistor in Sample 2 had a threshold voltage of −0.55 V and an S value of 71.6 mV/dec. Note that the threshold voltage was derived from the $V_g$-$I_d$ characteristics at a drain voltage of 1.8 V and the S values were derived from the $V_g$-$I_d$ characteristics at a drain voltage of 0.1 V.

The electrical characteristics of a transistor are presumed to be degraded when hydrogen terminating dangling bonds of single crystal silicon is released. As shown in FIG. 41, however, there is little difference in the electrical characteristics of the transistors including single crystal silicon between Sample 1 and Sample 2. This means that release of hydrogen terminating dangling bonds of single crystal silicon is less likely to occur in Sample 1 in this example even under the conditions where release of hydrogen is more likely to occur than in Sample 2.

Figure 42A:
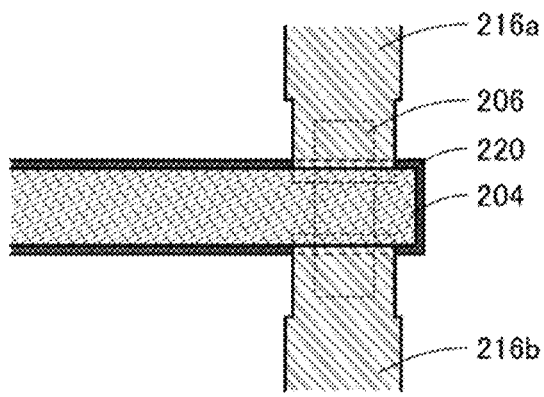
FIGS. 42A to 42C are top views illustrating structures of the vicinity of a transistor.
Figure 42B:
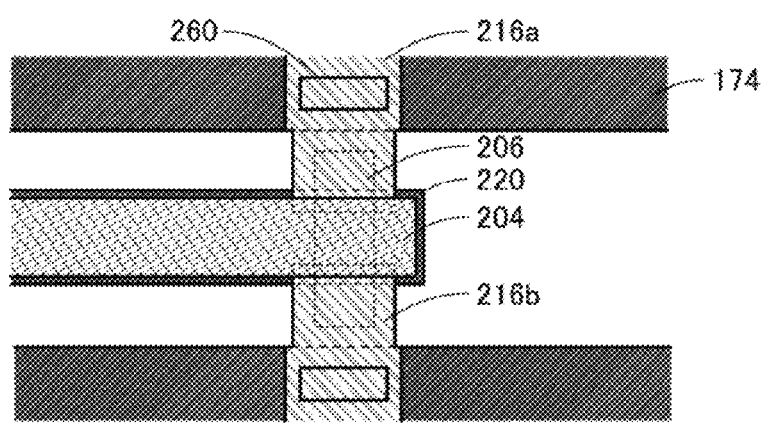
Figure 42C:
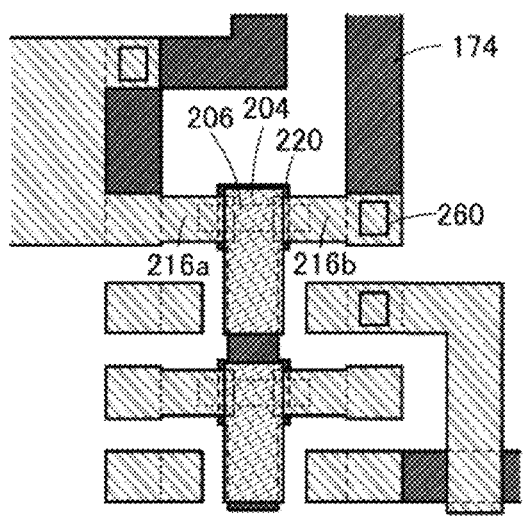

Next, the $V_g$-$I_d$ characteristics of the transistors including oxide semiconductors were measured. Note that the $V_g$-$I_d$ characteristics of three kinds of structures were measured in order to examine influence of the openings formed in the layers in the vicinity of the transistors. FIGS. 42A to 42C are top views each illustrating the transistor including an oxide semiconductor and the periphery thereof.

FIG. 42A illustrates a structure (Structure 1) that does not have the conductive film 174 and an opening 260. FIG. 42B illustrates a structure (Structure 2) that has one opening 260 between the conductive film 174 and the conductive film 216a and one opening 260 between the conductive film 174 and the conductive film 216b. FIG. 42C illustrates a structure (Structure 3) that has one opening 260 between the conductive film 174 and the conductive film 216a, one opening 260 between the conductive film 174 and the conductive film 216b, and openings in peripheral wiring layers.

Figure 43:
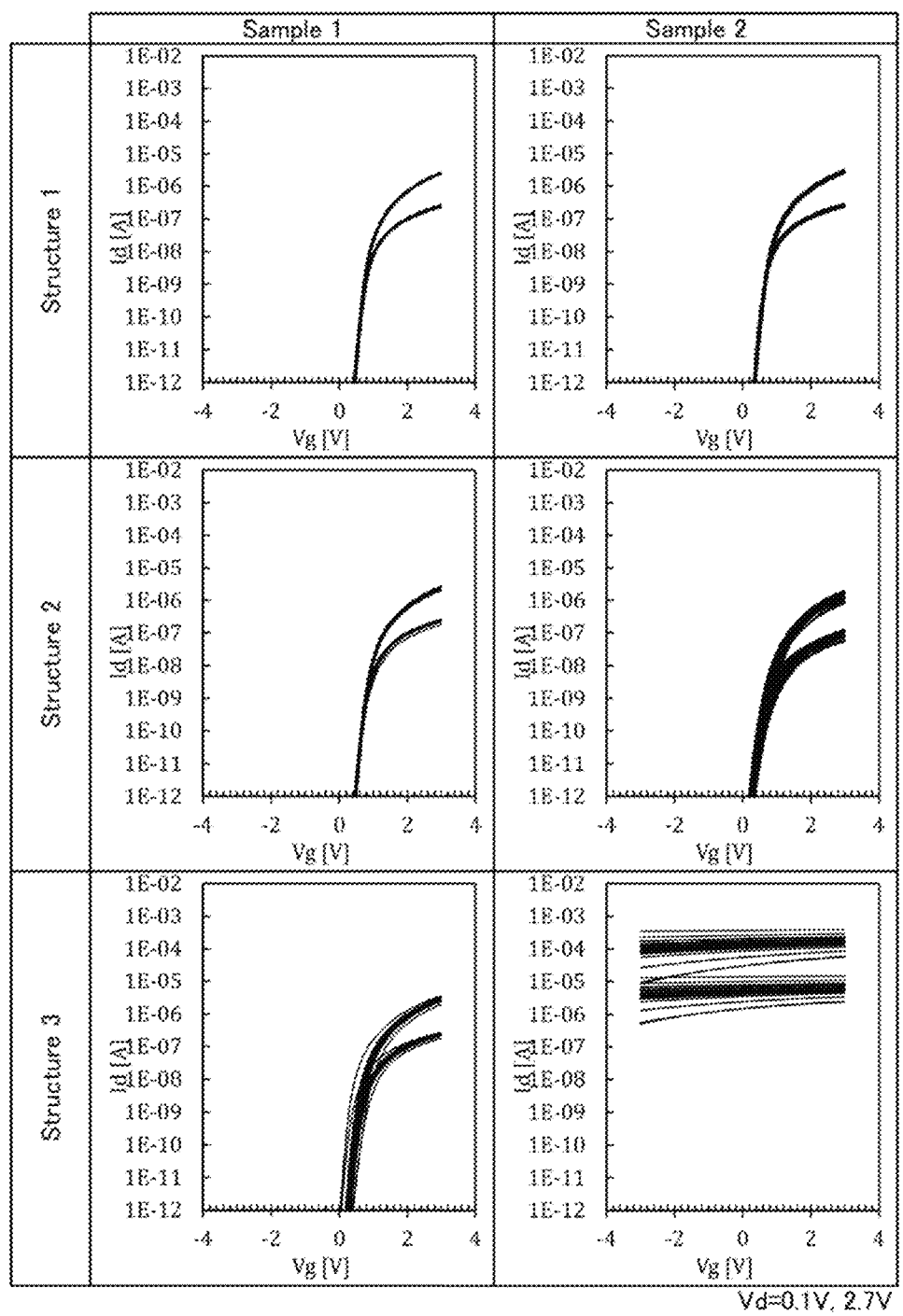
FIG. 43 shows electrical characteristics of transistors.

FIG. 43 shows the $V_g$-$I_d$ characteristics of the transistors including oxide semiconductors in the structures illustrated in FIGS. 42A to 42C. Measurement of the $V_g$-$I_d$ characteristics was performed by measuring drain current ($I_d$) when the drain voltage ($V_d$) was set to 0.1 V or 2.7 V and the gate voltage ($V_g$) was swept in the range of −3 V to 3 V at 0.1 V intervals. Note that the design values of the channel length and the channel width of the transistors were 0.8 μm and 0.8 μm, respectively. The measurement was performed on 25 transistors uniformly arranged over a substrate with a size of 126.6 mm².

As shown in FIG. 43, there was little difference in the electrical characteristics of the transistors including oxide semiconductors between Sample 1 and Sample 2 in Structure 1. Specifically, Sample 1 had a shift value (also referred to as Shift) of 0.44 V and an S value of 90.7 mV/dec. Note that the shift value is a gate voltage at a drain current of $1×10^{-12}$ A. Sample 2 had a shift value of 0.34 V and an S value of 98.4 mV/dec. Note that the shift values were derived from the $V_g$-$I_d$ characteristics at a drain voltage of 2.7 V and the S values were derived from the $V_g$-$I_d$ characteristics at a drain voltage of 0.1 V.

In addition, as shown in FIG. 43, there was a difference in the electrical characteristics of the transistors including oxide semiconductors in Sample 1 and Sample 2 in Structure 2. Specifically, Sample 1 had a shift value of 0.47 V and an S value of 95.3 mV/dec., whereas Sample 2 had a shift value of 0.28 V and an S value of 132.1 mV/dec. Sample 2 in Structure 2 had a larger S value than Sample 2 in Structure 1. In contrast, Sample 1 in Structure 2 had an S value substantially equal to that in Structure 1 and had favorable electrical characteristics also in Structure 2.

Moreover, as shown in FIG. 43, there was a significant difference in the electrical characteristics of the transistors including oxide semiconductors between Sample 1 and Sample 2 in Structure 3. Specifically, Sample 1 had a shift value of 0.24 V and an S value of 98.1 mV/dec., whereas Sample 2 did not have switching characteristics. The above results reveal that Sample 1 in Structure 3 had an S value substantially equal to those in Structure 1 and Structure 2 and had favorable electrical characteristics also in Structure 3.

The structure differences among Structure 1, Structure 2, and Structure 3 indicate that presence or absence of the openings in Sample 2 affects the electrical characteristics of the transistors including oxide semiconductors. Specifically, a larger number of openings in the periphery of the transistor degrades the electrical characteristics. In Sample 1, however, the electrical characteristics of the transistor are not changed by the presence or absence of the opening as much as those in Sample 2. This is probably because the dehydrogenation treatment was not sufficiently performed in Sample 2 as compared to Sample 1 and hydrogen moved to the transistor including an oxide semiconductor through the opening; in contrast, the dehydrogenation treatment was sufficiently performed in Sample 1 and degradation due to hydrogen was hardly caused. Note that slight degradation of the electrical characteristics is observed depending on the structure in Sample 1. In that case, further improvement in the electrical characteristics of Sample 1 can be expected by improving conditions of dehydrogenation treatment.

Figure 44:
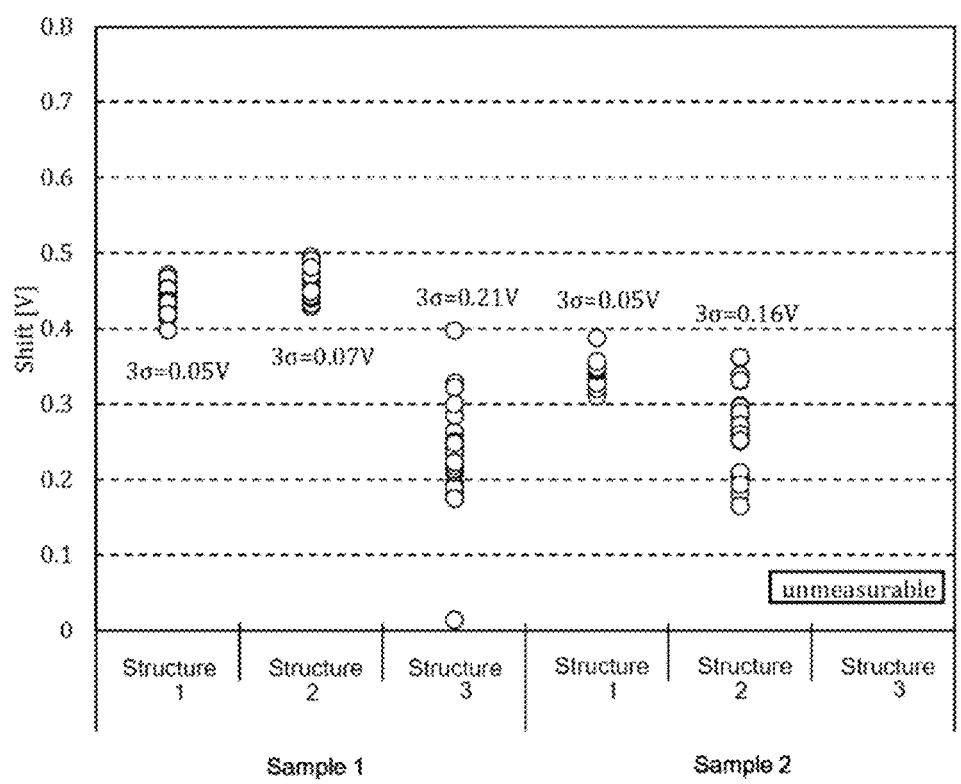
FIG. 44 shows variation in electrical characteristics among transistors.

All shift values derived from the $V_g$-$I_d$ characteristics shown in FIG. 43 are plotted in FIG. 44. Sample 1 had a 3σ of the shift value of 0.05 V in Structure 1, 0.07 V in Structure 2, and 0.21 V in Structure 3. In contrast, Sample 2 had a 3σ of the shift value of 0.05 V in Structure 1 and 0.16 V in Structure 2, and the 3σ of the shift value in Structure 3 was unmeasurable.

The above results show that Sample 1 has smaller variation in the $V_g$-$I_d$ characteristics due to the structure differences than Sample 2.

Structure 2 and Structure 3 have more openings than Structure 1 and are closer to the structure of a highly integrated semiconductor device. Thus, in order to manufacture a highly integrated semiconductor device with high yield, it is probably important to achieve excellent electrical characteristics even in a structure having many openings like Structure 2 and Structure 3.

This example reveals that an improvement in the conditions of dehydrogenation treatment can reduce degradation of the electrical characteristics of the transistors including an oxide semiconductor that have a variety of structures without changes in the electrical characteristics of the transistors including single crystal silicon. This example also indicates that a further improvement of conditions of dehydrogenation treatment can further suppress degradation of the electrical characteristics of the transistors including oxide semiconductors.

Example 2

In this example, it was examined of how electrical characteristics of transistors including oxide semiconductors change depending on a difference in dehydrogenation treatment and a difference in the thickness of a silicon oxynitride film containing excess oxygen.

[Samples]

Methods for manufacturing Sample 3 and Sample 4 are described below.

Sample 3 was manufactured under conditions similar to those for Sample 1 described in Example 1 except that the thickness of the second oxide semiconductor film was 15 nm. The only difference between Sample 3 and Sample 1 is the thickness of the second oxide semiconductor film; therefore, the description of Sample 1 is referred to for the other conditions. In other words, dehydrogenation treatment for Sample 3 was performed under improved conditions.

Sample 4 was manufactured under conditions similar to those for Sample 2 except that the thickness of the silicon oxynitride film containing excess oxygen was 300 nm. The only difference between Sample 4 and Sample 2 is the thickness of the silicon oxynitride film containing excess oxygen; therefore, the description of Sample 2 is referred to for the other conditions. Note that the thickness of the silicon oxynitride film containing excess oxygen in Sample 3 is 100 nm.

[Measurement]

Next, the $V_g$-$I_d$ characteristics of Sample 3 and Sample 4 were measured. The $V_g$-$I_d$ characteristics measurement was performed on the samples having Structure 1 described in Example 1. The $V_g$-$I_d$ characteristics measurement was performed by measuring drain current ($I_d$) when the drain voltage ($V_d$) was set to 1.8 V and the gate voltage ($V_g$) was swept in the range of −3 V to 3 V at 0.1 V intervals at room temperature (25° C.) and 85° C. The measurement was performed a plurality of times by changing voltage ($V_{bg}$) applied to the conductive film 220 that was the second gate electrode in the range of 0 V to −20 V. Note that the design values of the channel length and the channel width of the transistors were 0.8 μm and 0.8 μm, respectively. The measurement was performed on 13 transistors uniformly arranged over a substrate with a size of 126.6 mm².

Figure 45A:
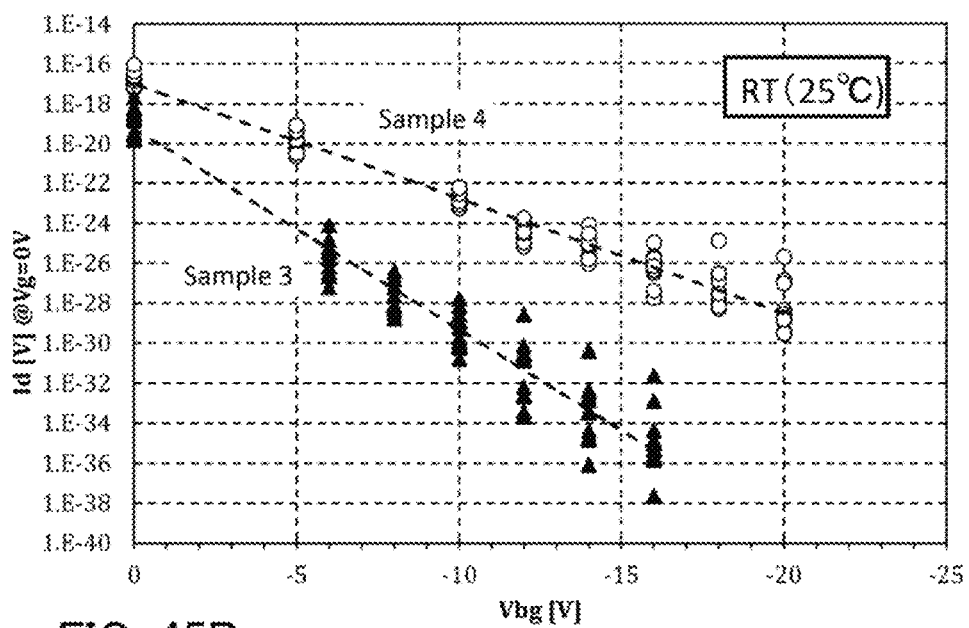
FIGS. 45A and 45B each show a relationship between voltage applied to a second gate electrode and ideal drain current in a transistor at a voltage of a first gate electrode of 0 V.
Figure 45B:
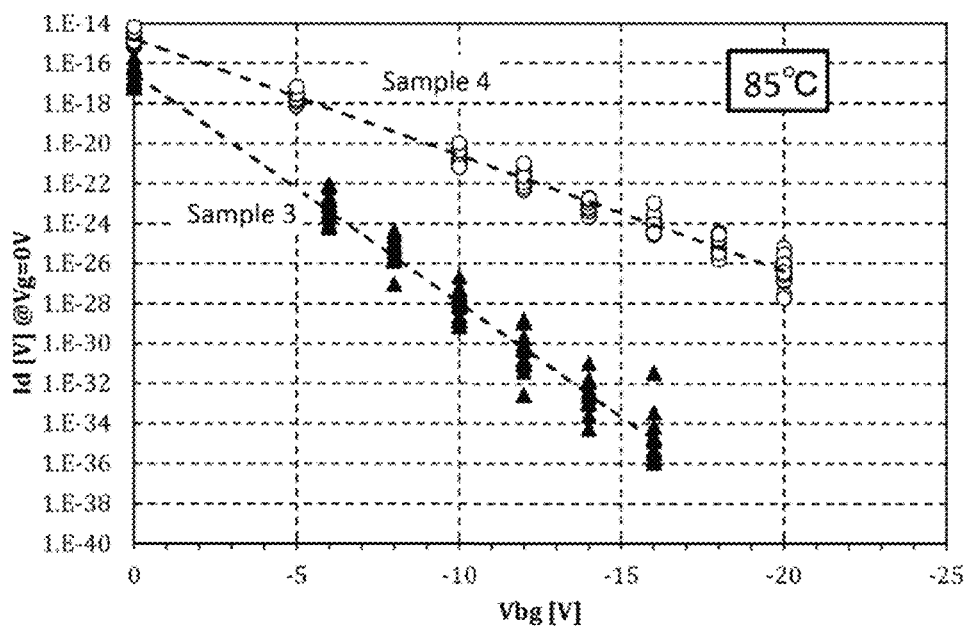

Then, S values were calculated on the basis of the obtained $V_g$-$I_d$ characteristics, and drain current at a gate voltage of 0 V was obtained by extrapolation. FIGS. 45A and 45B show the results. FIG. 45A shows the relationship between voltage applied to the conductive film 220 at room temperature and drain current at a gate voltage of 0 V. FIG. 45B shows the relationship between voltage applied to the conductive film 220 at 85° C. and drain current at a gate voltage of 0 V.

As shown in FIGS. 45A and 45B, the drain current of Sample 3, for which the dehydrogenation treatment was performed under the improved conditions, was overall lower than that of Sample 4. In addition, a small thickness of the silicon oxynitride film containing excess oxygen is highly effective in reducing the drain current with respect to the voltage applied to the conductive film 220 functioning as the second gate electrode. In other words, the drain current was able to be reduced effectively even with a small absolute value of the voltage applied to the conductive film 220.

In addition, FIGS. 45A and 45B indicate that an improvement in the conditions of the dehydrogenation treatment can reduce drain current in a state where voltage is not applied to a gate electrode to approximately $1 \times 10^{-22}$ A to $1 \times 10^{-35}$ A. The drain current is sometimes used to mean off-state current. Thus, it is important to improve conditions of dehydrogenation treatment in the manufacture of a semiconductor device utilizing extremely small off-state current of a transistor including an oxide semiconductor.

Note that drain current obtained by extrapolation is different from actual drain current in some cases. For example, in the case where hydrogen enters a transistor including an oxide semiconductor, drain current obtained by extrapolation is lower than actual drain current in some cases. This indicates that a drastic reduction in hydrogen that might enter an oxide semiconductor is important in order to improve electrical characteristics of a transistor including an oxide semiconductor.

Example 3

In this example, off-state current of an ideal transistor with no leakage current of a gate insulating film, no trap states, and no parasitic resistance was calculated and evaluated.

First, a structure of the transistor is described.

Figure 46:
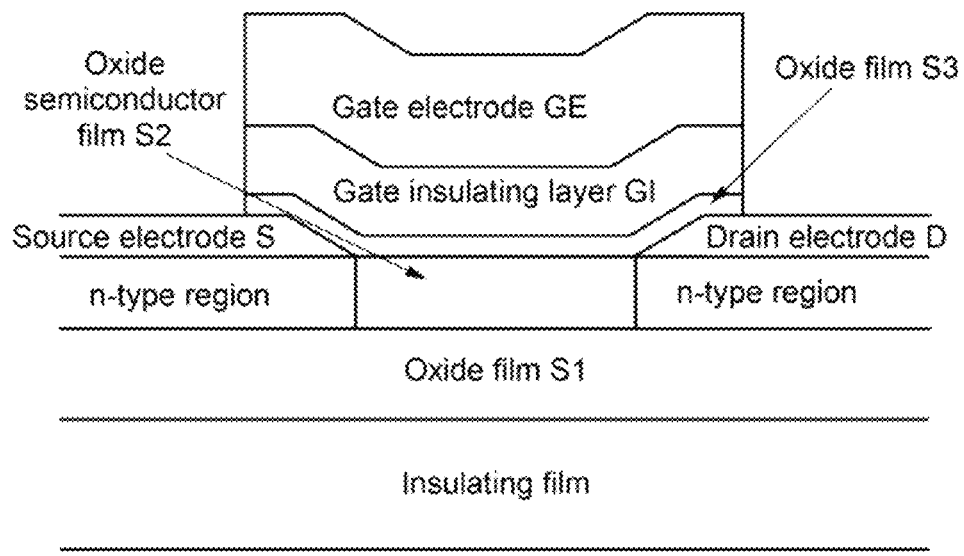
FIG. 46 is a schematic cross-sectional view of a transistor in an example.

FIG. 46 is a cross-sectional view of the transistor in the channel length direction. N-type regions (also referred to as low-resistance regions) in contact with a source electrode and a drain electrode are provided in an entire region of an oxide semiconductor film S2 overlapped with the source electrode and the drain electrode. The transistor had a channel length L of 0.8 μm, a channel width W of 1 nm, and a width Lov of a region where a gate electrode overlaps the source electrode or the drain electrode of 0.2 μm.

Next, calculation conditions are described.

The calculation was performed under conditions shown in Table 1, using Sentaurus Device produced by Synopsys, Inc.

TABLE 1

| Structure | L | 0.8 μm | |
|---|---|---|---|
| | Lov | 0.2 μm | |
| | W | 1 nm | |
| GI | Relative dielectric constant | 4.1 | |
| | Thickness | 20 nm | |
| S3 | Composition ratio | IGZO (132) | |
| | Electron affinity | 4.4 eV | |
| | Eg | 3.6 eV | |
| | Relative dielectric constant | 15 | |
| | Donor density | 6.60E−9 cm$^{-3}$ | |
| | Electron mobility | 0.1 cm$^2$/Vs | |
| | Hole mobility | 0.01 cm$^2$/Vs | |
| | Nc | 5.00E+18 cm$^{-3}$ | |
| | Nv | 5.00E+18 cm$^{-3}$ | |
| | Thickness | 5 nm | |
| S2 | Composition ratio | IGZO (111) | IGZO(312) |
| | Electron affinity | 4.6 eV | |
| | Eg | 3.2 eV | 2.8 eV |
| | Relative dielectric constant | 15 | |
| | Donor density of channel portion | 6.60E−9 cm$^{-3}$ | |
| | Donor density of portion under S/D electrode | 5.00E+18 cm$^{-3}$ | |
| | Electron mobility | 10 cm$^2$/Vs | 20 cm$^2$/Vs |
| | Hole mobility | 0.01 cm$^2$/Vs | |
| | Nc | 5.00E+18 cm$^{-3}$ | |
| | Nv | 5.00E+18 cm$^{-3}$ | |
| | Thickness | 15 nm | |
| S1 | Composition ratio | IGZO (132) | |
| | Thickness | 20 nm | |
| Insulating film | Relative dielectric constant | 4.1 | |
| | Thickness | 230 nm | |
| GE | Work function | 5 eV | |
| | Thickness | 165 nm | |
| S/D | Work function | 4.6 eV | |
| | Thickness | 100 nm | |

* IGZO(111) . . . oxide target with In:Ga:Zn = 1:1:1 (composition ratio)
* IGZO(132) . . . oxide target with In:Ga:Zn = 1:3:2 (composition ratio)
* IGZO(312) . . . oxide target with In:Ga:Zn = 3:1:2 (composition ratio)

In Table 1, GI represents a gate insulating film; S3, an oxide film; S2, an oxide semiconductor film; S1, an oxide film; GE, a gate electrode; and S/D, a source electrode and a drain electrode.

Figure 47:
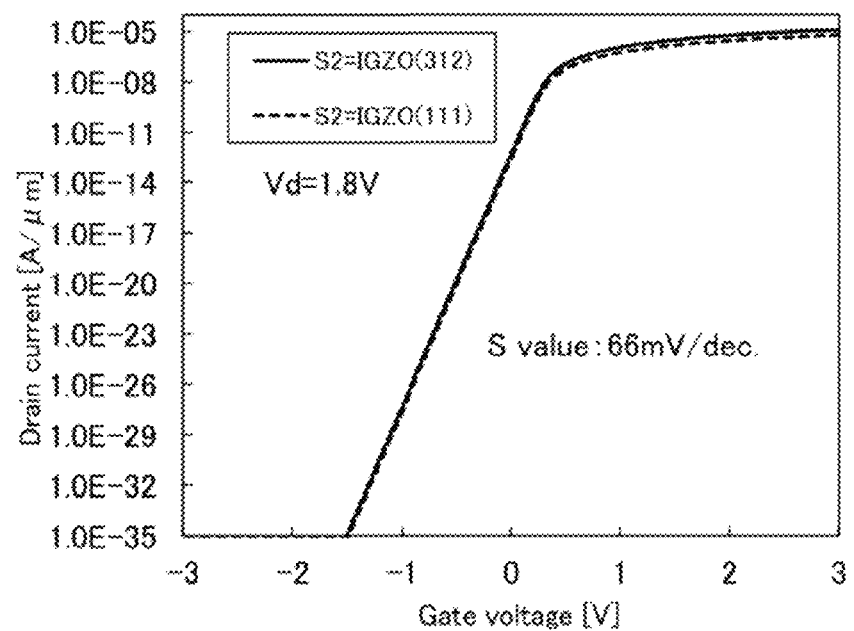
FIG. 47 shows the $V_g$-$I_d$ characteristics of an ideal transistor.

FIG. 47 shows $V_g$-$I_d$ characteristics and an S value at a drain voltage $V_d$ of 1.8 V.

As shown in FIG. 47, the off-state current of both of the ideal transistor using IGZO (111) for the oxide semiconductor film S2 and the ideal transistor using IGZO (312) for the oxide semiconductor film S2 was reduced to approximately 1×10$^{-35}$ A/μm that is a calculable limit value. In addition, the S value of the transistors was able to be estimated at 66 mV/dec.

Example 4

In this example, electrical characteristics of a transistor of one embodiment of the present invention are described.
[Sample]
Sample 5 used for measurement is described below.

For Sample 5, a transistor including an oxide semiconductor was manufactured over a single crystal substrate through steps similar to those after the step of forming the silicon oxynitride film containing excess oxygen in the method for manufacturing Sample 1 and Sample 2 described in Example 1.

The method for manufacturing Sample 5 is different from the manufacturing method described in Example 1 in that the thickness of a silicon oxynitride film containing excess oxygen is 300 nm, the thickness of a second oxide semiconductor film is 15 nm, the thickness of a silicon oxynitride film functioning as a gate insulating film is 10 nm, and the thickness of an aluminum oxide film is 70 nm.
[Measurement of Off-State Current]

Next, a method for measuring off-state current of Sample 5 manufactured in the above manner and the measurement results are described with reference to FIG. 48, FIGS. 49A and 49B, FIG. 50, and FIGS. 51A and 51B.
[Measurement System]

Figure 48:
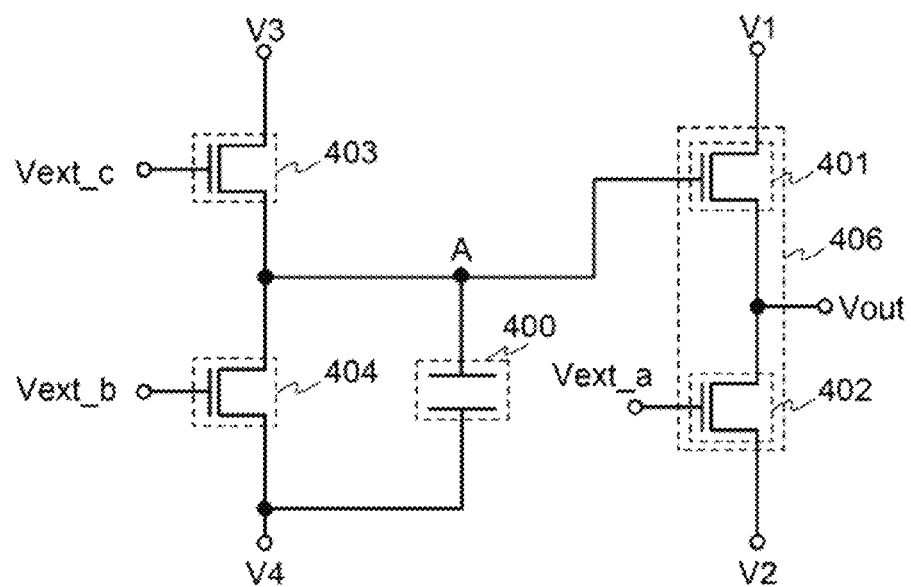
FIG. 48 is a circuit diagram showing an example of a measurement system.

A measurement system shown in FIG. 48 includes a capacitor 400, a transistor 401, a transistor 402, a transistor 403, and a transistor 404. Here, the transistor 403 is a transistor for injection of charge and the transistor 404 is a transistor for evaluation of leakage current. The transistor 401 and the transistor 402 form an output circuit 406. A point where a source terminal (or drain terminal) of the transistor 403, a drain terminal (or source terminal) of the transistor 404, a first terminal of the capacitor 400, and a gate terminal of the transistor 401 were connected to each other is referred to as a node A.

When the transistor for injection of charge and the transistor for evaluation are separately provided, the transistor for evaluation can be always kept in an off state at the time of injection of charge. In the case where the transistor for injection of charge is not provided, the transistor for evaluation needs to be turned on once at the time of injection of charge; accordingly, it takes longer time for measurement when an element taking time to be in a steady state of an off state from an on state is used. In addition, the transistor for evaluation does not need to be turned on once, so that influence of change in the potential of the node A caused by flow of part of the charge in a channel formation region of the transistor into the node A is prevented.

The channel width W of the transistor for evaluation is preferably larger than that of the transistor for injection of charge. When the channel width W of the transistor for evaluation is larger than that of the transistor for injection of charge, leakage current other than leakage current of the transistor for evaluation can be relatively reduced. As a result, the leakage current of the transistor for evaluation can be measured with high accuracy.

In the measurement system shown in FIG. 48, the source terminal (or drain terminal) of the transistor 403, the drain terminal (or source terminal) of the transistor 404, and the first terminal of the capacitor 400 are connected to the gate terminal of the transistor 401. A second terminal of the capacitor 400 and a source terminal (or drain terminal) of the transistor 404 are connected to each other. A drain terminal (or source terminal) of the transistor 401 is connected to a power source, a source terminal (or drain terminal) of the transistor 402 is connected to a power source, and a drain terminal (or source terminal) of the transistor 403 is connected to a power source.

In the measurement system shown in FIG. 48, a potential $V_3$ is applied from the power source to the drain terminal (or source terminal) of the transistor 403, and a potential $V_4$ is applied from the power source to the source terminal (or drain terminal) of the transistor 404. A potential $V_1$ is applied from the power source to the drain terminal (or source terminal) of the transistor 401, and a potential $V_2$ is applied from the power source to the source terminal (or drain terminal) of the transistor 402. An output potential $V_{out}$ is output from a terminal corresponding to an output terminal of the output circuit 406 to which a source terminal (or drain terminal) of the transistor 401 and a drain terminal (or source terminal) of the transistor 402 are connected.

In the above structure, a potential $V_{ext\_a}$ for adjusting the output circuit 406 is applied to a gate terminal of the transistor 402, a potential $V_{ext\_c}$ for controlling the on/off of the transistor 403 is applied to a gate terminal of the transistor 403, a potential $V_{ext\_b}$ for controlling a state of the transistor for evaluation is applied to a gate terminal of the transistor 404.

Note that in FIG. 48, the capacitor 400 is not necessarily provided. In that case, the gate terminal of the transistor 401, the source terminal (or drain terminal) of the transistor 403, and the drain terminal (or source terminal) of the transistor 404 are connected to each other at the node A.

[Method for Measuring Current]

Figure 49A:
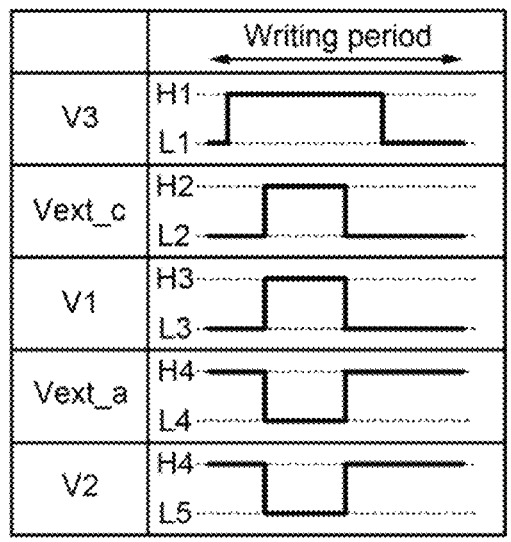
FIGS. 49A and 49B are views (timing charts) showing potentials relating to operation of a measurement system.
Figure 49B:
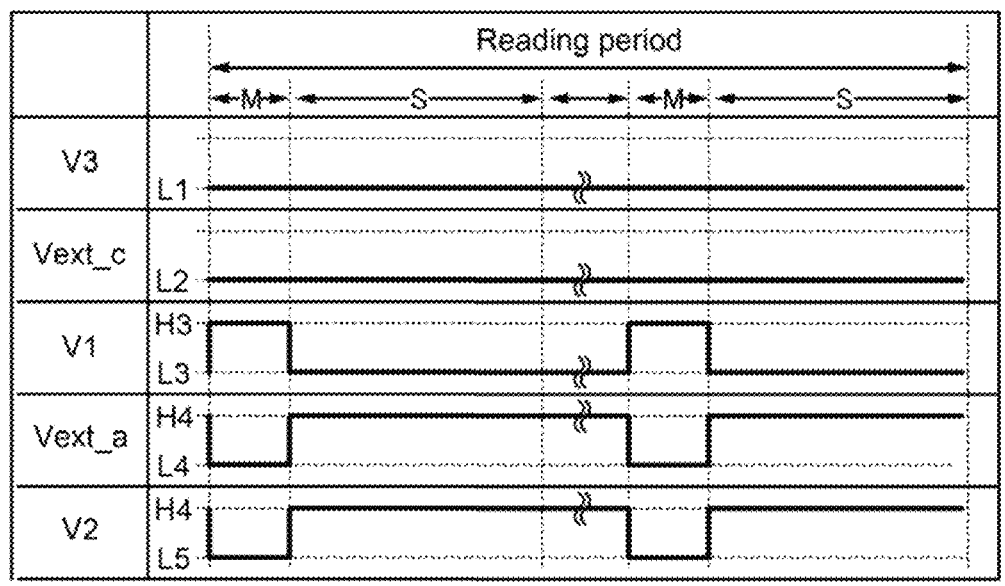

Next, an example of a method for measuring current using the above-described measurement system is described with reference to FIGS. 49A and 49B.

First, a writing period in which a potential difference is applied to measure the off-state current is briefly described with reference to FIG. 49A.

In the writing period, the potential $V_3$ was input to the drain terminal (or source terminal) of the transistor 403 and the potential $V_{ext\_c}$ for turning on the transistor 403 was then input to the gate terminal of the transistor 403, so that the potential $V_3$ was applied to the node A connected to the drain terminal (or source terminal) of the transistor 404. The potential $V_{ext\_a}$ for turning on the transistor 402 was input, whereby the transistor 402 was turned on. The potential $V_{ext\_b}$ for turning off the transistor 404 was input, whereby the transistor 404 was turned off.

Here, the potential $V_3$ was set to a high potential (H1) and the potential $V_{ext\_c}$ was set to a high potential (H2). The potential $V_1$ was set to a high potential (H3). The potential $V_{ext\_a}$ was set to a low potential (L4), the potential $V_2$ was set to a low potential (L5), the potential $V_{ext\_b}$ was set to a low potential (L2), and the potential $V_4$ was set to $V_{ss}$.

Then, the potential $V_{ext\_a}$ for turning off the transistor 402 was input, whereby the transistor 402 was turned off. The potential $V_2$ was set to a high potential (H4) and the potential $V_1$ was set to a low potential (L3). Here, the potential $V_2$ was the same potential as the potential $V_1$. Next, the potential $V_3$ was set to a low potential (L). The potential $V_{ext\_c}$ for turning off the transistor 403 was input to the gate terminal of the transistor 403, whereby the transistor 403 was turned off.

Here, the potential $V_{ext\_c}$ was set to a low potential (L2), the potential $V_{ext\_a}$ was set to a high potential (H4), the potential $V_3$ was set to a low potential (L1), the potential $V_1$ was set to a low potential (L3), and the potential $V_2$ was set to a high potential (H4). The potential $V_{ext\_b}$ was set to a low potential (L2), and the potential $V_4$ was set to $V_{ss}$.

Thus, the writing period was completed. In a state where the writing period was completed, the transistor 404 was off but a potential difference was generated between the node A and the source terminal (drain terminal) of the transistor 404. Thus, a slight amount of current flowed in the transistor 404. That is, the off-state current (i.e., leakage current) flowed.

Next, a reading period was started. In the reading period, the amount of change in the potential of the node A due to change in the amount of electric charge retained in the node A was measured. The operation in the reading period is described with reference to FIG. 49B.

When the reading period was started, the amount of electric charge retained in the capacitor connected to the node A changes over time, and the potential of the node A thus changed. This means that the potential of the input terminal of the output circuit 406 changed. Consequently, the potential of the output terminal of the output circuit 406 also changed over time.

Note that in the reading period, it is preferable that a measurement period M for measuring the amount of change in the potential of the node A and a storage period S for storing electric charge in the node A be performed repeatedly. When the measurement of the amount of change in the potential of the node A and the storage of electric charge of the node A are performed repeatedly, it can be confirmed that the measured value of voltage is a value in a steady state. In other words, the transient current (a current component that decreases over time after the measurement starts) can be removed from a current $I_A$ flowing through the node A. Consequently, the leakage current can be measured with higher accuracy.

When the relationship between $V_A$ denoting the potential of the node A, and the output potential $V_{out}$ is obtained in advance, the potential $V_A$ can be obtained from the output potential $V_{out}$. In general, $V_A$ denoting the potential of the node A can be measured as a function of the output potential $V_{out}$ and expressed by the following equation.

$$V_A = F(Vout) \qquad \text{[Equation 1]}$$

Electric charge $Q_A$ denoting the electric charge in the capacitor connected to the node A can be expressed by the following equation using the potential $V_A$, $C_A$ denoting the capacitance of the capacitor connected to the node A, and a constant (const). Here, the capacitance $C_A$ of the capacitor connected to the node A is the sum of the capacitance of the capacitor 400 and other capacitance (e.g., the input capacitance of the output circuit 406).

$$Q_A = C_A V_A + \text{const} \qquad \text{[Equation 2]}$$

Current $I_A$ of the node A is the time derivatives of electric charge flowing to the node A (or electric charge flowing from the node A), so that the current $I_A$ of the node A is expressed by the following equation.

$$I_A \equiv \frac{\Delta Q_A}{\Delta t} = \frac{C_A \cdot \Delta F(Vout)}{\Delta t} \qquad \text{[Equation 3]}$$

As described above, the current $I_A$ flowing through the node A can be obtained from the capacitance $C_A$ connected to the node A, the output potential $V_{out}$ of the output circuit 406, and change over time Δt.

Note that the current $I_4$ is the sum of current $I_{dev}$ flowing in the transistor 404, and current $I_{leak}$ that is current other than the current $I_{dev}$, so that in order to obtain the current $I_{dev}$ with high accuracy, the measurement is preferably carried out with a measurement system in which the current $I_{leak}$ is sufficiently smaller than the current $I_{dev}$. Alternatively, the accuracy in obtaining the current $I_{dev}$ may be increased by estimating the current $I_{leak}$ and then subtracting it from the current $I_4$.

Here, in the measurement period M, the potential $V_2$ was set to a low potential (L5) and the potential $V_{ext\_a}$ was set to a low potential (L4), whereby the transistor 402 was turned on. Note that in order to turn on the transistor 402, the low potential (L4) of the potential $V_{ext\_a}$ was higher than the low potential (L5) of the potential $V_2$. The potential $V_1$ was set to a high potential (H3). The potential $V_{ext\_c}$ was set to a low potential (L2), and the potential $V_3$ was set to a low potential (L1). The potential $V_{ext\_b}$ was set to a low potential (L2) and the potential $V_4$ was set to $V_{ss}$.

In the storage period S, the potential $V_2$ is set to a high potential (H4) and the potential $V_{ext\_a}$ is set to a high potential (H4), whereby the transistor 402 is turned off. The potential $V_1$ is set to a low potential (L3). Note that the potential $V_1$, the potential $V_2$, and the potential $V_{ext\_a}$ were the same potentials. The potential $V_{ext\_c}$ is set to a low potential (L2) and the potential $V_3$ is set to a low potential (L1). The potential $V_{ext\_b}$ is set to a low potential (L2) and the potential $V_4$ is set to $V_{ss}$.

Minute current flowing through the transistor 404 can be measured by the above-described method.

In this example, the transistors 401 and 402 each had a channel length L of 3 μm and a channel width W of 100 μm, the transistor 403 had a channel length L of 10 μm and a channel width W of 10 μm, and the transistor 404 had a channel length L of 0.8 μm and a channel width W of 10000 μm. Note that each transistor was manufactured under the same condition as Sample 1.

Next, a measurement sequence is described. Two types of measurement sequences were used as the measurement sequence.

In the first sequence, a cycle in which the measurement temperature was 125° C., Δt used in calculation of current I flowing in the transistor was 1 hour, and the writing period was provided per Δt was repeated 10 times. Then, a cycle in which the measurement temperature was 85° C., Δt was 6 hours, and the writing period was provided per Δt was repeated 4 times.

In the second sequence, a cycle in which the measurement temperature was 150° C., Δt was 1 hour, and the writing period was provided per Δt was repeated 10 times. Then, a cycle in which the measurement temperature was 125° C., Δt was 1 hour, and the writing period was provided per Δt was repeated 10 times. After that, a cycle in which the measurement temperature was 85° C., Δt was 6 hours, and the writing period was provided per Δt was repeated 4 times. Then, a cycle in which the measurement temperature was 85° C., Δt was 12 hours, and the writing period was provided per Δt was repeated 3 times. Then, a cycle in which the measurement temperature was 60° C., Δt was 60 hours, and the writing period was provided per Δt was performed once.

Note that in this example, in the writing period, the high potential (H1) of the potential $V_3$ was set to 2 V and the low potential (L1) of the potential $V_3$ was set to 1 V. The high potential (H2) of the potential $V_{ext\_c}$ was set to 5 V and the low potential (L2) thereof was set to −3 V. The high potential (H3) of the potential $V_1$ was set to 3 V and the low potential (L3) thereof was set to 1.5 V. The high potential (H4) of the potential $V_{ext\_a}$ was set to 1.5 V and the low potential (L4) thereof was set to −1 V. The high potential (H4) of the potential $V_2$ was set to 1.5 V and the low potential (L5) thereof was set to −2 V. The potential $V_{ext\_b}$ was set to −3 V and the transistor 404 was thus turned off, and the potential $V_4$ was set to 1 V. Here, a voltage of 2 V was applied to the node A.

In a reading period, a measurement period M for 10 seconds and a storage period S for 290 seconds were collectively regarded as one cycle, and the reading operation was repeatedly performed, so that the output potential $V_{out}$ was measured.

In this example, in the reading period, the high potential (H1) of the potential $V_1$ was set to 5 V and the low potential (L1) thereof was set to 1.5 V. The high potential (H4) of the potential $V_{ext\_a}$ was set to 1.5 V and the low potential (L4) thereof was set to −1 V. The high potential (H4) of the potential $V_2$ was set to 1.5 V and the low potential (L5) thereof was set to −2 V. The low potential (L2) of the potential $V_3$ was set to 1 V. The low potential (L2) of the potential $V_{ext\_c}$ was set to −3 V. The potential $V_{ext\_b}$ was set to −3 V and the transistor 404 was thus turned off, and the potential $V_4$ was set to 1 V.

Figure 50:
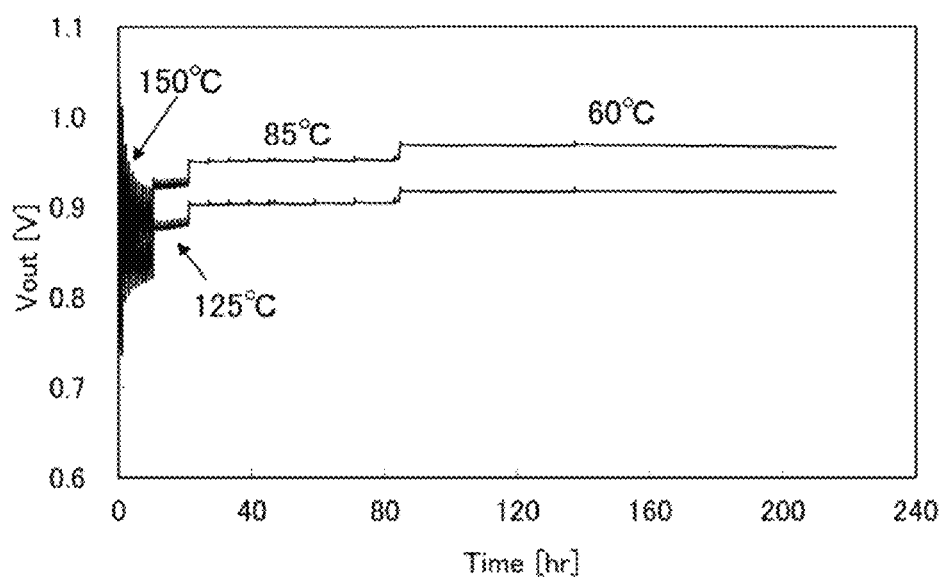
FIG. 50 shows results of measurement of off-state current.

FIG. 50 shows, as an example of the measurement data, the relationship between the elapsed time and the output voltage $V_{out}$ of the output circuit 406 in the second measurement sequence. As shown in FIG. 50, the potential changes as time passes.

Figure 51A:
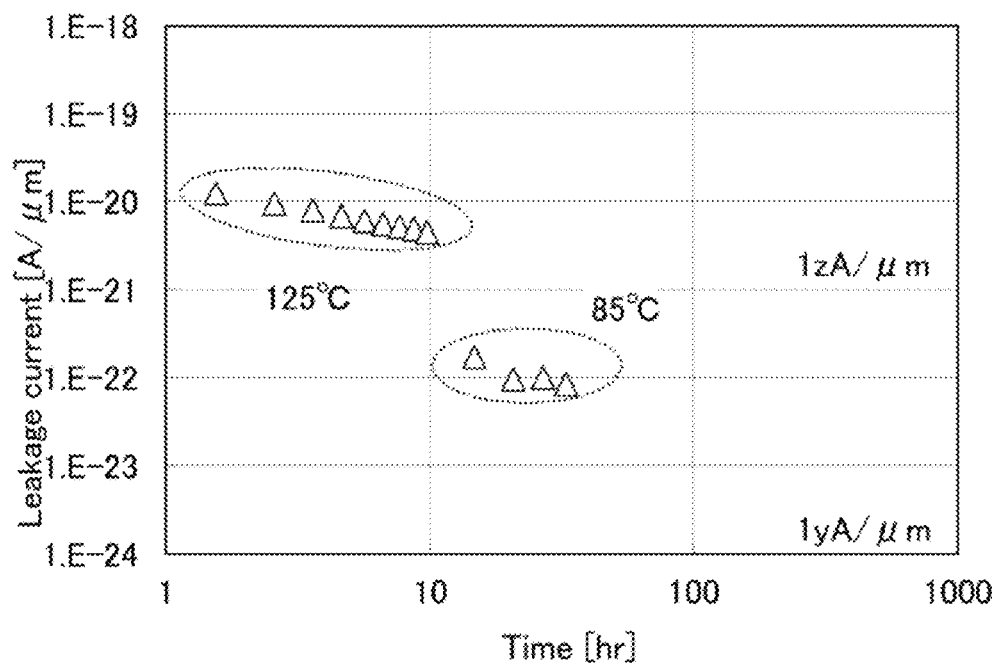
FIGS. 51A and 51B each show results of measurement of off-state current.
Figure 51B:
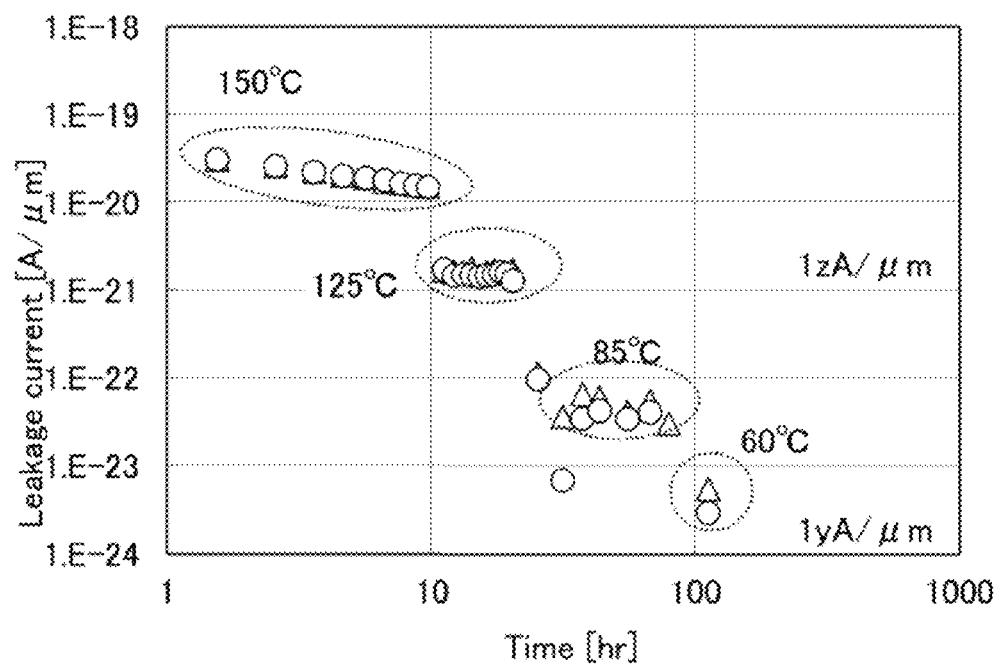

FIGS. 51A and 51B show leakage current calculated by the measurement of the output potential $V_{out}$. FIG. 51A shows measurement results of the first measurement sequence, and FIG. 51B shows measurement results of the second measurement sequence. Note that FIGS. 51A and 51B show the relationship between the elapsed time and the leakage current flowing between the source electrode and the drain electrode.

As shown in FIGS. 51A and 51B, the value of the leakage current tends to gradually decrease shortly after the start of the measurement and to converge on a specific value. In the condition having the highest measurement temperature, the value of the lowest measured current was regarded as the leakage current due to the temperature.

As shown in FIG. 51A, the leakage current was lower than $5 \times 10^{-21}$ A/μm (5 zA/μm) at a measurement temperature of 125° C., and the leakage current was lower than $1 \times 10^{-22}$ A/μm (100 yA (yoctoampere)/μm) at a measurement temperature of 85° C. Note that 1 yA equals $10^{-24}$ A.

As shown in FIG. 51B, the leakage current at a measurement temperature of 150° C. was lower than $1.5 \times 10^{-20}$ A/μm (15 zA (zeptoampere)/μm), the leakage current at a measurement temperature of 125° C. was lower than $2 \times 10^{-21}$ A/μm (2 zA/μm), the leakage current at a measurement temperature of 85° C. was lower than $5 \times 10^{-23}$ A/μm (50 yA/μm), and the leakage current at a measurement temperature of 60° C. was lower than $6 \times 10^{-24}$ A/μm (6 yA/μm). Note that 1 zA equals $10^{-21}$ A.

It was found from the above results that influence of a transitional change in current can be suppressed effectively and original leakage current of the transistor can be measured by increasing the measurement temperature at the start of the measurement.

As described above, this example reveals that the off-state current is sufficiently small in a transistor including a highly purified oxide semiconductor whose oxygen vacancies are reduced.

Figure 52:
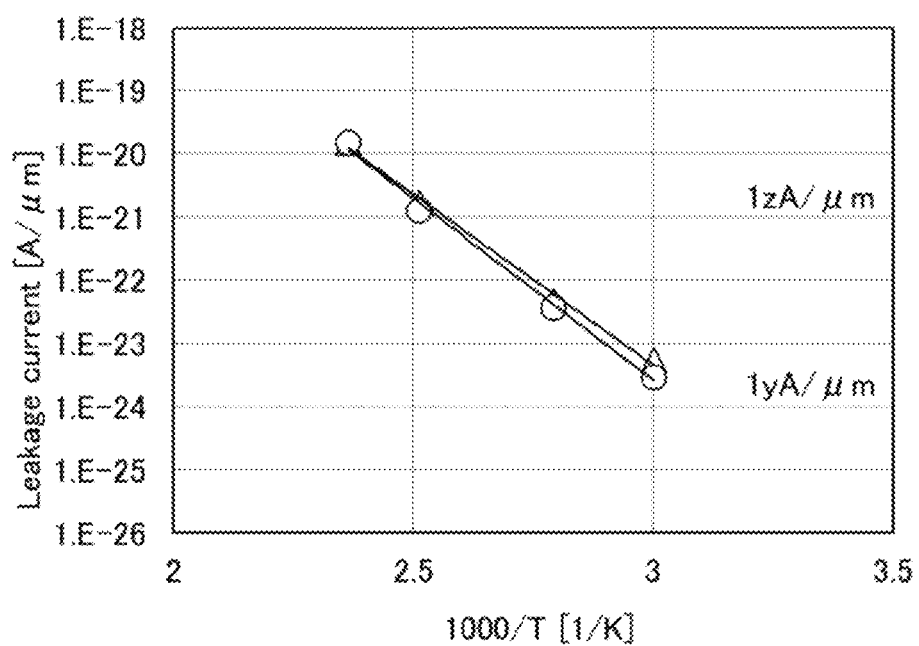
FIG. 52 is an Arrhenius plot diagram for showing off-state current.

FIG. 52 shows an Arrhenius plot of the leakage current shown in FIG. 51B. As shown in FIG. 52, the temperature dependence of the leakage current measured above is expressed as a straight line and the activation energy was substantially constant; thus, the measured values were found to be reasonable.

Example 5

In this example, off-state current of Sample 6 manufactured by a method similar to that of Sample 1 described in Example 1 was measured.

The off-state current was measured by a method similar to that described in Example 4. The first measurement sequence was used.

Figure 53A:
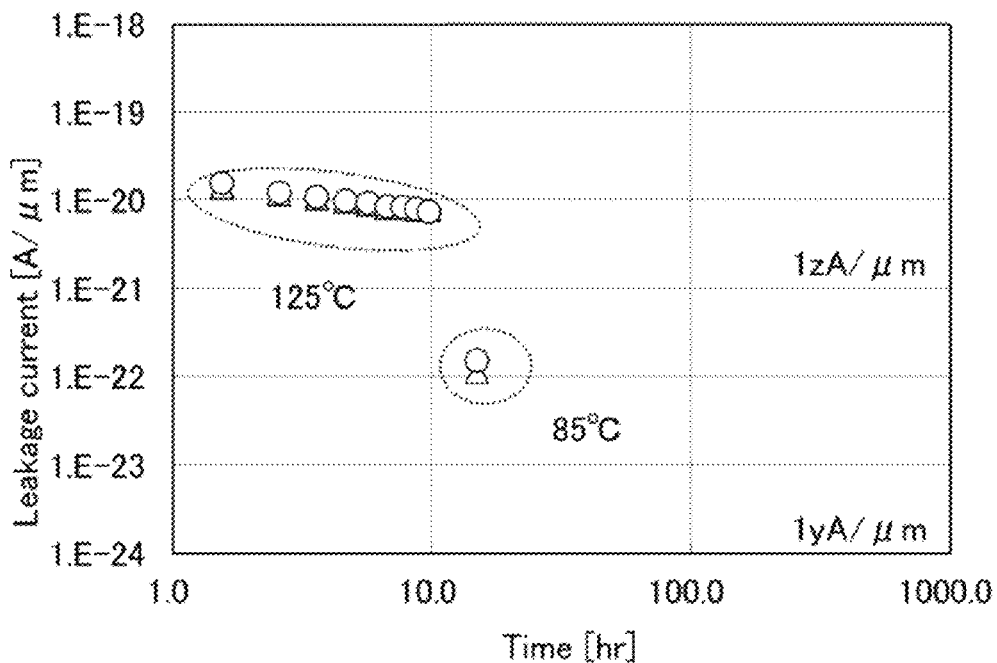
FIG. 53A illustrates results of measurement of off-state current and FIG. 53B is an Arrhenius plot diagram for showing off-state current.
Figure 53B:
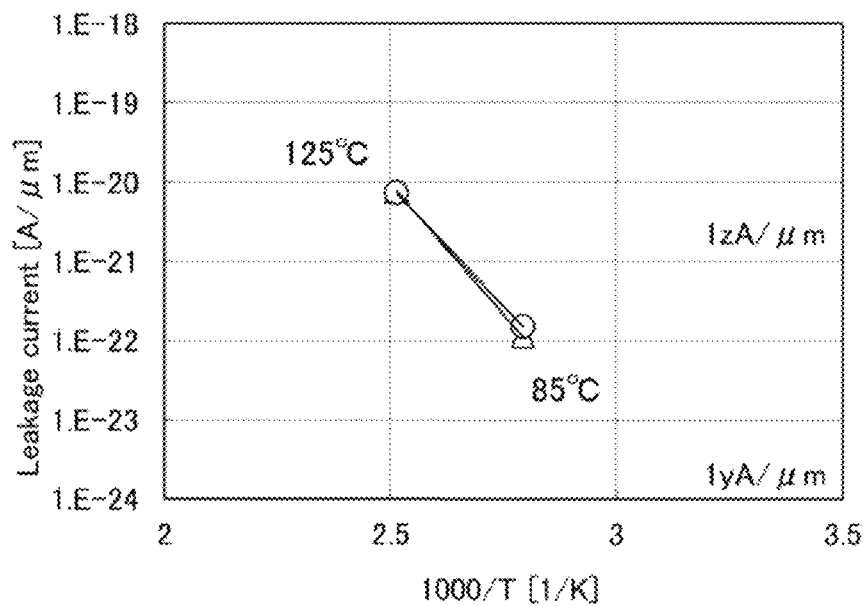

FIG. 53A shows leakage current calculated by the measurement of output potential $V_{out}$. FIG. 53B shows an Arrhenius plot of the leakage current shown in FIG. 53A. As shown in FIGS. 53A and 53B, the leakage current at a measurement temperature of 125° C. was lower than $1 \times 10^{-20}$ A/μm (10 zA/μm), and the leakage current at a measurement temperature of 85° C. was lower than $2 \times 10^{-22}$ A/μm (200 yA/μm).

The above results reveal that the off-state current of a transistor including an oxide semiconductor in the semiconductor device of one embodiment of the present invention can be sufficiently small even when a transistor including single crystal semiconductor is provided below the transistor including an oxide semiconductor.

Reference Example

As a reference example, necessary retentions years and target (required) leakage current at 85° C. of devices are described.

Figure 54:
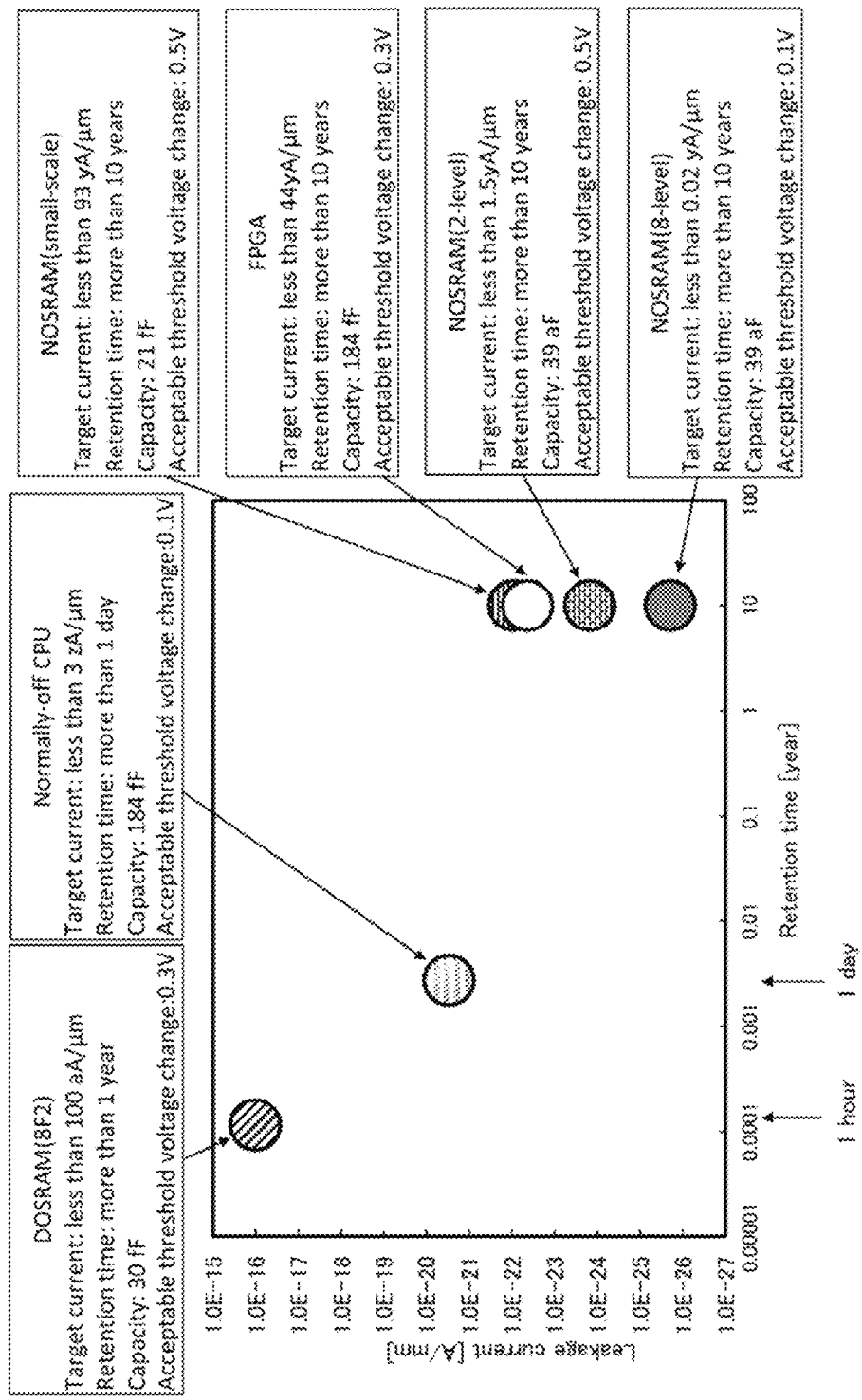
FIG. 54 shows required retention times of devices and target leakage currents of transistors.

The required retention years of the devices and the target leakage current at 85° C. thereof are described with reference to FIG. 54.

A semiconductor device shown in FIG. 34B is a memory device that is called a dynamic oxide semiconductor random access memory (DOSRAM) and includes a transistor including an oxide semiconductor as a selection transistor (a transistor as a switching element) of a memory cell.

In a DOSRAM in which the area occupied by one memory cell is $8F^2$ (F=minimum feature size), the target current of the transistor is lower than 100 aA/μm, the electric potential retention time is 1 hour or longer, the capacitance for retaining electric potential is 30 fF, and the acceptable threshold voltage change is 0.3 V.

In the normally-off CPUs shown in FIG. 36 and FIG. 37, the target current of a transistor is lower than 3 zA/μm, the electric potential retention time is 1 day or longer, the capacitance for retaining electric potential is 184 fF, and the acceptable threshold voltage change is 0.1 V.

The semiconductor device illustrated in FIGS. 2A and 2B and the like is called a nonvolatile oxide semiconductor random access memory (NOSRAM). In a small-scale NOSRAM, the target current of a transistor is lower than 93 yA/μm, the electric potential retention time is 10 years or longer, the capacitance for retaining electric potential is 21 fF, and the acceptable threshold voltage change is 0.5 V. In a 2-level NOSRAM, the target current of a transistor is lower than 1.5 yA/μm, the electric potential retention time is 10 years or longer, the capacitance for retaining electric potential is 39 aF, and the acceptable threshold voltage change is 0.5 V. In an 8-level NOSRAM, the target current of a transistor is lower than 0.02 yA/μm, the electric potential retention time is 10 years or longer, the capacitance for retaining electric potential is 39 aF, and the acceptable threshold voltage change is 0.1 V.

In an FPGA, the target current of a transistor is lower than 44 yA/μm, the electric potential retention time is 10 years or longer, the capacitance for retaining electric potential is 184 fF, and the acceptable threshold voltage change is 0.3 V.

EXPLANATION OF REFERENCE

10: stacked-layer structure, 11: layer, 12: layer, 21: insulating layer, 22: insulating layer, 24: electron, 28: substance, 31: wiring layer, 32: wiring layer, 41: barrier layer, 100: transistor, 101a: oxide layer, 101b: oxide layer, 102: semiconductor layer, 103a: electrode, 103b: electrode, 104: gate insulating layer, 105: gate electrode, 107: insulating layer, 108: insulating layer, 110: transistor, 111: semiconductor substrate, 112: semiconductor layer, 113a: low-resistance layer, 113b: low-resistance layer, 114: gate insulating layer, 115: gate electrode, 120: barrier layer, 121: insulating layer, 122: insulating layer, 123: insulating layer, 124: insulating layer, 125: insulating layer, 126: insulating layer, 130: capacitor, 131: wiring, 132: wiring, 133: wiring, 134: wiring, 140: insulating layer, 141: wiring, 142: wiring, 151: wiring, 152: wiring, 160: transistor, 161: plug, 162: plug, 163: plug, 164: plug, 165: plug, 166: plug, 167: plug, 174: conductive layer, 180: transistor, 204: gate electrode, 206: oxide semiconductor film, 216a: conductive film, 216b: conductive film, 220: conductive film, 260: opening, 400: capacitor, 401: transistor, 402: transistor, 403: transistor, 404: transistor, 406: output circuit, 610: electron gun chamber 612: optical system, 614: sample chamber, 616: optical system, 618: camera, 620: observation chamber, 622: film chamber, 632: fluorescent plate, 700: substrate, 701: pixel portion, 702: scan line driver circuit, 703: scan line driver circuit, 704: signal line driver circuit, 710: capacitor wiring, 712: gate wiring, 713: gate wiring, 714: drain electrode layer, 716: transistor, 717: transistor, 718: liquid crystal element, 719: liquid crystal element, 720: pixel. 721: switching transistor, 722: driver transistor, 723: capacitor, 724: light-emitting element, 725: signal line, 726: scan line, 727: power supply line, 728: common electrode, 800: RFID tag, 801: communication device, 802: antenna, 803: wireless signal, 804: antenna, 805: rectifier circuit, 806: constant voltage circuit, 807: demodulation circuit, 808: modulation circuit, 809: logic circuit, 810: memory circuit, 811: ROM 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: refrigerator door, 933: freezer door, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199, ROM 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 3001: wiring, 3002: wiring, 3003: wiring, 3004: wiring, 3005: wiring, 3200: transistor, 3300: transistor, 3400: capacitor, and 4000: RFID.

This application is based on Japanese Patent Application serial No. 2013-219683 filed with the Japan Patent Office on Oct. 22, 2013, Japanese Patent Application serial No. 2013-219679 filed with the Japan Patent Office on Oct. 22, 2013, and Japanese Patent Application serial No. 2013-219680 filed with the Japan Patent Office on Oct. 22, 2013, the entire contents of which are hereby incorporated by reference.

The invention claimed is:

1. A semiconductor device comprising:
   a first transistor;
   a second transistor over the first transistor;
   a capacitor;
   a barrier layer between the first transistor and the second transistor;
   a first wiring between the first transistor and the barrier layer; and
   a second wiring between the barrier layer and the second transistor and overlapping the first wiring with the barrier layer therebetween,
   wherein the first wiring, the barrier layer, and the second wiring form the capacitor,
   wherein a first semiconductor layer included in the first transistor is made of a single crystal semiconductor and comprises a channel formation region of the first transistor, and
   wherein a second semiconductor layer included in the second transistor comprises an oxide semiconductor and a channel formation region of the second transistor.

2. The semiconductor device according to claim 1, wherein the barrier layer comprises at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

3. The semiconductor device according to claim 1, further comprising:
   an insulating layer comprising an oxide between the second transistor and the barrier layer,
   wherein the insulating layer includes a region having a higher oxygen proportion than a stoichiometric composition of a material composing the region of the insulating layer.

4. The semiconductor device according to claim 1, further comprising:
   a third electrode comprising a same material and on and in contact with a same surface as the second wiring,
   wherein the channel formation region of the second transistor overlaps the third electrode.

5. An electronic appliance comprising the semiconductor device according to claim 1.

6. The semiconductor device according to claim 1, further comprising:
   a first insulating layer between the first transistor and the barrier layer; and
   a second insulating layer between the second transistor and the barrier layer.

7. A semiconductor device comprising:
   a first transistor;
   a second transistor over the first transistor;
   a capacitor;
   a barrier layer between the first transistor and the second transistor;
   a first wiring between the first transistor and the barrier layer; and
   a second wiring between the barrier layer and the second transistor and overlapping the first wiring with the barrier layer therebetween,
   wherein a gate electrode of the first transistor, the first wiring, one of a source electrode and a drain electrode of the second transistor are electrically connected to one another,
   wherein the first wiring, the barrier layer, and the second wiring form the capacitor,
   wherein a first semiconductor layer included in the first transistor is made of a single crystal semiconductor and comprises a channel formation region of the first transistor, and
   wherein a second semiconductor layer included in the second transistor comprises an oxide semiconductor and a channel formation region of the second transistor.

8. The semiconductor device according to claim 7, wherein the barrier layer comprises at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

9. The semiconductor device according to claim 7, further comprising:
   an insulating layer comprising an oxide between the second transistor and the barrier layer,
   wherein the insulating layer includes a region having a higher oxygen proportion than a stoichiometric composition of a material composing the region of the insulating layer.

10. The semiconductor device according to claim 7, further comprising:
    a third electrode comprising a same material and on and in contact with a same surface as the second wiring,
    wherein the channel formation region of the second transistor overlaps the third electrode.

11. An electronic appliance comprising the semiconductor device according to claim 7.

12. The semiconductor device according to claim 7, further comprising:
    a first insulating layer between the first transistor and the barrier layer; and
    a second insulating layer between the second transistor and the barrier layer.

13. A semiconductor device comprising:
    a first transistor;
    a second transistor over the first transistor;
    a capacitor;
    a barrier layer between the first transistor and the second transistor;
    a first wiring between the first transistor and the barrier layer; and
    a second wiring between the barrier layer and the second transistor and overlapping the first wiring with the barrier layer therebetween,
    wherein a gate electrode of the first transistor, the second wiring, one of a source electrode and a drain electrode of the second transistor are electrically connected to one another,
    wherein the first wiring, the barrier layer, and the second wiring form the capacitor,
    wherein a first semiconductor layer included in the first transistor is made of a single crystal semiconductor and comprises a channel formation region of the first transistor, and
    wherein a second semiconductor layer included in the second transistor comprises an oxide semiconductor and a channel formation region of the second transistor.

14. The semiconductor device according to claim 13, wherein the barrier layer comprises at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

15. The semiconductor device according to claim 13, further comprising:
an insulating layer comprising an oxide between the second transistor and the barrier layer,
wherein the insulating layer includes a region having a higher oxygen proportion than a stoichiometric composition of a material composing the region of the insulating layer.

16. The semiconductor device according to claim 13, further comprising:
a third electrode comprising a same material and on and in contact with a same surface as the second wiring,
wherein the channel formation region of the second transistor overlaps the third electrode.

17. An electronic appliance comprising the semiconductor device according to claim 13.

18. The semiconductor device according to claim 13, further comprising:
a first insulating layer between the first transistor and the barrier layer; and
a second insulating layer between the second transistor and the barrier layer.

19. A semiconductor device comprising:
a first transistor;
a second transistor over the first transistor;
a capacitor;
a barrier layer between the first transistor and the second transistor;
a first wiring between the first transistor and the barrier layer; and
a second wiring between the barrier layer and the second transistor and overlapping the first wiring with the barrier layer therebetween,
wherein a gate electrode of the first transistor, the first wiring, one of a source electrode and a drain electrode of the second transistor are electrically connected to one another,
wherein the first wiring, the barrier layer, and the second wiring form the capacitor,
wherein a first semiconductor layer included in the first transistor is made of a single crystal semiconductor and comprises a channel formation region of the first transistor,
wherein a second semiconductor layer included in the second transistor comprises an oxide semiconductor and a channel formation region of the second transistor, and
wherein the channel formation region of the second transistor overlaps the second wiring.

20. The semiconductor device according to claim 19, wherein the barrier layer comprises at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

21. The semiconductor device according to claim 19, further comprising:
an insulating layer comprising an oxide between the second transistor and the barrier layer,
wherein the insulating layer includes a region having a higher oxygen proportion than a stoichiometric composition of a material composing the region of the insulating layer.

22. An electronic appliance comprising the semiconductor device according to claim 19.

23. The semiconductor device according to claim 19, further comprising:
a first insulating layer between the first transistor and the barrier layer; and
a second insulating layer between the second transistor and the barrier layer.

24. A semiconductor device comprising:
a first transistor;
a second transistor over the first transistor;
a capacitor;
a first layer and a second layer sandwiching the second transistor, each of the first layer and the second layer comprising aluminum and oxygen;
a first wiring and a second wiring sandwiching one of the first layer and the second layer, the first wiring and the second wiring overlapping so that the first wiring, the second wiring, and the one of the first layer and the second layer form the capacitor,
wherein a first semiconductor layer included in the first transistor is made of a single crystal semiconductor and comprises a channel formation region of the first transistor, and
wherein a second semiconductor layer included in the second transistor comprises an oxide semiconductor and a channel formation region of the second transistor.

25. The semiconductor device according to claim 24, wherein a gate electrode of the first transistor, one of a source electrode and a drain electrode of the second transistor, and the first wiring form an electrical node when represented on a circuit diagram.

26. The semiconductor device according to claim 25, wherein the first wiring is provided below the second wiring.

27. The semiconductor device according to claim 25, wherein the gate electrode of the first transistor, the one of the source electrode and the drain electrode of the second transistor, and the first wiring overlap.

28. The semiconductor device according to claim 24, wherein the one of the first layer and the second layer is provided in a horizontal plane between the first transistor and the second transistor.

29. The semiconductor device according to claim 24, wherein the one of the first layer and the second layer is an aluminum oxide layer.

30. The semiconductor device according to claim 24, wherein the one of the first layer and the second layer is an aluminum oxide layer in direct contact with each of the first wiring and the second wiring.

* * * * *